United States Patent
Hosotani et al.

(10) Patent No.: US 6,839,959 B1
(45) Date of Patent: Jan. 11, 2005

(54) COMPONENT MOUNTING APPARATUS

(75) Inventors: Naoto Hosotani, Osaka (JP); Youichi Nakamura, Osaka (JP); Wataru Hirai, Osaka (JP); Kunio Sakurai, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/959,756

(22) PCT Filed: May 1, 2000

(86) PCT No.: PCT/JP00/02863

§ 371 (c)(1),
(2), (4) Date: Nov. 6, 2001

(87) PCT Pub. No.: WO00/69241

PCT Pub. Date: Nov. 16, 2000

(30) Foreign Application Priority Data

May 6, 1999 (JP) .......................................... 11-126032

(51) Int. Cl.$^7$ ............................ H05K 3/30; H05K 13/04
(52) U.S. Cl. ............................. 29/740; 29/721; 29/741; 29/743; 29/759; 29/DIG. 44; 29/832; 29/833; 414/737
(58) Field of Search .............................. 901/40, 47, 17, 901/35; 294/64.1, 2; 29/752, 783, 743, 740, 741, DIG. 44, 759, 832; 414/787, 752, 783, 737, 796.4

(56) References Cited

U.S. PATENT DOCUMENTS 4,556,362 A * 12/1985 Bahnck et al. ............... 414/744
5,501,005 A * 3/1996 Onitsuka ...................... 29/833
5,839,187 A * 11/1998 Sato et al. .................... 29/743

FOREIGN PATENT DOCUMENTS

| JP | 2-56945 | 2/1990 |
|----|---------|--------|
| JP | 3-159197 | 7/1991 |
| JP | 8-162502 | 6/1996 |

* cited by examiner

Primary Examiner—Minh Trinh
(74) Attorney, Agent, or Firm—Wenderoth, Lind & Ponack, L.L.P.

(57) ABSTRACT

There are disclosed an apparatus for mounting electronic components, with which the electronic components can be reversed, up and down, and mounted onto a circuit board in a short mounting process time by performing picking up, delivering and receiving of components between heads, and mounting of the components onto the circuit board in parallel. A plurality of reverse-supply heads are mounted on a component supply holder for performing indexing rotation, while a plurality of mounting heads are mounted on a component mounting holder for performing indexing rotation in synchronization with the indexing rotation of the component supply holder. By (i) picking up an electronic component, (ii) delivering the electronic component from the reverse-supply head to the mounting head, and (iii) mounting the electronic component onto the circuit board at prescribed positions, operations from (i) to (iii) can be carried out in parallel. Thus, the electronic components can be mounted onto the circuit board in a short process time.

52 Claims, 33 Drawing Sheets

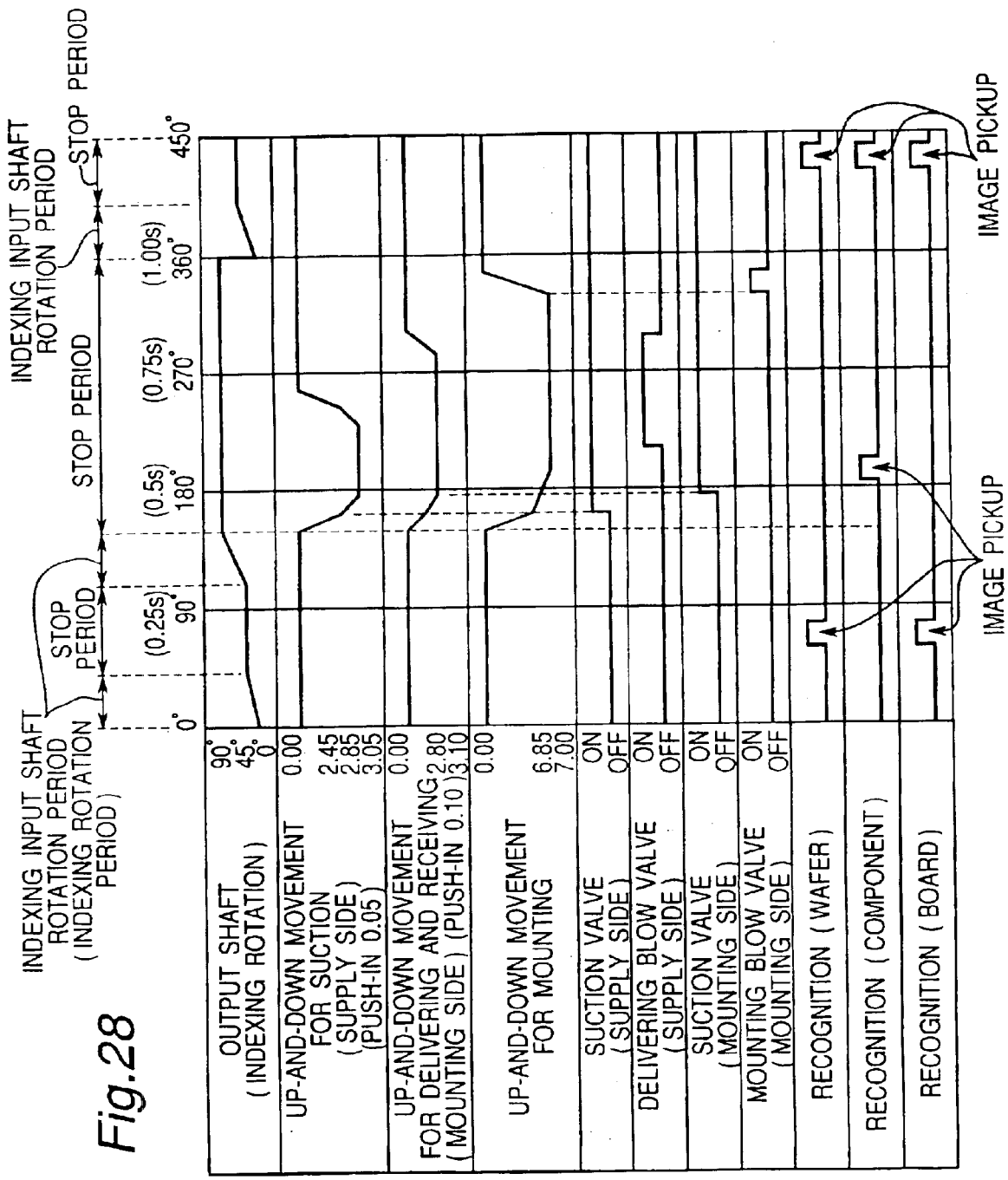

COMPONENT MOUNTING APPARATUS

TECHNICAL FIELD

The present invention relates to an apparatus and method for mounting components such as IC chips, quartz resonators, or the like onto a to-be-mounted object such as a circuit board, liquid crystal panel, to-be-mounted component, or the like. The present invention relates to, for example, an apparatus and method for mounting components such as IC chips, quartz resonators or the like, particularly components having an electrically connecting portion disposed on an upper surface thereof, on a to-be-mounted object such as a circuit board, liquid crystal panel, to-be-mounted component or the like so that the electrically connecting portions of the components are connected to electrically connecting portions of the object.

BACKGROUND ART

Conventionally, an electronic component mounting apparatus requiring vertically reversing supply of an electronic component, before mounting the component onto an object, is provided with a horizontally movable reverse-supply head and a horizontally movable mounting head. A component is passed between these heads such that the component becomes reverse-supplied and mounted. The electronic component mounting apparatus requiring vertically reversing supply of an electronic component includes, for example, an apparatus for mounting semiconductor bare chips. A bare chip is set in equipment, with a surface on a side of the chip to be brought into contact with a circuit board facing upwardly for a purpose of preventing attachment of dust to electrodes on this surface due to contact with other substances, or for a reason that chips are supplied in a state of a diced wafer on a sheet due to a previous process. Therefore, in this electronic component mounting apparatus, the bare chip needs to be vertically reversed before the bare chip is mounted onto the circuit board.

An example of the above-described conventional electronic component mounting apparatus is explained below with reference to the accompanying drawings. FIG. 33 is a perspective view showing a conventional electronic component mounting apparatus.

In FIG. 33, reference numeral 1 is an electronic component, which is already mounted on a circuit board 2. Reference numeral 3 is a housing magazine, wherein a plurality of tray plates 4 are housed. A tray 5 on which a plurality of electronic components are housed is set on a tray plate 4. At this time, the electronic components are housed on the tray 5 with a surface thereof, on a side to be brought into contact with the circuit board 2, facing upwardly. Reference numeral 6 is a lifter, which moves the housing magazine 3 up and down. Reference numeral 7 is a draw-out unit having a function of clamping a tray plate 4 in the housing magazine 3 and drawing the tray plate out of the housing magazine 3 towards a deep side of the mounting apparatus in a Y direction.

Reference numeral 8 is a reversing head, which has a function of moving up and down and can pick up an electronic component from the tray plate 4 by vacuum suction. The reversing head 8 has functions of linearly reciprocating in an X direction and rotating 180 degrees in an A direction.

Reference numeral 9 is a recognition camera which has a function of confirming a position of an electronic component on the tray plate 4 and linearly reciprocates in the X direction concurrently with the reversing head 8.

Reference numeral 10 is a bonding head, which has functions of linearly reciprocating in the X direction and moving up and down. After picking up an electronic component sucked and held by the reversing head 8 by vacuum suction, the bonding head can mount the electronic component onto the circuit board 2.

Reference numeral 11 is a bonding stage which sucks and holds the circuit board 2. The bonding stage 11 is fixed on a slide base 12. The slide base 12 has a function of being movable in the Y direction.

Reference numeral 13 is a recognition camera which can recognize positions of the circuit board 2 positioned below the recognition camera 13 and an electronic component which is positioned above the recognition camera 13 and sucked and held by the bonding head 10 by switching a visual field thereof. Also, the recognition camera 13 is constituted so as to reciprocally move both in the X and Y directions.

Operations of the electronic component mounting apparatus constituted as described above are explained below with reference to FIG. 34.

First, in Step S100, the lifter 6 moves up and down up to a prescribed height so as to draw out a tray plate 4. One tray plate 4 set in the housing magazine 3 is clamped by the draw-out unit 7 and drawn out of the housing magazine 3. Subsequently, in Step S101, a position of an electronic component housed on tray 5 on the tray plate 4 is confirmed by the recognition camera 9. Subsequently, in Step S102, the draw-out unit 7 and the reversing head 8 are moved on a basis of a positional confirmation result so that the electronic component, whose position is confirmed, can be picked up by the reversing head 8. Then, the reversing head 8 is lowered and picks up the electronic component.

Subsequently, in Step S103, the reversing head 8 is rotated 180 degrees in the A direction to vertically reverse the electronic component while being linearly moved in the X direction to close proximity of an end portion on the left side of the mounting apparatus, which is a position at which the electronic component can be passed to the bonding head 10 through a receiving and delivering operation. Meanwhile, in Step S120, which is a step carried out concurrently with Step S103, the bonding head 10 is linearly moved in the X direction to close proximity of an end portion on the right side of the mounting apparatus, which is a position at which the electronic component can be received by the bonding head. Then, in Step S140, the bonding head 10 is moved up and down to suck and pick up the electronic component that is being sucked by the reversing head 8.

While a series of operations composed of operations in the above Steps S120 or S103 and S140 are performed, in Steps S110 and S111 concurrently therewith, a position of the circuit board 2 is confirmed by the recognition camera 13. This operation is explained below. First, in Step S110 concurrently with the operation in Step S120 or S103, the slide base 12 and the recognition camera 13 are moved so that the position of the circuit board 2 on the bonding stage 11 can be confirmed by the recognition camera 13. Here, a feature point for confirming a mounting position is marked on the circuit board 2 in advance. Subsequently, in Step S111 concurrently with the operation in Step S140, a visual field of the recognition camera 13 is switched to a lower side so that the position of the circuit board 2 is confirmed. This positional confirmation operation of the circuit board 2 (Step S111) is completed before the bonding head picks up the electronic component from the reversing head 8 in Step S140.

Operations after the bonding head 10 picks up the electronic component are explained below. In Step S121, the bonding head 10 is linearly moved in the X direction to a position at which the recognition camera 13 can confirm a position of the electronic component sucked by the bonding head. At the same time, the recognition camera 13 is also moved so as to confirm a position of the electronic component.

Subsequently, in Step S122, a visual field of the recognition camera 13 is switched upwardly, and then a position of the electronic component is confirmed by the recognition camera 13. Then, in Step S123, positions of the bonding head 10 and the slide base 12 are corrected on a basis of results of positional confirmation of the electronic component and the circuit board, and the bonding head 10 is lowered to mount the electronic component onto the circuit board 2.

A schematic flow of this series of operations, described above, is shown in FIG. 7. In FIG. 34, operations in Steps S110, S111, S120, S140, S121, S122 and S123 on the left side represent an operational flow in equipment on a bonding head side. Operations in Steps S100, S101, S102, S103, S140 and S104 on the right side represent an operational flow in equipment on a reversing head side. These operations are sequentially repeated, in orders shown by arrows, in respective equipment.

In an operation cycle on the bonding head side, a component delivering and receiving operation (Step S140) and a mounting operation (Step S123) are sequentially carried out as a series of operations. In an operation cycle on the reversing head side, a pickup operation (Step S102) and the delivering and receiving operation (Step S140) are sequentially carried out as a series of operations. Thus, mounting time is a longer required cycle time out of required cycle time on the bonding head side and required cycle time on the reversing head side.

However, since the delivering and receiving operation (Step S140) and mounting operation (Step S123), as well as the pickup operation (Step S102) and the delivering and receiving operation (Step S140), are sequentially performed in such an electronic component mounting apparatus as described above, an issue arises in that improvement of a mounting time is limited.

Accordingly, an object of the present invention is to provide an apparatus and method for mounting a component by which a mounting time can be improved by performing more operations concurrently than in a conventional apparatus, and thus the above-described issue can be solved.

SUMMARY OF THE INVENTION

To achieve the above object, the present invention is constituted as described below.

According to one aspect of the present invention, there is provided a component mounting apparatus that successively removes components from a component supply unit and mounts the components at prescribed positions on an object, wherein the component mounting apparatus comprises:

a supply-side component holding member which performs intermittent rotational movement so as to draw a closed track between a component take-out position and a supply-side component delivering and receiving position, removes a component from the component supply unit and holds the component when positioned at the component take-out position, and delivers this held component when positioned at the supply-side component delivering and receiving position, upon being moved from the component take-out position to the supply-side component delivering and receiving position; and a mounting-side component holding member which moves by intermittent rotational movement in synchronization with the intermittent rotational movement of the supply-side component holding member so as to draw a closed track, different from the closed track of the supply-side component holding member, between a mounting-side component delivering and receiving position, which overlaps or is located in close proximity of the supply-side component delivering and receiving position, and a component mounting position, receives the component held by the supply-side component holding member positioned at the supply-side component delivering and receiving position and holds the component when positioned at the mounting-side component delivering and receiving position, and mounts this held component onto an object when positioned at the component mounting position, wherein when a plurality of either aforementioned supply-side component holding members or aforementioned mounting-side component holding members are provided, while the component is delivered and received between one supply-side component holding member and one mounting-side component holding member, a prescribed operation is enabled by a second supply-side component holding member or a second mounting-side component holding member.

This enabling of a prescribed operation means that, when the plurality of component holding members are supply-side component holding members, another component can be removed from the component supply unit and held at the component take-out position by the second supply-side component holding member and, when the plurality of component holding members are mounting-side component holding members, a component held by the second mounting-side component holding member can be mounted onto the object at the component mounting position.

According to a first aspect of the present invention, there is provided a component mounting apparatus for successively removing components from a component supply unit and mounting the components at prescribed positions onto an object, wherein the apparatus comprises:

a plurality of supply-side component holding members, each for (i) performing intermittent rotational movement so as to draw a closed track between a component take-out position and a supply-side component delivering and receiving position, (ii) removing a component from the component supply unit and holding the component when positioned at the component take-out position, and (iii) delivering this held component when positioned at the supply-side component delivering and receiving position, upon being moved from the component take-out position to the supply-side component delivering and receiving position; and a mounting-side component holding member for (i) moving, by intermittent rotational movement in synchronization with the intermittent rotational movement of each supply-side component holding member, so as to draw a closed track, different from the closed track of the supply-side component holding member, between a mounting-side component delivering and receiving position, which overlaps or is located in a close proximity of the supply-side component delivering and receiving position, and a component mounting position, (ii) receiving the component held by the supply-side component holding member positioned at the supply-side component delivering and receiving position and holding the component when positioned at the mounting-side component delivering and receiving position, and (iii) mounting this held component onto an object when positioned at the component mounting position, wherein when the component is delivered and received between one supply-side component holding member, out of the plurality of supply-side component holding members, and the mounting-side component holding member, another component can be removed from the component supply unit and held by another supply-side component holding member out of the plurality of supply-side component holding members at the component take-out position.

According to a second aspect of the present invention, there is provided a component mounting apparatus for successively removing components from a component supply unit and mounting the components at prescribed positions onto an object, wherein the apparatus comprises:

a supply-side component holding member for (i) performing intermittent rotational movement so as to draw a closed track between a component take-out position and a supply-side component delivering and receiving position, (ii) removing a component from the component supply unit and holding the component when positioned at the component take-out position, and (iii) delivering this held component when positioned at the supply-side component delivering and receiving position, upon being moved from the component take-out position to the supply-side component delivering and receiving position; and a plurality of mounting-side component holding members, each for (i) moving by intermittent rotational movement in synchronization with the intermittent rotational movement of the supply-side component holding member so as to draw a closed track, different from the closed track of the supply-side component holding member, between a mounting-side component delivering and receiving position, which overlaps or is located in a close proximity of the supply-side component delivering and receiving position, and a component mounting position, (ii) receiving the component held by the supply-side component holding member positioned at the supply-side component delivering and receiving position and holding this component when positioned at the mounting-side component delivering and receiving position, and (iii) mounting this held component onto an object when positioned at the component mounting position, wherein when the component is delivered and received between the supply-side component holding member and one of the mounting-side component holding members, a component held by another of the mounting-side component holding members can be mounted onto the object at the component mounting position.

According to a third aspect of the present invention, there is provided a component mounting apparatus according to the first aspect, comprising:

a component supply holder for performing intermittent rotation;

a plurality of reverse-supply heads which are (i) attached to a periphery of the component supply holder so as to perform a reversing operation, (ii) have the supply-side component holding members, (iii) move the supply-side component holding members by intermittent rotation of the component supply holder so as to draw a circular track as the closed track between the component take-out position and the supply-side component delivering and receiving position, (iv) remove a component from the component supply unit by a supply-side component holding member when this supply-side component holding member is positioned at the component take-out position, and hold the component by this supply-side component holding member at the component take-out position, (v) reverse the component held by the supply-side component holding member while being moved from the component take-out position to the supply-side component delivering and receiving position, and (vi) deliver the component held and reversed by the supply-side component holding member when positioned at the supply-side component delivering and receiving position;

a component mounting holder for performing intermittent rotation in synchronization with the intermittent rotation of the component supply holder; and a mounting head which is (i) attached to a periphery of the component mounting holder so as to move up and down, (ii) has the mounting-side component holding member, (iii) moves the mounting-side component holding member by intermittent rotation of the component mounting holder so as to draw the circular track between the mounting-side component delivering and receiving position and the component mounting position, (iv) receives the component held by the supply-side component holding member of the reverse-supply head positioned at the supply-side component delivering and receiving position by virtue of the mounting-side component holding member when the mounting-side component holding member is positioned at the mounting-side component delivering and receiving position, and holds this component by virtue of the mounting-side component holding member at the component mounting position, and (v) mounts the component held by the mounting-side component holding member onto an object by the mounting-side component holding member when the mounting-side component holding member is positioned at the component mounting position.

According to a fourth aspect of the present invention, there is provided a component mounting apparatus according to the second aspect, comprising:

a component supply holder for performing intermittent rotation;

a reverse-supply head which (i) is attached to a periphery of the component supply holder so as to perform a reversing operation, (ii) has the supply-side component holding member, (iii) moves the supply-side component holding member by intermittent rotation of the component supply holder so as to draw a circular track as the closed track between the component take-out position and the supply-side component delivering and receiving position, (iv) removes a component from the component supply unit by virtue of the supply-side component holding member when the supply-side component holding member is positioned at the component take-out position, and holds this component by virtue of the supply-side component holding member at the component take-out position, (v) reverses the component held by the supply-side component holding member while being moved from the component take-out position to the supply-side component delivering and receiving position, and (vi) delivers the component held and reversed by the supply-side component holding member, when positioned at the supply-side component delivering and receiving position;

a component mounting holder for performing intermittent rotation in synchronization with the intermittent rotation of the component supply holder; and a plurality of mounting heads which are (i) attached to a periphery of the component mounting holder so as to move up and down, (ii) have the mounting-side component holding members, (iii) move the mounting-side component holding members by intermittent rotation of the component mounting holder so as to draw a circular track as the closed track between the mounting-side component delivering and receiving position and the component mounting position, (iv) receive the component held by the supply-side component holding member of the reverse-supply head positioned at the supply-side component delivering and receiving position by virtue of the mounting-side component holding member when the mounting-side component holding member is positioned at the mounting-side component delivering and receiving position, and hold this component by virtue of the mounting-side component holding member at the mounting-side component delivering and receiving position, and (v) mount the component held by the mounting-side component holding member onto an object by virtue of the mounting-side component holding member when positioned at the component mounting position.

According to a fifth aspect of the present invention, there is provided a component mounting apparatus according to the third aspect, further comprising a plurality of aforementioned mounting heads, wherein another component can be removed from the component supply unit by the supply-side component holding member of another reverse-supply head at the component take-out position while a component is delivered and received between the one reverse-supply head and one of the mounting heads, and while a component held by another of the mounting heads can be mounted onto an object by virtue of the mounting-side component holding member of this another mounting head.

According to a sixth aspect of the present invention, there is provided a component mounting apparatus according to any one of the third to fifth aspects, wherein the supply-side component holding member of a reverse-supply head positioned at the supply-side component delivering and receiving position is positioned immediately above the mounting-side component holding member of a mounting head positioned at the mounting-side component delivering and receiving position.

According to a seventh aspect of the present invention, there is provided a component mounting apparatus according to any one of the third to fifth aspects, wherein when the supply-side component holding member of a reverse-supply head is reversed between the component take-out position and the supply-side component delivering and receiving position, this reversing operation is completed at a stage some distance before the supply-side component delivering and receiving position, and the supply-side component holding member of the reverse-supply head is positioned at the supply-side component delivering and receiving position in a state such that oscillation generated in the reverse-supply head along with the reversing operation is attenuated.

According to an eighth aspect of the present invention, there is provided a component mounting apparatus according to the fifth aspect, wherein there are provided equal numbers of the reverse-supply heads and the mounting heads, and combinations of the reverse-supply heads and the mounting heads between which components are delivered and received are structurally determined.

According to a ninth aspect of the present invention, there is provided a component mounting apparatus according to any one of the third to fifth aspects, wherein the component supply holder and the component mounting holder are intermittently rotated structurally in synchronization with each other by the same drive source.

According to a tenth aspect of the present invention, there is provided a component mounting apparatus according to any one of the third to fifth aspects, wherein the component supply holder and the component mounting holder are disposed on left and right sides or right and left sides, respectively, with respect to a front of the apparatus , where an operator of the component mounting apparatus is positioned, and a component is removed from the component supply unit, passed on a front side of the component supply holder and the component mounting holder, and mounted onto an object.

According to an eleventh aspect of the present invention, there is provided a component mounting apparatus according to any one of the third to fifth aspects, wherein a mounting-side component holding member of the mounting head is lowered by a drive of a linear motor disposed outside the component mounting holder, and a mounting load on an object is controlled by the linear motor.

According to a twelvth aspect of the present invention, there is provided a component mounting apparatus according to any one of the third to fifth aspects, wherein an up-and-down reversing operation of a supply-side component holding member of a reverse-supply head is performed by a cam mechanism provided with a cam follower, which is interlockingly moved with intermittent rotation of the component supply holder and connected to the reverse-supply head, and a cam groove or cam surface formed such that the cam follower is moved therein or therealong in an up-and-down direction.

According to a thirteenth aspect of the present invention, there is provided a component mounting apparatus according to any one of the third to fifth aspects, wherein a guide device and a drive device for enabling horizontal rotation of a component supply table functioning as the component supply unit are provided, and angle correction, about a supply-side component holding member axis, between a component and the supply-side component holding member upon removing the component from the component supply table is performed by horizontal rotation of the component supply table.

According to a fourteenth aspect of the present invention, there is provided a component mounting apparatus according to the thirteenth aspect, wherein the guide device and drive device, which are mounted to the component supply table and enable horizontal rotation thereof, are disposed below a guide device and a drive device which enable horizontal movement of the component supply table, and a central axis for the horizontal rotation is co-axial with a central axis of the supply-side component holding member that is to pick up and remove a component.

According to a fifteenth as pect of the present invention, there is provided a component mounting apparatus according to any one of the third to fifth aspects, wherein (i) a guide device and a drive device which enable horizontal rotation of a component mounting table are mounted to the component mounting table, which is for supporting thereon an object onto which a component is to be mounted, and (ii) angle correction about a mounting-side component holding member axis, between the component and the object, when mounting the component onto the object, is performed by horizontal rotation of the component mounting table.

According to a sixteenth aspect of the present invention, there is provided a component mounting apparatus according to the fifteenth aspect, wherein (i) the guide device and drive device, which are mounted to the component mounting table, are disposed below a guide device and a drive device which enable horizontal movement of the component mounting table, and (ii) a central axis for the horizontal rotation is co-axial with a central axis of the supply-side component holding member that is to suck, hold, and mount a component.

According to another aspect of the present invention, there is provided a method for successively removing components from a component supply unit and mounting the components at prescribed positions onto an object, wherein the method comprises:

(i) performing intermittent rotational movement of a supply-side component holding member so as to draw a closed track between a component take-out position and a supply-side component delivering and receiving position, (ii) removing a component from the component supply unit and holding the component when positioned at the component take-out position, (iii) reversing this held component while being moved from the component take-out position to the supply-side component delivering and receiving position, and (iv) delivering this reversed and held component when positioned at the supply-side component delivering and receiving position;

(v) performing intermittent rotational movement of a mounting-side component holding member in synchronization with the intermittent rotational movement of the supply-side component holding member so as to draw a closed track, different from the closed track of the supply-side component holding member, between a mounting-side component delivering and receiving position, which overlaps or is located in close proximity of the supply-side component delivering and receiving position, and a component mounting position, (vi) receiving the component held by the supply-side component holding member positioned at the supply-side component delivering and receiving position, and holding the component when the mounting-side component holding member is positioned at the mounting-side component delivering and receiving position, and (vii) mounting this held component onto an object when the mounting-side component holding member is positioned at the component mounting position; and in a case where a plurality of either aforementioned supply-side component holding members or aforementioned mounting-side component holding members are provided, (viii) the plurality of component holding members are rotationally moved along the same closed track, and perform the same operations, and (ix) the other component holding member out of the supply-side component holding member and the mounting-side component holding member, and a first component holding member of the plurality of component holding members deliver and receive the component, and (x) a prescribed operation is performed by a second component holding member of the plurality of component holding members. The prescribed operation means that, in a case where the plurality of component holding members are supply-side component holding members, another component is removed from the component supply unit at the component take-out position and held and, in a case where the plurality of component holding members are mounting-side component holding members, the component held by the second component holding member is mounted onto the object at the component mounting position.

According to a seventeenth aspect of the present invention, there is provided a component mounting method for successively removing components from a component supply unit and mounting the components at prescribed positions onto an object, wherein the method comprises:

by intermittent rotational movement, (i) moving each of a plurality of supply-side component holding members so as to draw a closed track between a component take-out position and a supply-side component delivering and receiving position, (ii) using each of the supply-side component holding members to remove a component from the component supply unit and hold the component when respectively positioned at the component take-out position, (iii) using each of the supply-side component holding members to reverse its held component while being moved from the component take-out position to the supply-side component delivering and receiving position, and (iv) using each of the supply-side component holding members to deliver its held and reversed component when positioned at the supply-side component delivering and receiving position;

(v) moving a mounting-side component holding member by intermittent rotational movement in synchronization with the intermittent rotational movement of the supply-side component holding members so as to draw a closed track, different from the closed track of the supply-side component holding members, between a mounting-side component delivering and receiving position, which overlaps or is located in a close proximity of the supply-side component delivering and receiving position, and a component mounting position, (vi) receiving the component held by the supply-side component holding member positioned at the supply-side component delivering and receiving position and holding this component when the mounting-side component holding member is positioned at the mounting-side component delivering and receiving position, and (viii) mounting this held component onto an object when the mounting-side component holding member is positioned at the component mounting position; and when a component is delivered and received between one of the supply-side component holding members and the mounting-side component holding member, another component can be removed from of the component supply unit and held by another of the supply-side component holding members at the component take-out position.

According to an eighteenth aspect of the present invention, there is provided a component mounting method for successively removing components from a component supply unit and mounting the components at prescribed positions onto an object, wherein the method comprises:

(i) moving a supply-side component holding member by intermittent rotational movement so as to draw a closed track between a component take-out position and a supply-side component delivering and receiving position, (ii) removing a component from the component supply unit and holding the component when positioned at the component take-out position, (iii) reversing this held component while being moved from the component take-out position to the supply-side component delivering and receiving position, and (iv) delivering this held and reversed component when positioned at the supply-side component delivering and receiving position;

(v) moving each of a plurality of mounting-side component holding members by intermittent rotational movement in synchronization with the intermittent rotational movement of the supply-side component holding member so as to draw a closed track, different from the closed track of the supply-side component holding member, between a mounting-side component delivering and receiving position, which overlaps or is located in a close proximity of the supply-side component delivering and receiving position, and a component mounting position, (vi) receiving a component held by the supply-side component holding member positioned at the supply-side component delivering and receiving position and holding this component when a respective one of the mounting-side component holding members is positioned at the mounting-side component delivering and receiving position, and (vii) mounting this held component onto an object when the respective one of the mounting-side component holding members is positioned at the component mounting position; and when a component is delivered and received between the supply-side component holding member and one of the mounting-side component holding members, another component held by another of the mounting-side component holding members at the component mounting position can be mounted onto the object by the another of the mounting-side component holding members.

According to a nineteenth aspect of the present invention, there is provided a component mounting method according to the seventeenth aspect, in a case where there are provided a plurality of aforementioned mounting heads, wherein when a component is delivered and received between the reverse-supply head and one of the mounting heads, another component can be removed from the component supply unit by a supply-side component holding member of another reverse-supply head at the component take-out position while the component held by the mounting-side component holding member of another mounting head can be mounted onto the object by virtue of the mounting-side component holding member of the another mounting head at the component mounting position.

According to a twentieth aspect of the present invention, there is provided a component mounting method according to any one of the seventeenth to nineteenth aspects, wherein the supply-side component holding member of the reverse-supply head positioned at the supply-side component delivering and receiving position is positioned immediately above the mounting-side component holding member of the mounting head positioned at the mounting-side component delivering and receiving position.

According to a twenty-first aspect of the present invention, there is provided a component mounting method according to any one of the seventeenth to nineteenth aspects, wherein when the supply-side component holding member of the reverse-supply head is reversed between the component take-out position and the supply-side component delivering and receiving position, this reversing operation is completed at a stage some distance before the supply-side component delivering and receiving position so that the supply-side component holding member of the reverse-supply head is positioned at the supply-side component delivering and receiving position in a state where oscillation generated in the reverse-supply head along with the reversing operation is attenuated.

According to a twenty-second aspect of the present invention, there is provided a component mounting method according to the nineteenth aspect, wherein there are provided equal numbers of the reverse-supply heads and the mounting heads, and combinations of the reverse-supply heads and the mounting heads between which components are delivered and received are structurally determined.

According to a twenty-third aspect of the present invention, there is provided a component mounting method according to any one of the seventeenth to nineteenth aspects, wherein the component supply holder and the component mounting holder are intermittently rotated by the same drive source structurally in synchronization with each other.

According to a twenty-fourth aspect of the present invention, there is provided a component mounting method according to any one of the seventeenth to nineteenth aspects, wherein the component supply holder and the component mounting holder are disposed on left and right sides or right and left sides, respectively, with respect to a front of a component mounting apparatus, where an operator of the component mounting apparatus is positioned, and a component is removed from the component supply unit, passed on a front side of the component supply holder and the component mounting holder, and mounted onto an object.

According to a twenty-fifth aspect of the present invention, there is provided a component mounting method according to any one of the seventeenth to nineteenth aspects, wherein the mounting-side component holding member of the mounting head is lowered by a drive of a linear motor that is disposed outside the component mounting holder, and a mounting load on the object is controlled by the linear motor.

According to a twenty-sixth aspect of the present invention, there is provided a component mounting method according to any one of the seventeenth to nineteenth aspects, wherein an up-and-down reversing operation of the supply-side component holding member of the reverse-supply head is performed by a cam mechanism provided with a cam follower, which is interlockingly moved with intermittent rotation of the component supply holder and is connected to the reverse-supply head, and a cam groove or cam surface formed such that the cam follower is moved therein or therealong in an up-and-down direction.

According to a twenty-seventh aspect of the present invention, there is provided a component mounting method according to any one of the seventeenth to nineteenth aspects, wherein a guide device and a drive device which enable horizontal rotation of a component supply table are mounted to the component supply table, which table functions as the component supply unit, and angle correction about a supply-side component holding member axis, between a component and the supply-side component holding member when removing the component from the component supply table is performed by horizontal rotation of the component supply table.

According to a twenty-eighth aspect of the present invention, there is provided a component mounting method according to the twenty-seventh aspect, wherein the guide device and drive device which are mounted on the component supply table, functioning as the component supply unit, and enable horizontal rotation of the table are disposed below a guide device and a drive device which enable horizontal movement of the component supply table, and a central axis for the horizontal rotation is co-axial with a central axis of the supply-side component holding member that is to pick and remove a component.

According to a twenty-ninth aspect of the present invention, there is provided a component mounting method according to any one of the seventeenth to nineteenth aspects, wherein a guide device and a drive device which enable horizontal rotation of a component mounting table are mounted to the component mounting table, which table is for supporting thereon an object onto which a component is to be mounted, and angle correction about a mounting-side component holding member axis, between the component and the object when mounting the component onto the object is performed by horizontal rotation of the component mounting table.

According to a thirtieth aspect of the present invention, there is provided a component mounting method according to the twenty-ninth aspect, wherein the guide device and the drive device which are mounted to the component mounting table, for supporting thereon the object onto which the component is to be mounted, and enable horizontal rotation of the component mounting table are disposed below a guide device and a drive device which enable horizontal movement of the component mounting table, and the central axis for the horizontal rotation is co-axial with a central axis of the mounting-side component holding member that is to suck, hold, and mount the component onto the object.

BRIEF DESCRIPTION OF DRAWINGS

These and other aspects and features of the present invention will become clear from the following description taken in conjunction with the preferred embodiments thereof with reference to the accompanying drawings, in which:

FIG. 28 is a time chart different from the one shown in FIG. 27;

DETAILED DESCRIPTION OF THE PREFERRED EMBODIMENTS

Figure 1:
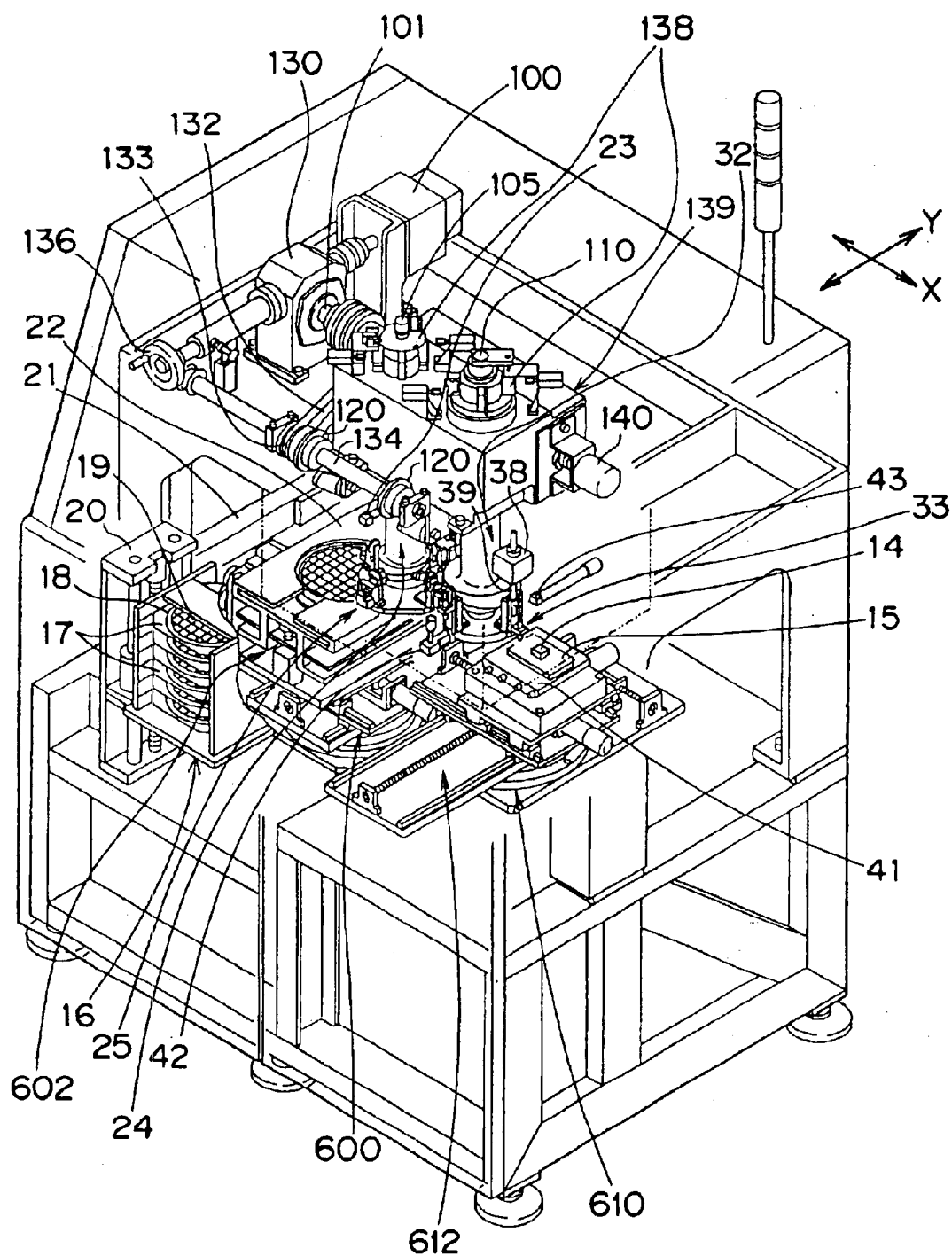
FIG. 1 is a perspective view showing an overall constitution of an electronic component mounting apparatus of a first embodiment of the present invention.

Before description of the present invention proceeds, it is to be noted that like parts are designated by like reference numerals throughout the accompanying drawings.

Embodiments of the present invention are described in detail with reference to the accompanying drawings.

An electronic component mounting apparatus according to one embodiment of the present invention exemplifies a component mounting apparatus for mounting components such as IC chips, quartz resonators, or the like onto a to-be-mounted object (object to which the components are to be mounted) such as a circuit board, liquid crystal panel, to-be-mounted component (component to which the components are to be mounted), or the like. This electronic component mounting apparatus mounts electronic components, as one example of components, IC chips, quartz resonators, or the like, i.e. components having electrically connecting portions disposed on an upper surface thereof, onto a circuit board, as one example of a to-be-mounted object, a liquid crystal panel, to-be-mounted component, or the like so that the electrically connecting portions of the electronic components are connected to electrodes, as one example of electrically connecting portions, on the circuit board.

FIG. 1 is a perspective view showing the electronic component mounting apparatus of the above embodiment.

In FIG. 1, reference numeral 14 denotes a mounted electronic component, which is mounted on a circuit board 15. Reference numeral 16 denotes a housing magazine. A plurality of jig plates 17 are housed in this housing magazine 16. A multiplicity of electronic components 19, each of which is to be mounted on the circuit board 15 and become the aforementioned mounted electronic component 14, for example, a multiplicity of IC chips resulting from a wafer being cut into individual pieces and having their electrically connecting portions disposed on an upper surface, are set on each jig plate 17 via a sheet 18. Reference numeral 20 denotes a lifter, which moves the housing magazine 16 up and down. Reference numeral 21 denotes a draw-out unit, which can reciprocate in a Y direction of the electronic component mounting apparatus, has a function of clamping the jig plate 17 and draws out the jig plate 17 in the Y direction.

Reference numeral 22 denotes a component supply table as an example of a component supply unit, on which the jig plate 17 can be mounted. This table is constituted so as to be capable of reciprocating in both X and Y directions of the electronic component mounting apparatus, and rotating horizontally in an X-Y plane. In the component supply table 22, a horizontal wafer rotation drive device 600, having a horizontal wafer rotation guide device, capable of horizontally rotating a wafer composed of a multiplicity of IC chips, as an example of the electronic components 19, is disposed below a horizontal wafer movement drive device 602, having a horizontal wafer movement guide device, thereby enabling a horizontal movement along the X-Y plane. A central axis of this horizontal rotation is co-axial with a central axis of a supply-side suction nozzle 27 for pickup.

Figure 35:
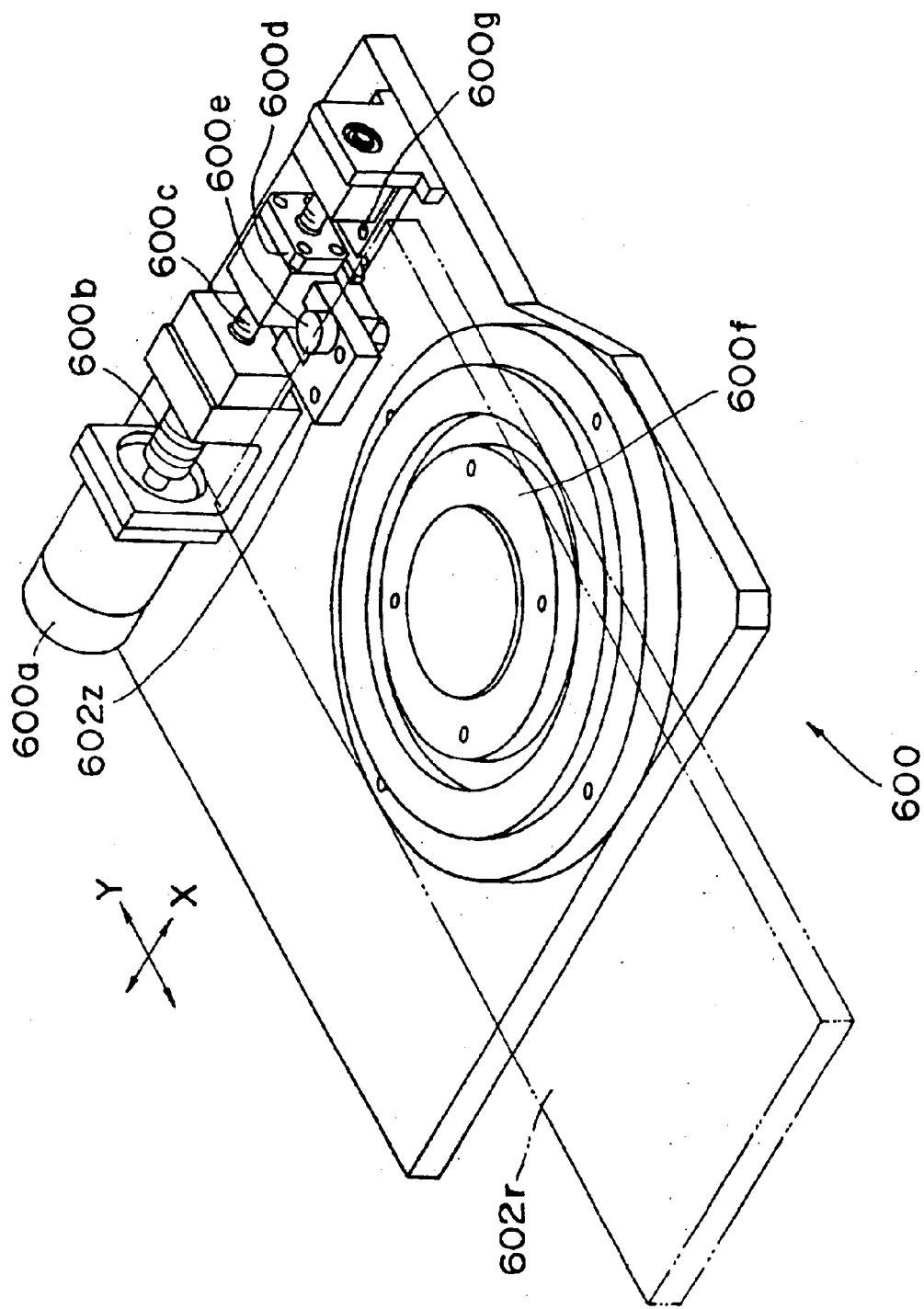
FIG. 35 is a perspective view showing a horizontal wafer rotational drive device, with a horizontal wafer rotational guide device, on a component supply side in the electronic component mounting apparatus of the first embodiment.
Figure 37:
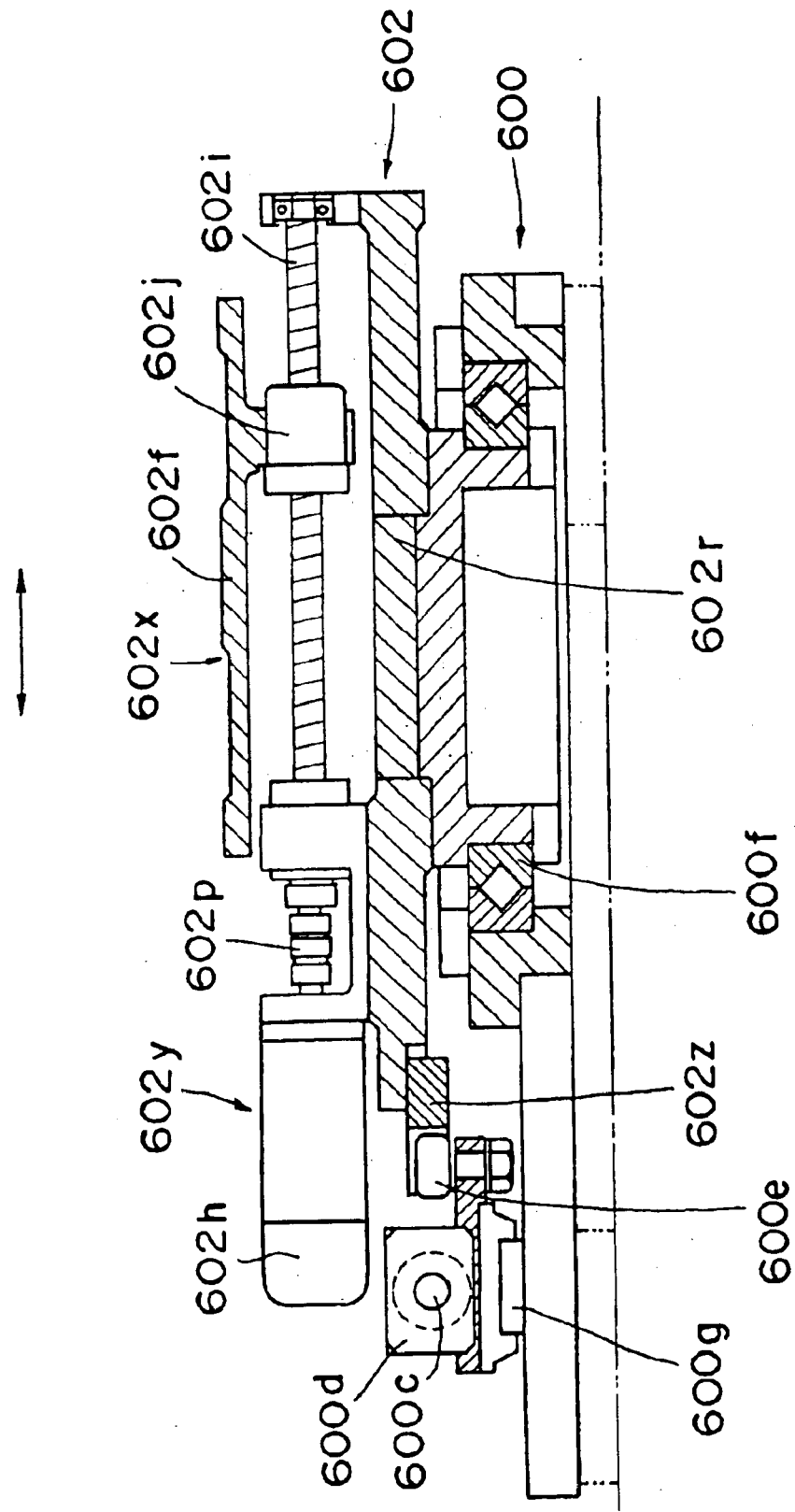
FIG. 37 is a partial sectional side view showing the horizontal wafer rotational drive device and the horizontal wafer movement drive device on the component supply side in the electronic component mounting apparatus of the first embodiment.

The horizontal wafer rotation drive device 600, having the horizontal wafer rotation guide device, capable of horizontally rotating the component supply table 22 is constituted as described below. That is, as shown in FIGS. 35 and 37, a rotating shaft of a θ-axis motor 600a is connected to a ball screw 600c by a coupling 600b. Therefore, the ball screw 600c is normally and reversely rotated by a rotational drive of the θ-axis motor 600a, and a nut 600d screw-threaded to the ball screw 600c moves back and forth along an X-axis direction by guide of a linear movement guide 600g. Then, a linear guide 602z, which is engaged with a cam follower 600e fixed to the nut 600d and fixed to a Y-axis base 602r, moves back and forth along the X-axis direction so that the Y-axis base 602r is normally and reversely rotated about a center of a cross roller guide 600f; that is, about the θ axis via the cross roller guide 600f. Thus, the Y-axis base 602r can be horizontally rotated about the θ axis. As a result, angle correction about an axis of a supply-side component holding member (θ axis) between a component and the supply-side component holding member, when the component is removed, can be performed by horizontal rotation on a side of the component supply table functioning as a component supply unit.

Figure 36:
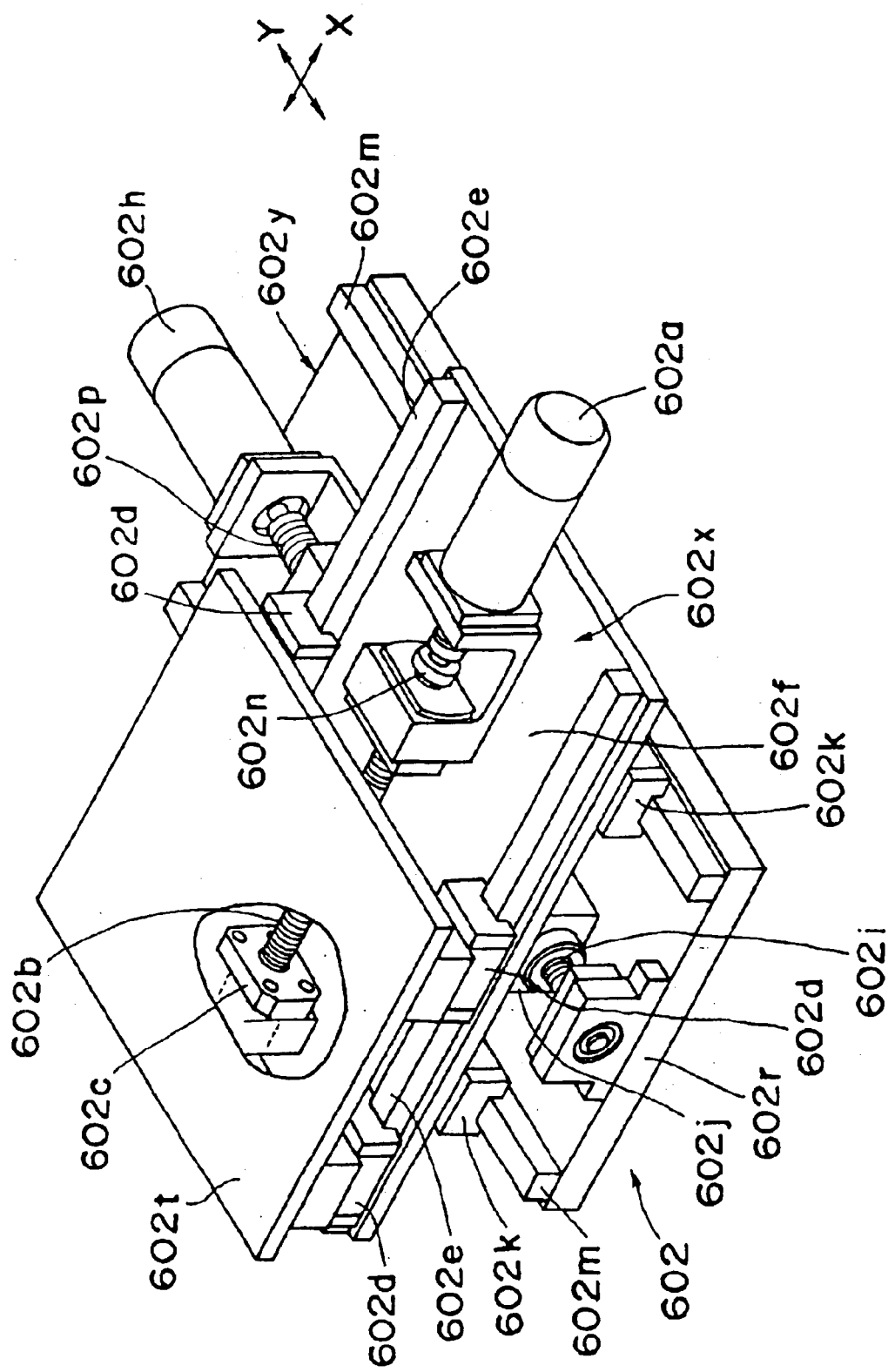
FIG. 36 is a partially removed perspective view showing a horizontal wafer movement drive device, with a horizontal wafer movement guide device, on the component supply side in the electronic component mounting apparatus of the first embodiment.

Also, in the horizontal wafer movement drive device 602, having the horizontal wafer movement guide device, which enables horizontal movement of the component supply table 22 along the X-Y plane, as shown in FIGS. 36 and 37, a Y-axis movement drive device 602y is disposed on the Y-axis base 602r and an X-axis movement drive device 602x is disposed on an X-axis base 602f of the Y-axis movement drive device 602y. That is, in the Y-axis movement drive device 602y, a rotating shaft of a Y-axis moving motor 602h fixed to the Y-axis base 602r is connected to a ball screw 602i by a coupling 602p. Therefore, the ball screw 602i is normally and reversely rotated by a normal and reverse rotational drive of the Y-axis moving motor 602h, and a nut 602j which is screw-threaded to the ball screw 602i and fixed to the X-axis base 602f moves along a Y-axis direction back and forth. At this time, the X-axis base 602f is provided with a pair of sliding guide members 602k, 602k on either side thereof. The sliding guide members 602k, 602k move on guide rails 602m, 602m fixed to the Y-axis base 602r so that the X-axis base 602f is guided along the Y-axis direction with respect to the Y-axis base 602r. Meanwhile, in the X-axis movement drive device 602x, a rotating shaft of the X-axis moving motor 602a fixed to the X-axis base 602f is connected to a ball screw 602b by a coupling 602n. Therefore, the ball screw 602b is normally and reversely rotated by a normal and reverse rotational drive of the X-axis moving motor 602a, and a nut 602c which is screw-threaded to the ball screw 602b and fixed to a table 602t moves along the X-axis direction back and forth. At this time, the table 602t is provided with a pair of sliding guide members 602d, 602d on either side thereof. The sliding guide members 602d, 602d move on guide rails 602e, 602e fixed to the X-axis base 602f so that the table 602t is guided along the X-axis direction with respect to the X-axis base 602f. Therefore, the table 602t can move along the X and Y directions with respect to the Y-axis base 602r by the Y-axis movement drive device 602y and the X-axis movement drive device 602x.

With this constitution, the drive device 602, having the above guide device, which is mounted on the component supply table 22 functioning as a component supply unit and enabling horizontal rotation, is disposed below the drive device 600 with the above guide device enabling horizontal movement. A central axis of horizontal rotation can always be co-axial with a central axis of the supply-side component holding member which is for sucking and removing a component.

Reference numeral 23 denotes a recognition camera which has a function of inputting image information of an electronic component 19 into a recognition camera main body composed of a CCD camera or the like via an optical system, and then confirming a position of the electronic component 19 on the jig plate 17.

This embodiment is explained with reference to FIG. 2.

Figure 2:
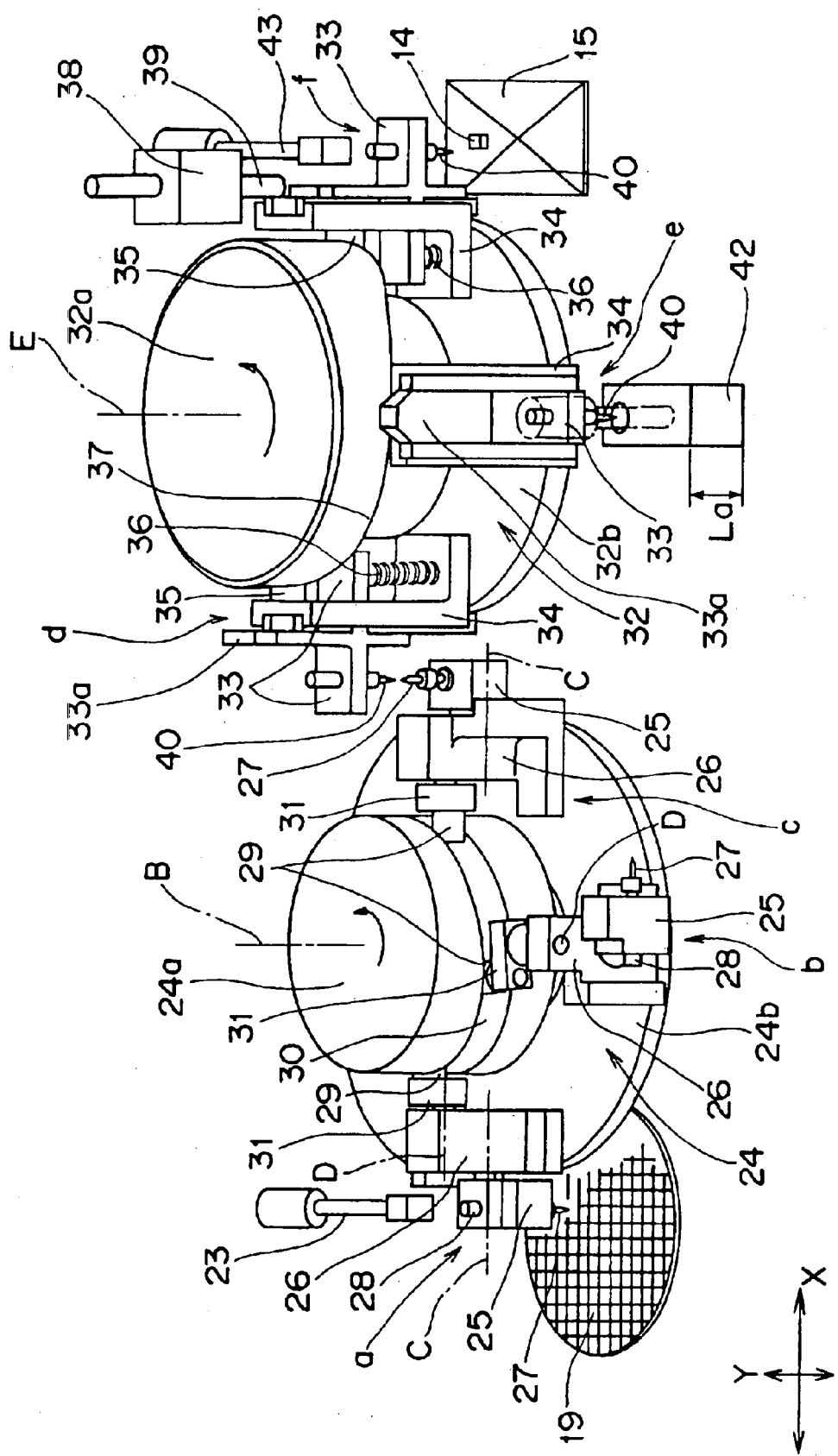
FIG. 2 is a perspective view showing both holders of the electronic component mounting apparatus of the first embodiment.

FIG. 2 is a perspective view showing a component supply holder 24, which has a supply-side suction nozzle 27 for sucking and holding an electronic component 19 that is on the jig plate 17, and moves the supply-side suction nozzle 27 sequentially from a sucking position a (see FIG. 3) as an example of a component take-out position, a reversing position b at which the sucked and held electronic component 19 is vertically reversed, a supply-side component delivering and receiving position c at which the reversed electronic component 19 is delivered for being received, and then to a re-reversing position h at which the vertically reversed state is reversed, in order to suck, reverse, and deliver for being received, an electronic component. Also shown is a component mounting holder 32, which has a mounting-side suction nozzle 40 for sucking and holding the electronic component 19, and moves the mounting-side suction nozzle 40 sequentially from a mounting-side component delivering and receiving position d which is immediately above the supply-side component delivering and receiving position c and at which the electronic component 19 delivered from the component supply holder side is received and held by the nozzle 40, a component recognizing position e at which the held electronic component 19 is recognized, a component mounting position f at which the recognized electronic component 19 is mounted onto the board 15, and then to a defective disposing position g. In the explanation provided below, a state in which the supply-side suction nozzle 27 is positioned sequentially at the sucking position a (see FIG. 3), reversing position b, supply-side component delivering and receiving position c, and re-reversing position h may be simply described as the component supply holder 24 being positioned at these respective positions, but these descriptions refer to the same state. Similarly, in the explanation provided below, a state in which the mounting-side suction nozzle 40 is positioned sequentially at the mounting-side component delivering and receiving position d, component recognizing position e, component mounting position f, and defective disposing position g may be simply described as the component mounting holder 32 being positioned at these respective positions, but both descriptions refer to the same state. The component supply holder 24 and the component mounting holder 32 are located, for example, on left and right sides or vice versa, respectively, with respect to a front of the apparatus where an operator of the component mounting apparatus is positioned. Component 19 is removed from the component supply table 22, passed into the component mounting apparatus to a front side of the component supply holder 24 and the component mounting holder 32, and then mounted onto the board 15.

Specifically, reference numeral 24 denotes a component supply holder provided with a pillar-like or cylindrical component supply holder main body 24a, which is non-rotatably fixed, and a disk 24b, which is disposed at a lower end of the main body 24a and rotated around the main body 24a. The component supply holder is constituted such that the disk 24b of the component supply holder 24 can perform indexing rotation; that is, intermittent indexing rotation around the main body 24a about a B axis, which is a central axis of the component supply holder main body 24a, via a drive device 100 described later. Reference numeral 25 denotes a reverse-supply head. Four of these reverse-supply heads in total are disposed along a periphery of the component supply holder 24 at regular intervals of, for example, 90 degrees via reverse-supply head supporting brackets 26 fixed to the disk 24b of the component supply holder 24. Each reverse-supply head 25 is constructed so as to be capable of oscillating about a lateral axis C perpendicular to the B axis within a prescribed range. Reference numeral 27 denotes a supply-side suction nozzle disposed at an end of each reverse-supply head 25, which nozzle can suck and hold a region on an upper surface of an electronic component 19 which is to be sucked. The supply-side suction nozzle 27 can be lowered by pressing a portion 28 at an upper end of an activating shaft 175 described later, which is attached to the reverse-supply head 25 so as to be movable in an axial direction.

Reference numeral 29 denotes a cam follower constituted by a roller that is rollably supported by the bracket 26 of the reverse-supply head 25. The can follower is moved in a cam groove 30 formed continuously in an outer peripheral surface of the main body 24a of the component supply holder 24. When the cam follower 29 is reliably rollable, this cam groove 30 may be constituted by a cam surface that does not have a groove shape. Reference numeral 31 denotes a lever attached to the bracket 26. The lever can be oscillated about a lateral axis D, perpendicular to the B axis and parallel to the lateral axis C, within a prescribed range in clockwise and counter-clockwise directions. When a position of the cam follower 29 moving in the cam groove 30 is changed in a vertical direction with respect to the lateral axis D, a tilting angle of the lever changes in the clockwise and counter-clockwise directions assuming the lateral axis D as a central axis. When tilting of the lever 31 changes, as described later, a turning force is transmitted to the reverse-supply head 25 via two gears 150, 151 shown in FIGS. 18–20, which are disposed in the bracket 26, and the reversing head 25 is oscillated about the lateral axis C in clockwise and counter-clockwise directions.

Reference numeral 32 denotes a component mounting holder, which is provided with a pillar-like or cylindrical component mounting holder main body 32a, which is non-rotatably fixed, and a disk 32b, which is disposed at a lower end of the main body 32a and rotatable around the main body 32a. The disk 32b of the component mounting holder 32 can perform indexing rotation; that is, intermittent indexing rotation around the main body 32a of the component mounting holder 32 via a drive device 100 about axis E, which is a central axis of the component mounting holder main body 32a. As described later, indexing rotation of the component mounting holder 32 is performed structurally in synchronization with indexing rotation of the component supply holder 24.

Figure 22:
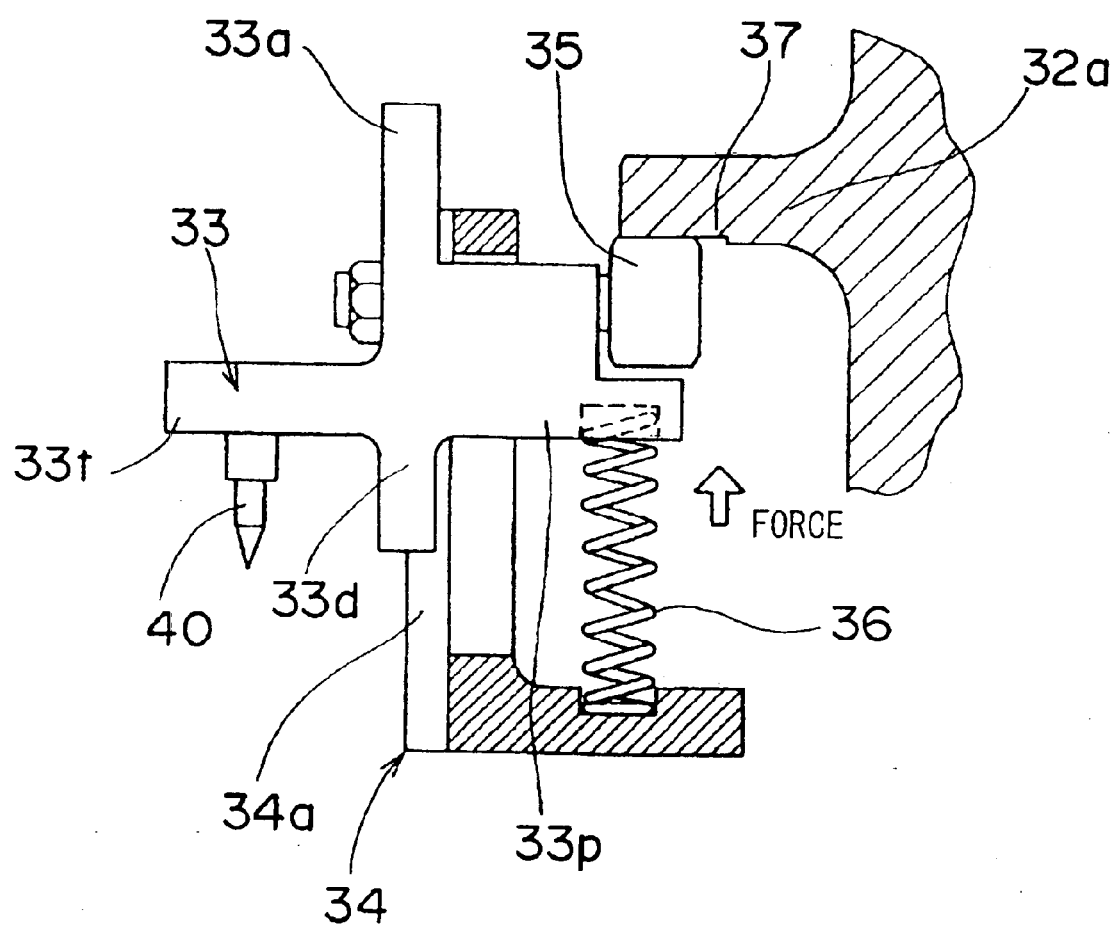
FIG. 22 is an explanatory view showing a guide mechanism for guiding vertical movement of a mounting-side suction nozzle in the electronic component mounting apparatus of the first embodiment.

Reference numeral 33 denotes a mounting head. Four mounting heads 33 in total are disposed on the disk 32b of the component mounting holder 32 at regular intervals of, for example, 90 degrees via sliders 34 for guiding up and down movement of the mounting head 33, respectively. A cam follower 35 composed of a rollably supported roller is disposed on each mounting head 33 and, as shown in FIG. 22, the cam follower 35 is always pressed onto an end surface of the cam surface 37 by a force of spring 36.

Reference numeral 38 denotes a linear motor disposed at a mounting position f, but located above mounting position f and outside the component mounting holder 32. A mounting-side suction nozzle 40 of the mounting head 33 positioned at mounting position f can be pressed downwardly by moving the linear motor 38 to lower drive shaft 39.

Reference numeral 40 denotes the mounting-side suction nozzle, which is disposed at a lower end of each mounting head 33 and can suck and hold a suckable region on a lower surface of electronic component 19.

Reference numeral 41 denotes a component mounting table, which is disposed at mounting position f and mounts thereon board 15 onto which the component 19 is to be mounted. The component mounting table 41 can hold the circuit board 15 thereon, reciprocate in X and Y directions respectively, and rotate horizontally in an X-Y plane. In the component mounting table 41, a horizontal board rotation drive device 610, having a horizontal board rotation guide device, enabling, in the X-Y plane, horizontal rotation of the board 15 is disposed below a horizontal board movement drive device 612, having a horizontal board movement guide device, enabling horizontal movement along the X-Y plane, and a central axis of this horizontal rotation is coaxial with the central axis of the mounting-side suction nozzle 40.

Figure 38:
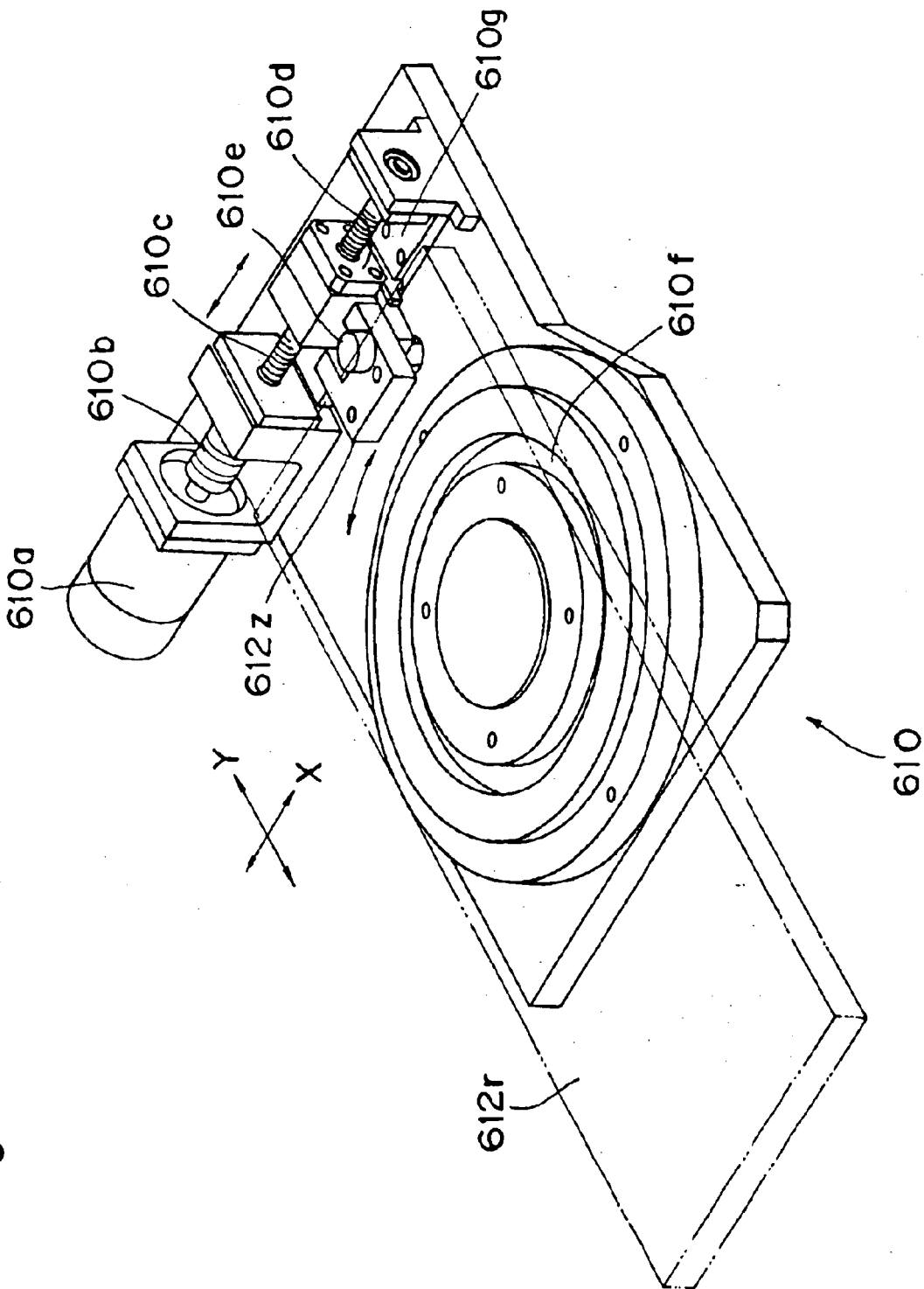
FIG. 38 is a perspective view showing a horizontal board rotational drive device, with a horizontal board rotation guide device, on a component mounting-side in the electronic component mounting apparatus of the first embodiment.
Figure 40:
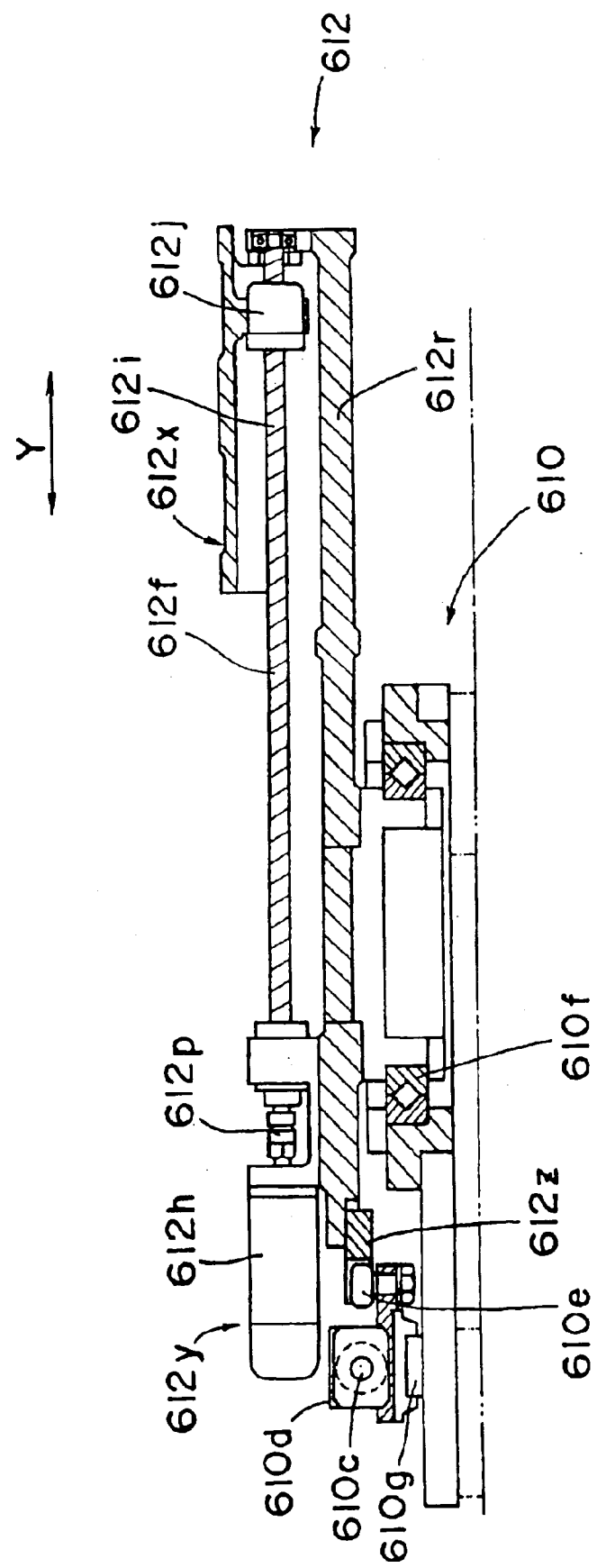
FIG. 40 is a partial sectional side view showing the horizontal board rotational drive device and the horizontal board movement drive device on the component mounting-side in the electronic component mounting apparatus of the first embodiment.

The horizontal board rotation drive device 610, having the horizontal board rotation guide device, which enables horizontal rotation of the component mounting table 41 is constituted as described below. That is, as shown in FIGS. 38 and 40, a rotating shaft of a θ-axis motor 610a is connected to a ball screw 610c by a coupling 610b. Therefore, the ball screw 610c is normally and reversely rotated by a normal and reverse rotational drive of the θ-axis motor 610a, and a nut 610d screw-threaded to the ball screw 610c moves back and forth along an X-axis direction while being guided by a linear movement guide 610g. Then, a linear guide 612z which is engaged with a cam follower 610e, fixed to the nut 610d and fixed to a Y-axis base 612r, moves back and forth along the X-axis direction so that the Y-axis base 612r is normally and reversely rotated about a cross roller guide 610f; that is, about the θ axis via the cross roller guide 610f. Thus, the Y-axis base 612r can be horizontally rotated about the θ axis. As a result, angle correction about the axis of a mounting-side component holding member (i.e. about the θ axis) between a component and an object upon which the component is to be mounted, during mounting of the component can be performed by horizontal rotation of the component mounting table 41.

Figure 39:
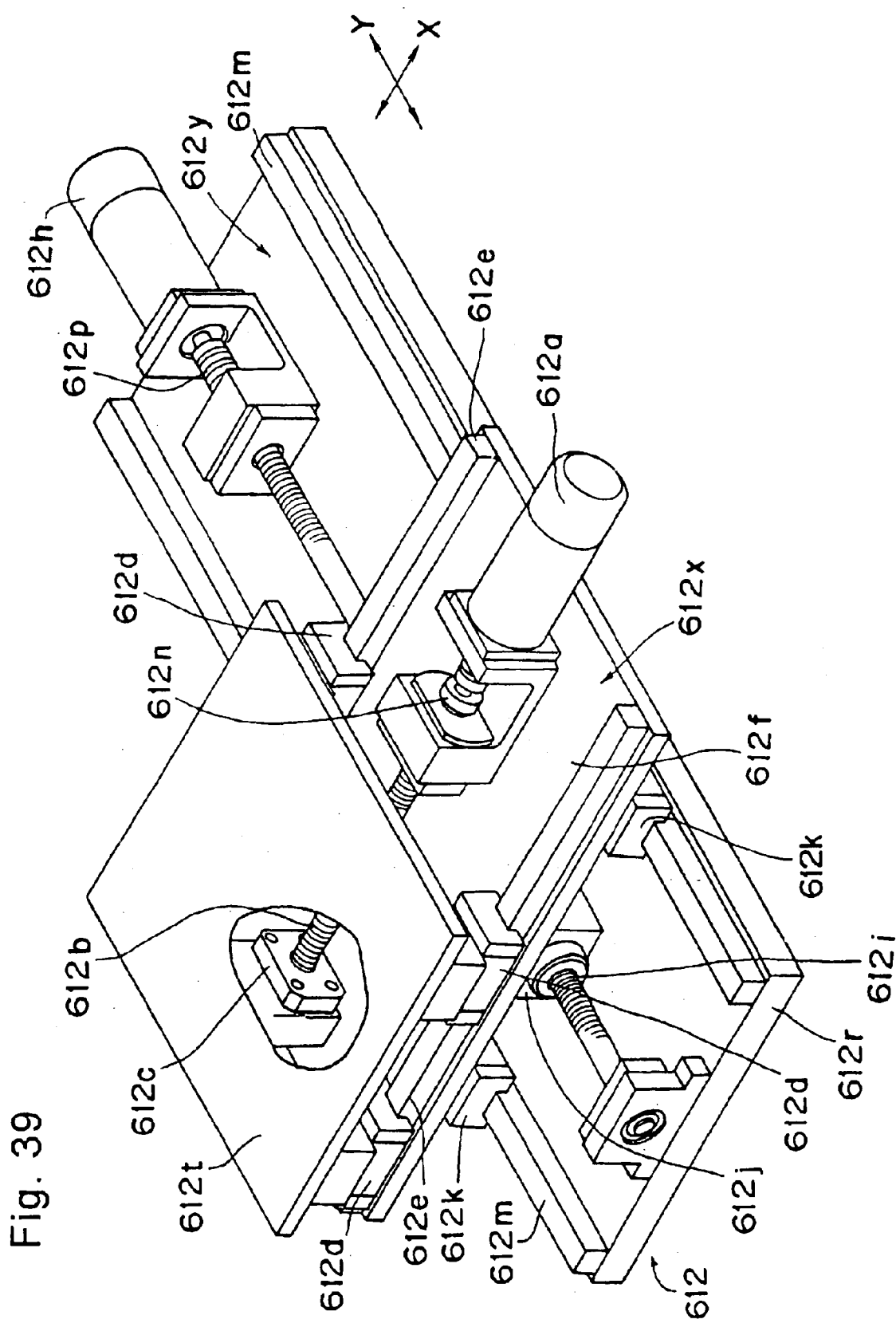
FIG. 39 is a partially removed perspective view showing a horizontal board movement drive device, with a horizontal board movement guide device, on the component mounting-side in the electronic component mounting apparatus of the first embodiment.

As shown in FIGS. 39 and 40, in the horizontal wafer movement drive device 612, having the horizontal wafer movement guide device, which enables horizontal movement of the component mounting table 41 along the X-Y plane, a Y-axis movement drive device 612y is disposed on the Y-axis base 612r while an X-axis movement drive device 612x is disposed on the X-axis base 612f of the Y-axis movement drive device 612y. That is, in the Y-axis movement drive device 612y, the rotating shaft of the Y-axis moving motor 612h fixed to the Y-axis base 612r is connected to the ball screw 612i by the coupling 612p. Therefore, the ball screw 612i is normally and reversely rotated by a normal and reverse rotational drive of the Y-axis moving motor 612h, and the nut 612j which is screw-threaded to the ball screw 612i and fixed to the X-axis base 612f moves back and forth along the Y-axis direction. At this time, the X-axis base 612f has a pair of sliding guide members 612k, 612k on either side thereof and the sliding guide members 612k, 612k move back and forth on guide rails 612m, 612m fixed to the Y-axis base 612r so that the X-axis base 612f is guided along the Y-axis direction with respect to the Y-axis base 612r. On the other hand, in the X-axis movement drive device 612x, the rotating shaft of the X-axis moving motor 612a fixed to the X-axis base 612f is connected to the ball screw 612b by a coupling 612n. Therefore, the ball screw 612b is normally and reversely rotated by a normal and reverse rotational drive of the X-axis moving motor 612a, and a nut 612c which is screw-threaded to the ball screw 612b and fixed to the wafer holding table 612t moves back and forth along the X-axis direction. At this time, the board holding table 612t has a pair of sliding guide members 612d, 612d on either side thereof, and the sliding guide members 612d, 612d move back and forth on guide rails 612e, 612e fixed to the X-axis base 612f so that the table 612t is guided along the X-axis direction with respect to the X-axis base 612f. Thus, the table 612t can be moved along the X and Y directions with respect to the Y-axis base 612r via the Y-axis movement drive device 612y and the X-axis movement drive device 612x.

With such a constitution, the drive device 612, having the guide device, which is mounted on the component mounting table 41 and enables horizontal rotation of the component mounting table, is disposed below the drive device 602, having its guide device, which enables horizontal movement. The central axis of this horizontal rotation can always be co-axial with the central axis of the supply-side component holding member which mounts a component while sucking and holding the component.

Reference numeral 42 denotes a recognition camera disposed at recognizing position e. This recognition camera has a function of confirming a position of electronic component 19, while sucked and held by the mounting-side suction nozzle 40, by inputting image information of the electronic component 19 into a recognition camera main body composed of a CCD camera or the like via an optical system.

Reference numeral 43 denotes a recognition camera disposed at mounting position f. This recognition camera has a function of confirming a position of a feature point for confirming a mounting position on circuit board 15.

The aforementioned constitution, in which indexing rotation of the component mounting holder 32 is performed structurally in synchronization with indexing rotation of the component supply holder 24, is explained below.

Figure 5:
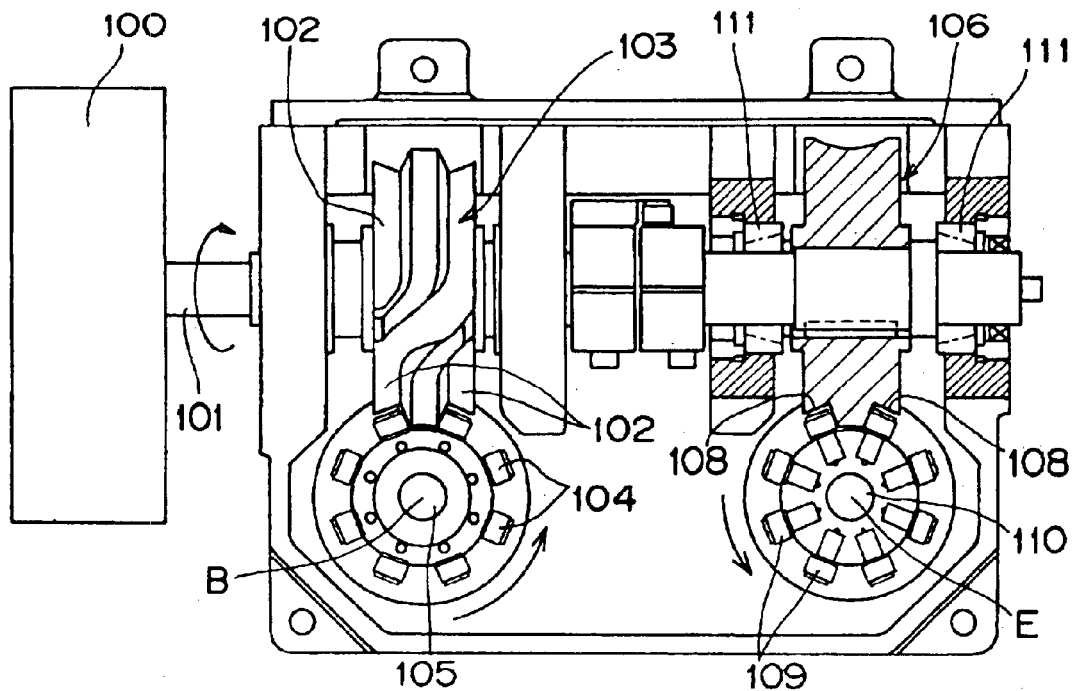
FIG. 5 is a partially sectional plan view of a drive mechanism for performing intermittent indexing rotation of a component supply holder and a component mounting holder of the electronic component mounting apparatus of the first embodiment.
Figure 6:
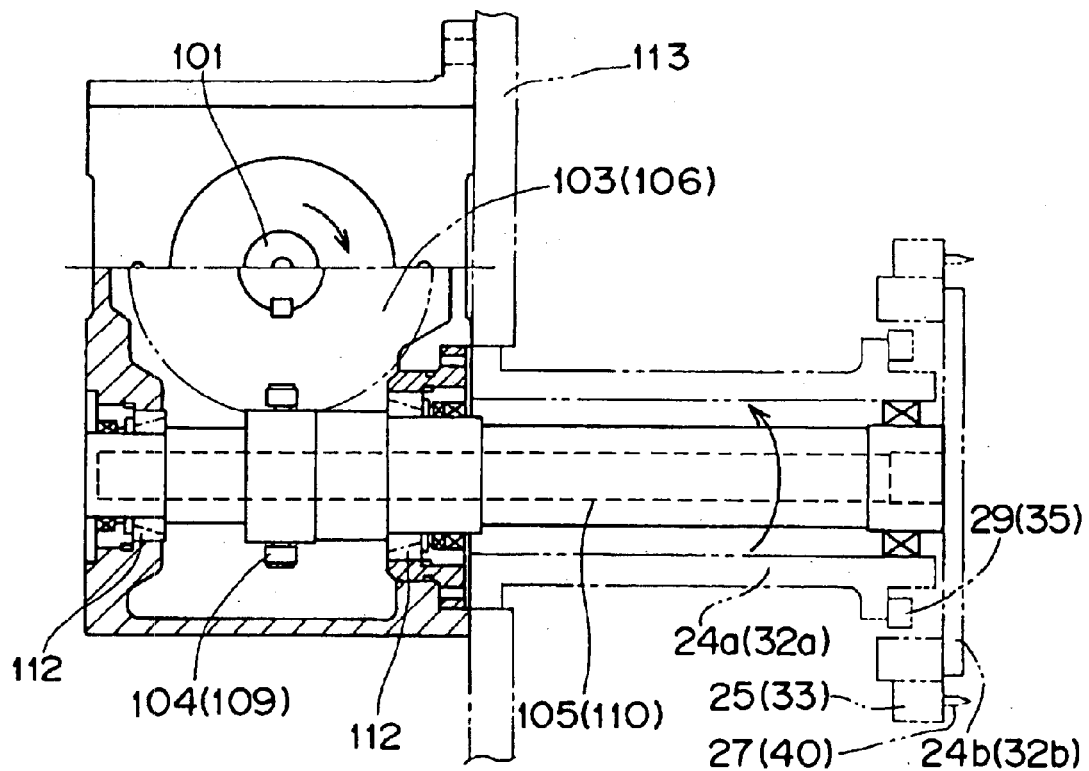
FIG. 6 is a partially sectional side view of the drive mechanism shown in FIG. 5.
Figure 31:
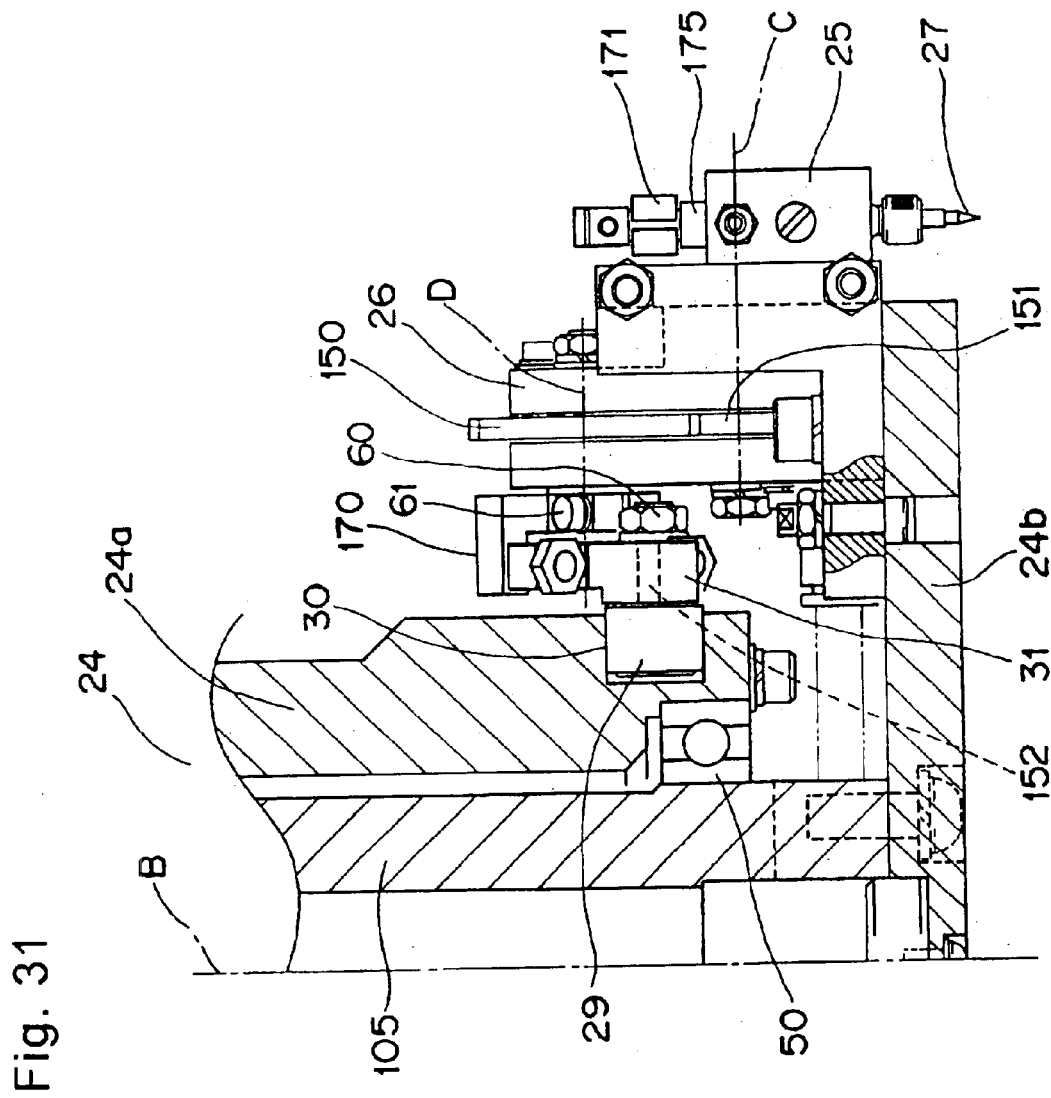
FIG. 31 is an explanatory view showing a relationship between a first output shaft and the component supply holder in the electronic component mounting apparatus of the first embodiment.
Figure 32:
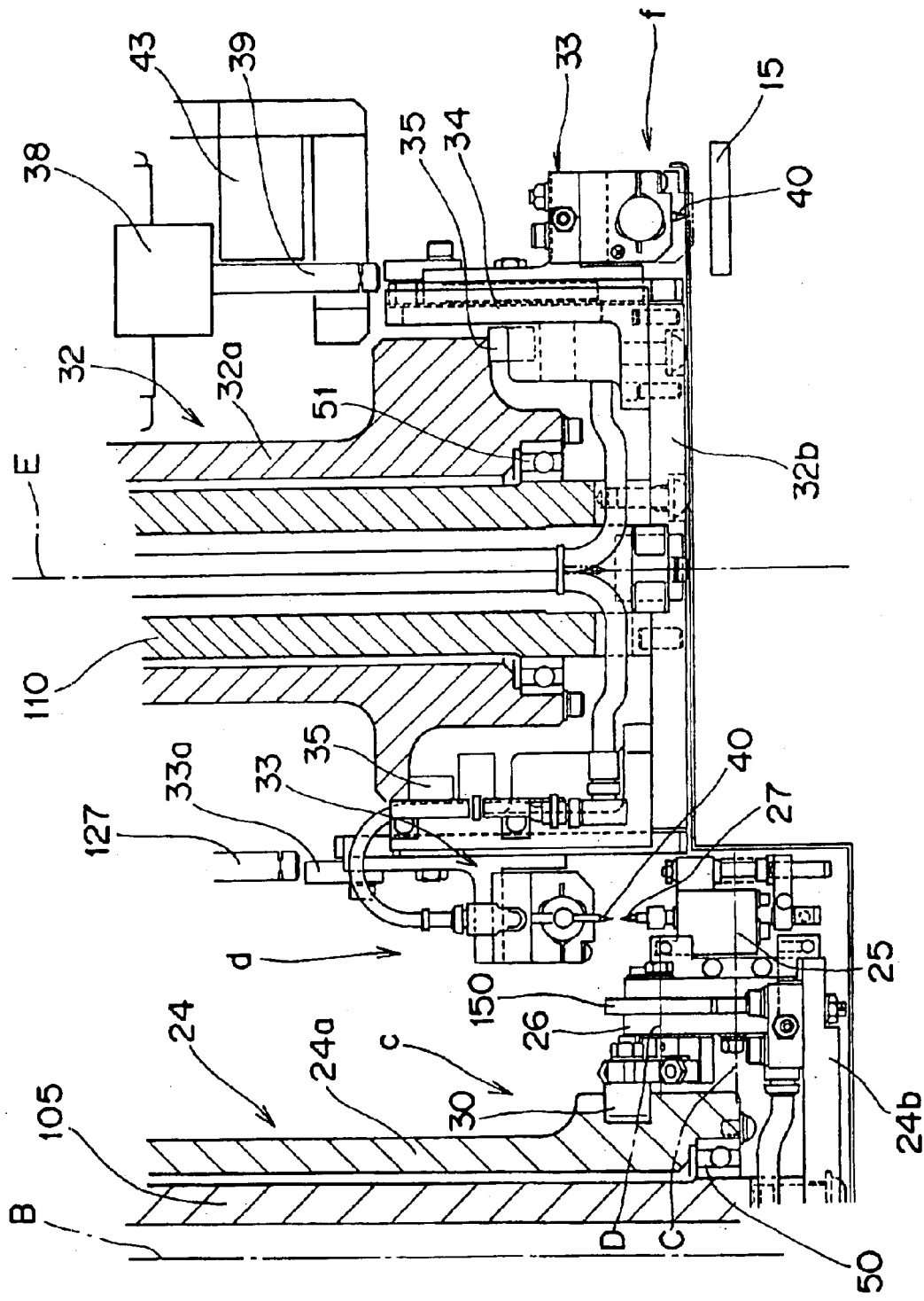
FIG. 32 is an explanatory view showing a relationship between a second output shaft and the component mounting holder in the electronic component mounting apparatus of the first embodiment.
Figure 33:
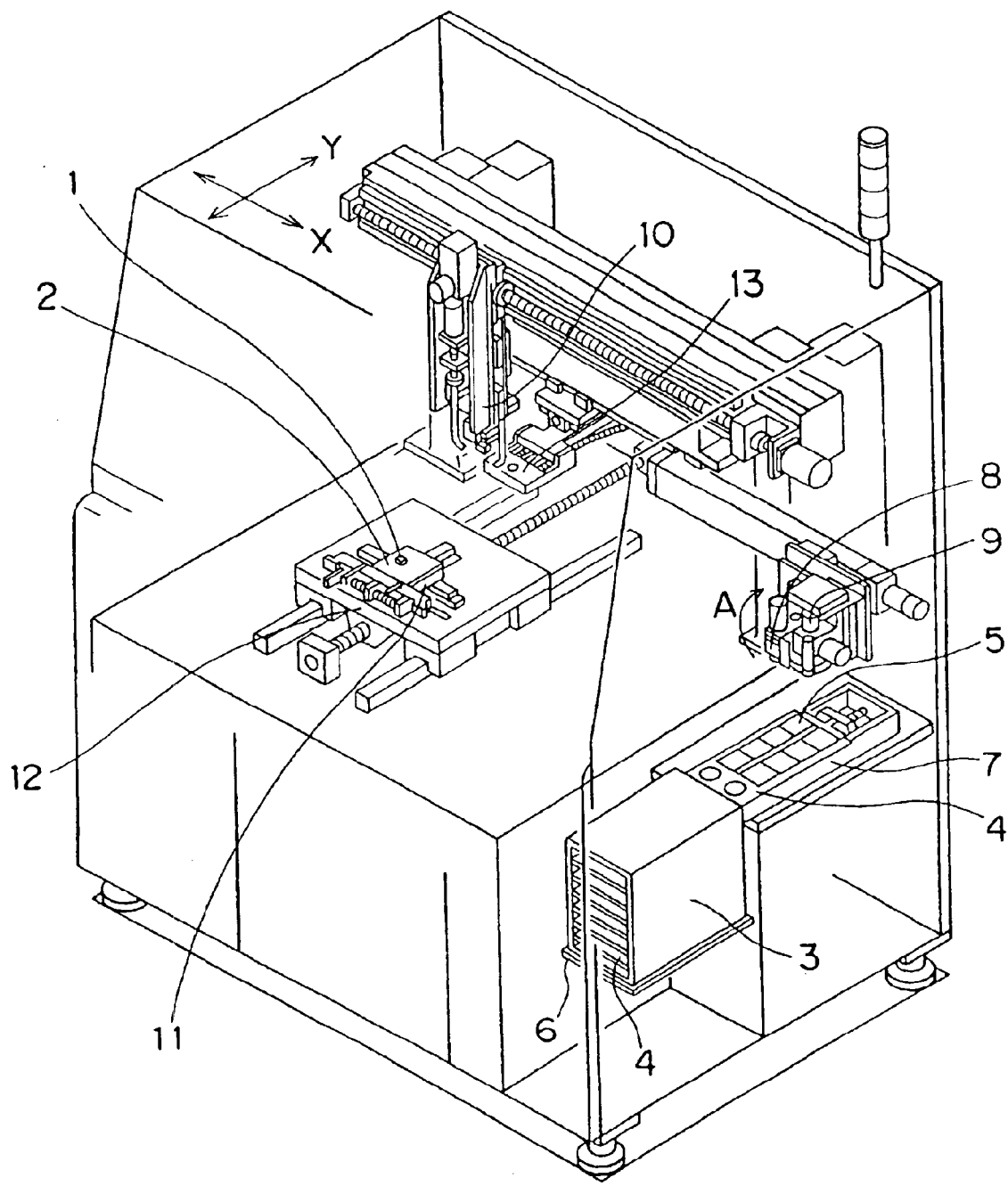
FIG. 33 is a perspective view showing an overall constitution of a conventional electronic component mounting apparatus.
Figure 34:
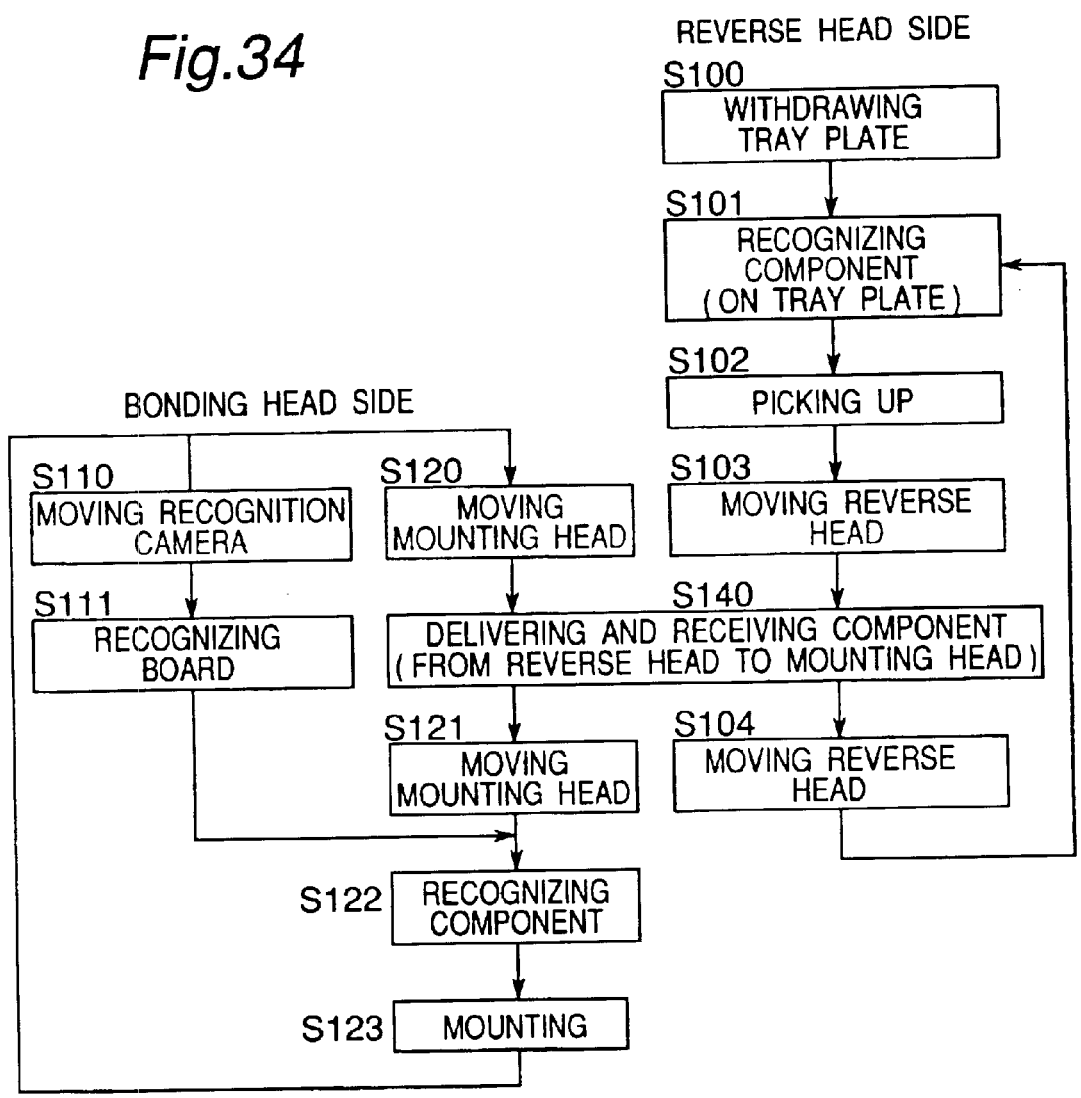
FIG. 34 shows a schematic flow of a series of operations of the conventional electronic component mounting apparatus.

As shown in FIGS. 1, 5, 6 and 10, a first drive gear 103 having on an outer peripheral surface thereof a cam groove 102, having a linear portion which constitutes a straight line in a gear circumferential direction and a tilting portion that is tilted at a prescribed angle in the circumferential direction, is fixed to an input shaft 101 which is connected to a drive device 100, such as an AC servomotor or the like, so as to be rotationally driven. A second drive gear 106 having a cam groove 108 on an outer peripheral surface thereof is also fixed so that the input shaft 101, the first drive gear 103, and the second drive gear 106 are integrally rotated. Cam followers 104 fixed to a periphery of a first output shaft 105 at prescribed intervals are successively engaged with the cam groove 102 of the first drive gear 103. In the linear portion of the cam groove 102, the cam followers 104 stay at a position and maintain the first output shaft 105 at a stop position, described later, without rotating this shaft. In the tilting portion of the cam groove 102, the cam followers 104 are moved so that the first output shaft 105 is forcibly rotated counter-clockwise and, in synchronization therewith, cam followers 109 fixed to a periphery of a second output shaft 110 at prescribed intervals are successively engaged with the cam groove 108 of the second drive gear 106. In a linear portion of the cam groove 108, the cam followers 109 stay at a position and maintain the second output shaft 110 at a stop position, described later, without rotating this shaft. In a tilting portion of the cam groove 108, the cam followers 109 are moved so that the second output shaft 110 is forcibly rotated counter-clockwise. Therefore, the input shaft 101 continues rotating at all times and indexing rotation, that is, intermittent indexing rotation is performed by repeating a rotational state in which each holder is rotating and a stop state in which each holder stops at the stop position, alternately, by the shape of each cam groove. As shown in FIGS. 31 and 32, the first output shaft 105 is connected to the disk 24b of the component supply holder 24, and the disk 24b of the component supply holder 24 is rotated integrally with the first output shaft 105. Also, as shown in FIG. 32, the second output shaft 110 is connected to the disk 32b of the component mounting holder 32, and the disk 32b of the component mounting holder 32 is rotated integrally with the second output shaft 110. Therefore, when the drive device 100 rotates the input shaft 101, the cam followers 104 of the first output shaft 105 are successively engaged with the cam groove 102 of the first drive gear 103, and the first output shaft is stopped at a stop position in the stop state. In a rotational state, the cam followers 109 of the second output shaft 110 are successively engaged with the cam groove 108 of the second drive gear 106 in synchronization with the counter-clockwise rotation of the first output shaft 105, and the second output shaft 110 is stopped at a stop position in the stop state while rotated counter-clockwise in the rotational state. Thus, indexing rotation of the component mounting holder 32 is performed structurally in synchronization with indexing rotation of the component supply holder 24. In FIGS. 5 and 6, reference numerals 111 and 112 denote bearings. Reference numeral 113 denotes an upper frame. In FIGS. 31 and 32, reference numeral 50 denotes a bearing, for rotatably supporting the first output shaft 105, in the component supply holder main body 24a. Reference numeral 51 denotes a bearing, for rotatably supporting the second output shaft 110, in the component mounting holder main body 32a.

Figure 10:
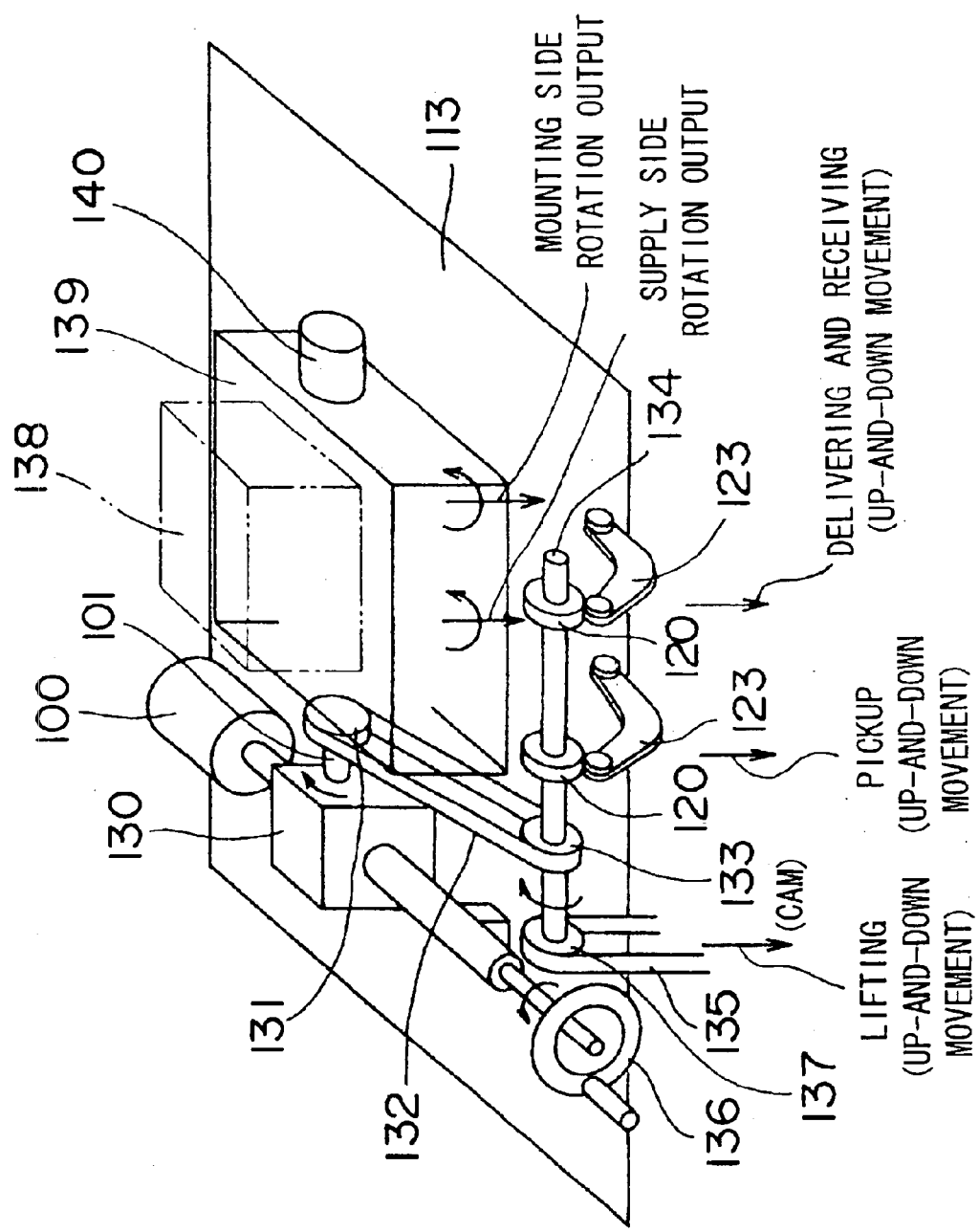
FIG. 10 is a schematic explanatory view showing the drive mechanism in FIG. 5 in the electronic component mounting apparatus of the first embodiment.

In FIGS. 1 and 10, reference numeral 130 denotes a decelerator for adjusting a drive force, from the drive device 100, to a proper output and inputting the output to the input shaft 101. Reference numeral 136 denotes a handle for manual rotary adjustment. Reference numeral 131 denotes a pulley fixed to the input shaft 101. Reference numeral 132 denotes a belt wound about the pulley 131. Reference numeral 134 denotes a drive shaft. Reference numeral 133 denotes a pulley which is fixed to the drive shaft 134 and rotated integrally with the drive shaft 134, and to which the belt 132 is wound about to rotationally drive the drive shaft 134 along with rotation of the input shaft 101. Reference numeral 120 denotes a cam fixed to the drive shaft 134 and is rotated integrally with the drive shaft 134. Reference numeral 123 denotes a lever having a cam follower at one end thereof that is always in contact with a cam 120. Rotational movement of the drive shaft 134 is converted to vertical movement by a pair of cams 120, 120 and levers 123, 123 having cam followers at ends thereof. Thus, a cam mechanism for converting operations to a pickup operation, that is, a vertical operation for sucking a component and a vertical operation for delivering and receiving a component, is constituted. Reference numeral 137 denotes a cam fixed to the drive shaft 134 and is rotated integrally with the drive shaft 134. Reference numeral 135 denotes a belt wound about the cam 137. Thus, when an IC chip is to be sucked by supply-side suction nozzle 19, it is easy to suck the IC chip, by lifting up the IC chip from a wafer supported by the jig plate 17, by utilizing a drive force transmitted from the belt 135. Reference numeral 138 denotes a valve drive unit for controlling a sucking operation and a blowing operation performed by supply-side suction nozzle 27, mounting-side suction nozzle 40, or the like. Reference numeral 139 denotes an index unit for performing intermittent indexing rotation as described above. Reference numeral 140 denotes a rotary encoder which is attached to another end of the input shaft 101 and detects a rotational amount of the input shaft 101.

Figure 11:
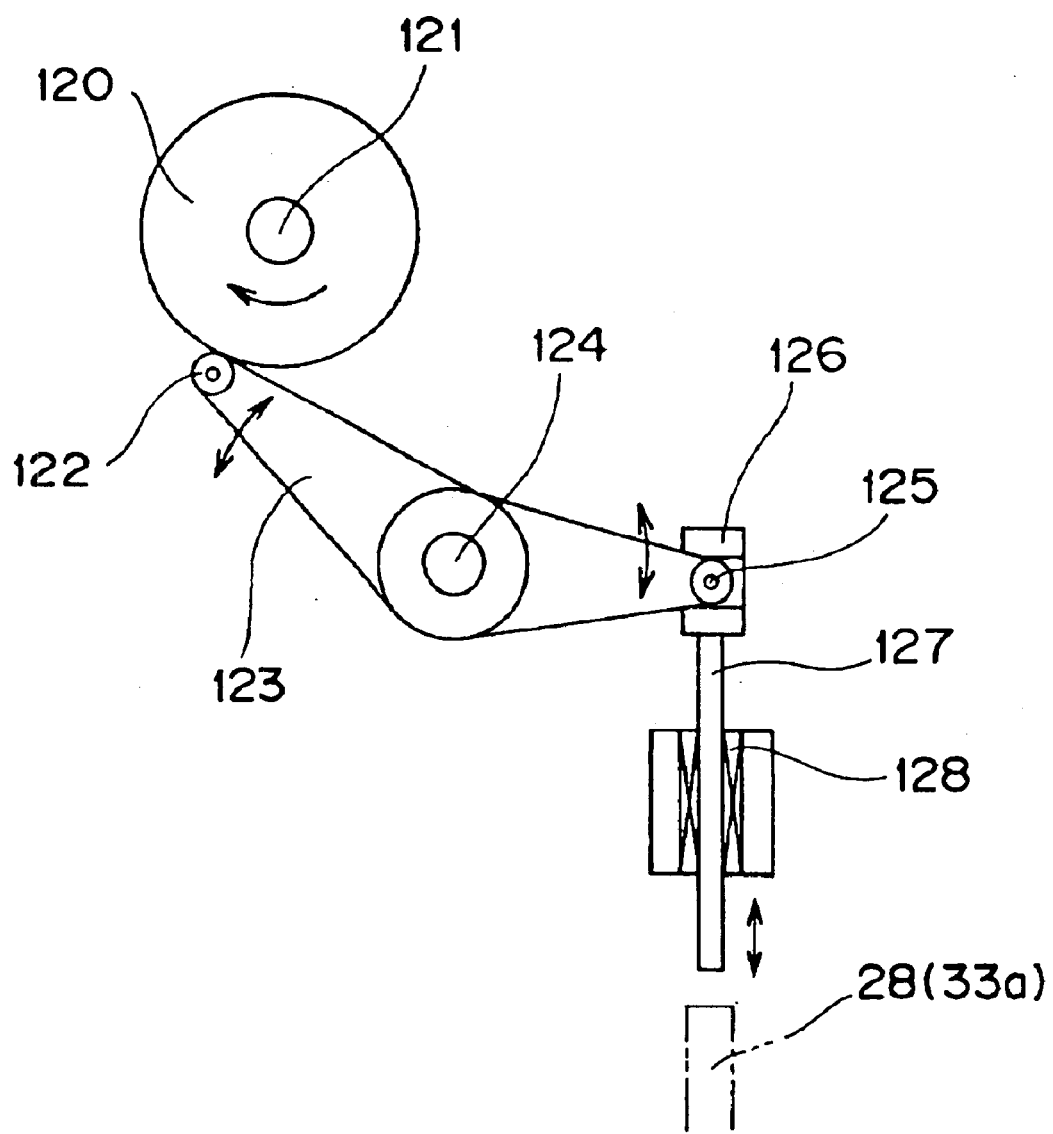
FIG. 11 is an explanatory view showing an example of a cam mechanism for converting operations to a vertical operation for sucking a component, and a vertical operation for delivering and receiving the component, in the electronic component mounting apparatus of the first embodiment.

FIG. 11 shows an example of a cam mechanism constituted by the pair of cams 120, 120 and the levers 123, 123 having the pair of cam followers at one end thereof. This cam mechanism is an example of an external pressing device described later.

In FIG. 11, reference numeral 122 denotes a cam follower rotatably attached at one end of each lever 123. Reference numeral 124 denotes an oscillating fulcrum of each lever 123. Reference numeral 125 denotes a cam follower rotatably attached to another end of each lever 123. Reference numeral 126 denotes a cylindrical engaging portion with which each cam follower 125 is engaged. Reference numeral 127 denotes a drive shaft to which the cylindrical engaging portion 126 is fixed at an upper end thereof. Reference numeral 128 denotes an up-and-down guide member for guiding up and down movement of the drive shaft 127. According to such a constitution, when cam 120 is rotated along with rotation of the drive shaft 127, lever 123 oscillates around oscillating fulcrum 124 via cam follower 122 that is always in contact with an outer peripheral surface of the cam 120 so that the drive shaft 127 is guided by the up-and-down guide member 128 and moved up and down via cam follower 125 and engaging portion 126. As a result, when the mechanism according to the above constitution is disposed above component sucking position a, the portion 28 of the reverse-supply head 25 is pressed downwardly by a lower end of the drive shaft 127 and the supply-side suction nozzle 27 can be lowered. When the mechanism according to the above constitution is disposed above mounting-side component passing position d, portion 33a of the mounting head 33 is pressed downwardly by the lower end of the drive shaft 127 and thus the mounting-side suction nozzle 40 can be lowered.

Figure 14:
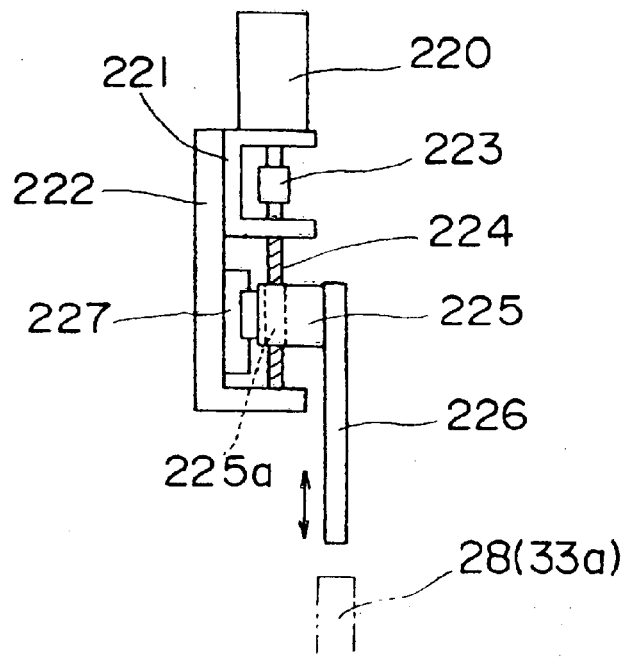
FIG. 14 is an explanatory view showing a modification of FIG. 11, which is a mechanism for a vertical operation for sucking a component, and a vertical operation for delivering and receiving the component, in the electronic component mounting apparatus of the first embodiment.

As a substitute of such a cam mechanism, an AC servomotor can be used. For example, as shown in FIG. 14, a U-shaped bracket 221 is fixed to an upper end of an L-shaped base 222, and an AC servomotor 220 is fixed to an upper end of the bracket 221. A lower end of a rotating shaft of the AC servomotor 220 is connected to an upper end of a ball screw 224 via a coupling 223. A block 225 is screw-threaded to the ball screw 224. Up and down movement of the block 225 is guided by a guide 227, and a drive shaft 226 is fixed to the block 225 and extends downwardly. Therefore, the ball screw 224 is rotated by rotation of the AC servomotor 220, a rotating force of the ball screw 224 is converted into an up-and-down moving force of the block 225 via a nut 225a, the block 225 is moved up and down while being guided by the guide 227, and then the drive shaft 226 is moved up and down. Thus, the same action as that of the drive shaft 127 in FIG. 11 can be achieved.

A mechanism for up and down reversing a sucked and held electronic component 19 is explained below with reference to FIGS. 1, 2, and 15–20.

Figure 15:
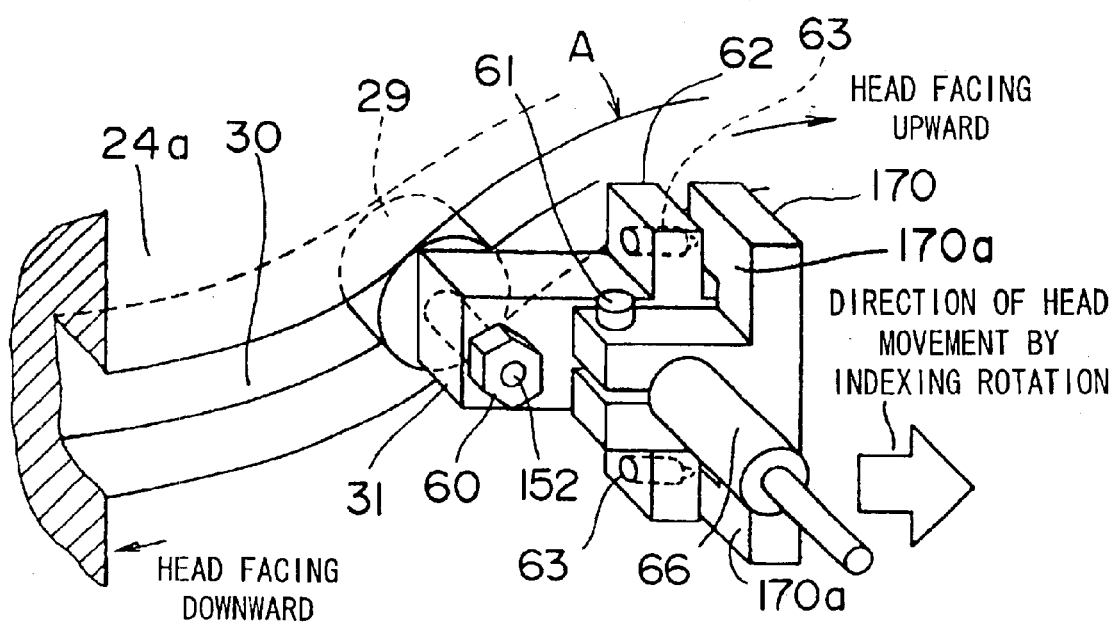
FIG. 15 is a partially perspective view of a reversing mechanism of a component supply holder in the electronic component mounting apparatus of the first embodiment.
Figure 19:
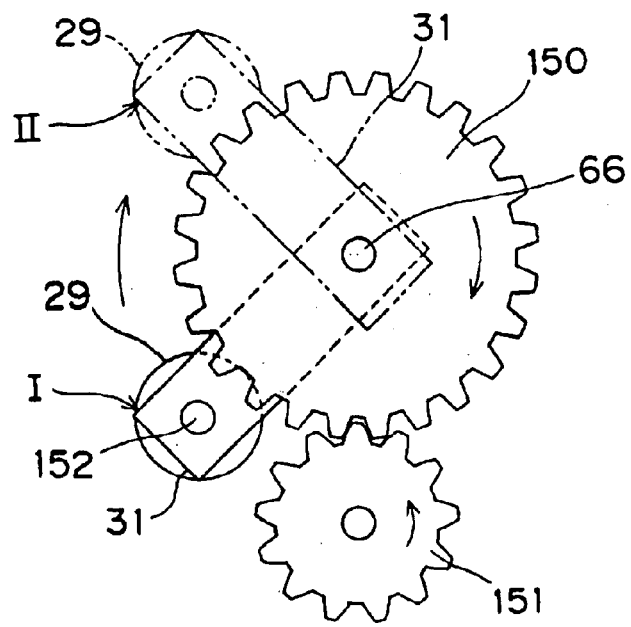
FIG. 19 is an explanatory view showing a gear portion of the reversing mechanism in the electronic component mounting apparatus of the first embodiment.
Figure 20:
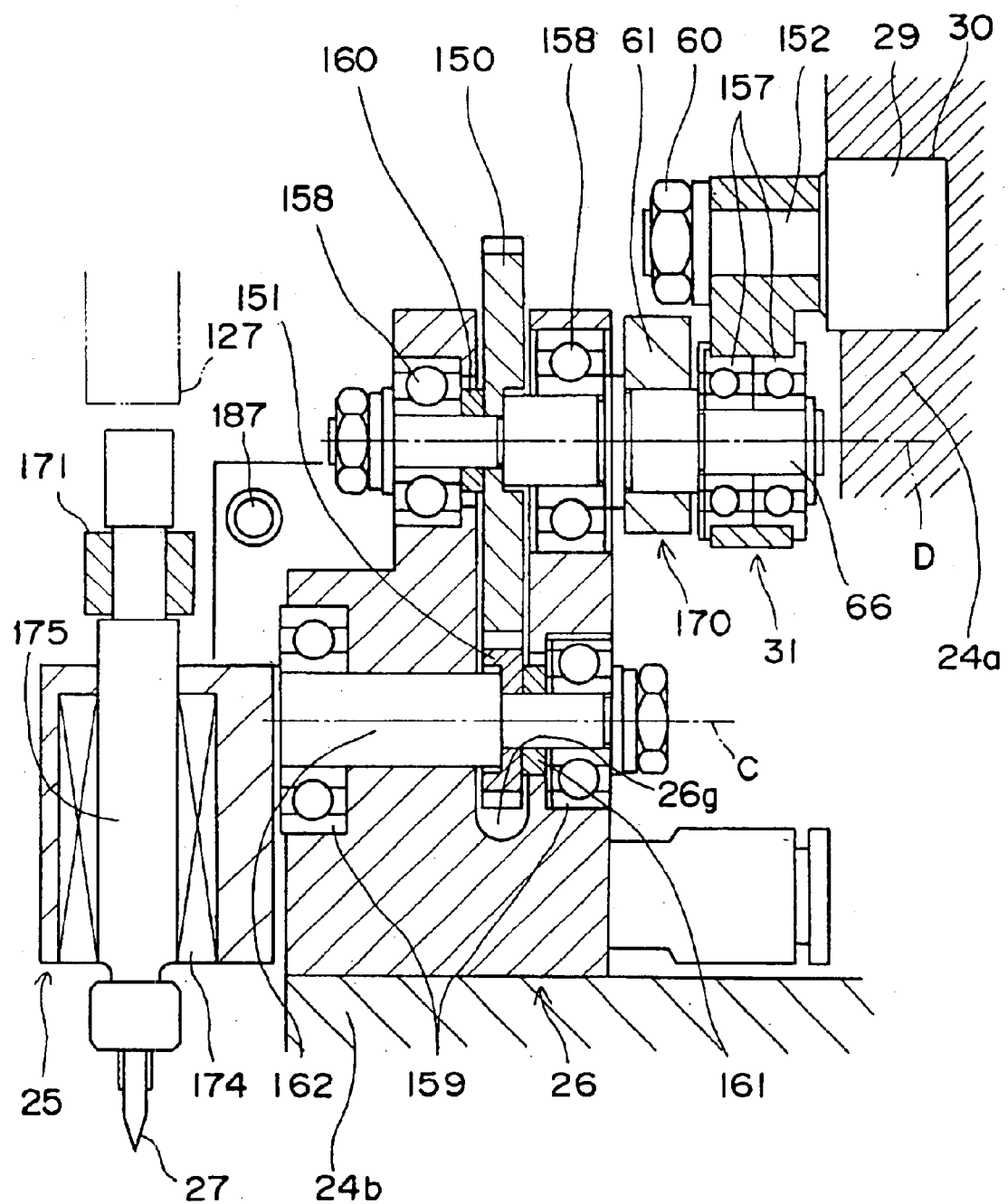
FIG. 20 is a sectional view showing the reversing mechanism in the electronic component mounting apparatus of the first embodiment.

First, in FIGS. 15, 19 and 20, a roller-like cam follower 29, moving while appropriately rolling in cam groove 30 of the main body 24a of the component supply holder 24, is rollably supported by a support shaft 152 with a screw and is fixed to an end protrusion of a substantially T-shaped-plate-like lever 31 by a nut 60 at a screw portion of the support shaft 152. One end of a support shaft 66, whose central shaft is lateral axis D, is attached to a central portion of another end of the lever 31 via a pair of bearings 157, 157 so as to relatively rotate. While held between divided protrusions of a central portion of a T-shaped-plate-like bracket 170, the bracket 170 is split-clamped and fixed to this support shaft 66 by a bolt 61 so that the support shaft 66 and bracket 170 are integrally rotated.

Figure 16:
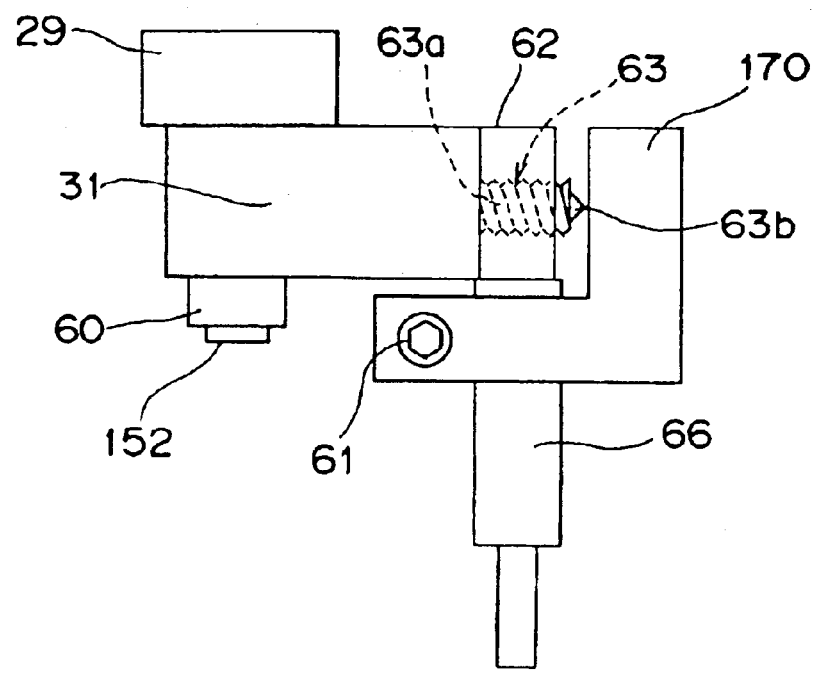
FIG. 16 is a partial plan view of the reversing mechanism in the electronic component mounting apparatus of the first embodiment.
Figure 17:
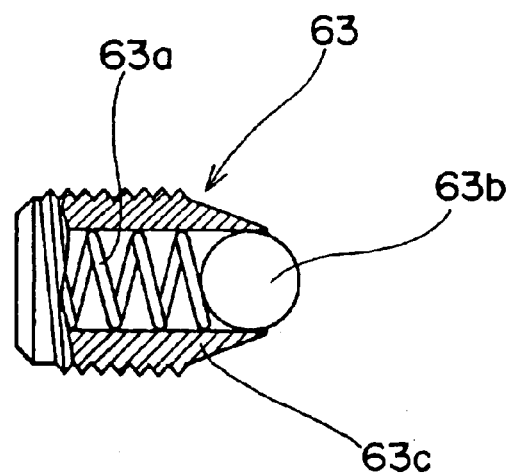
FIG. 17 is a partial sectional view of a ball plunger in the reversing mechanism in the electronic component mounting apparatus of the first embodiment.

In FIG. 15, ball plungers 63 are respectively provided in both side surfaces sandwiching the central portion of the other end of the lever 31, which are opposed to surfaces 170a, 170a of both upper and lower end portions of the bracket 170. As shown in FIGS. 16 and 17, each ball plunger 63 has a thread groove in an outer peripheral portion of a cylindrical portion 63c and is embedded by screw-threading the thread groove to the lever 31. In the cylindrical portion 63c, an urging force of a spring 63a acts on a ball 63b, and the urging force of the spring 63a continually presses the ball 63b towards an exterior of the cylindrical portion 63c. However, the ball 63b is not allowed to completely come out of the cylindrical portion 63c by narrowing an end of the cylindrical portion 63c, or the like. To the contrary, if a force equal to or larger than the urging force of the spring 63a is applied to the ball 63b towards an interior of the cylindrical portion 63c, the ball 63b is receded and pushed into the cylindrical portion 63c. Thus, the aforementioned pair of upper and lower ball plungers 63, 63 are braced against the surfaces 170a, 170a of the bracket 170 by the urging force of the springs 63a, 63a via the balls 63b, 63b so as to rotate in a clockwise and counter-clockwise direction about lateral axis D, which is a shaft core of the support shaft 66. Therefore, when the cam follower 29 moves in the cam groove 30, and thus the lever 31 is oscillated about a central axis of the support shaft (i.e. lateral axis D) in the clockwise or counter-clockwise direction, surface 170a of the bracket 170 is pressed via either the upper or lower ball plunger 63 of the lever 31, and the support shaft 66 can be rotated together with the lever 31 via the bracket 170 about the central axis of the support shaft (i.e. lateral axis D) in the clockwise or counter-clockwise direction. At this time, as described later, the reverse-supply head 25 performs rotation for a reversing or re-reversing operation in response to rotation of the support shaft 66. In order to make the reversing or re-reversing operation reliable, the reverse-supply head 25 is rotated, for example, one more degree than a required rotational angle and a position of the reverse-supply head 25 is reliably regulated by a stopper described later. Meanwhile, this extra rotational amount (overhang amount), after position regulation, can be absorbed by receding the ball 63b of the ball plunger 63 into the cylindrical portion 63c against the urging force of the spring 63a so that an excessive force is not applied to the lever 31, support shaft 66, or the like.

As shown in FIG. 20, another end of the support shaft 66 is rotatably supported by a pair of bearings 158, 158 which interpose a groove 26g therebetween and are provided in the bracket 26. A large gear 150 which is positioned in the groove 26g and performs a reversing operation is fixed to a middle portion of the support shaft 66 between this pair of bearings 158, 158. Therefore, the large gear 150 can be rotated integrally with the support shaft 66 in the groove 26g. Reference numeral 160 is a spacer provided so that the large gear 150 is not brought into contact with the bracket 26.

Meanwhile, a small gear 151 engaged with the large gear 150, is rotatably disposed in the groove 26g of the bracket 26, rotatably supported by a pair of bearings 159 of the bracket 26, and fixed to a rotating shaft 162 whose central axis is lateral axis C. Therefore, the rotating shaft 162 to which the small gear 151 is fixed, and the support shaft 66 to which the large gear 150 is fixed, are disposed parallel to one another. The rotating shaft 162 is fixed to the reverse-supply head 25 at one end thereof. Therefore, when the large gear 150 is rotated integrally with the support shaft 66, the small gear 151, engaged with the large gear 150, is rotated integrally with the support shaft 162 in the groove 26g, and the reverse-supply head 25 is rotated together with the support shaft 162 for a reversing operation. Reference numeral 161 denotes a spacer provided so that the small gear 151 is not brought into contact with the reverse-supply head 25. Also, teeth of the large gear 150 and the small gear 151 are formed so that an amount of teeth of the large gear 150 and the small gear 151 are at a ratio of 2:1. Thus, with 90-degree rotation of the large gear 150, the small gear 151 rotates 180 degrees. As a result, the reverse-supply head 25, fixed to the small gear 151 and facing downwardly, is reversed to face upwardly. It is noted that, in FIG. 20, reference numeral 174 denotes a guide member which is provided in the reverse-supply head 25 and guides up and down movement of an activating shaft 175 as described later.

Figure 18:
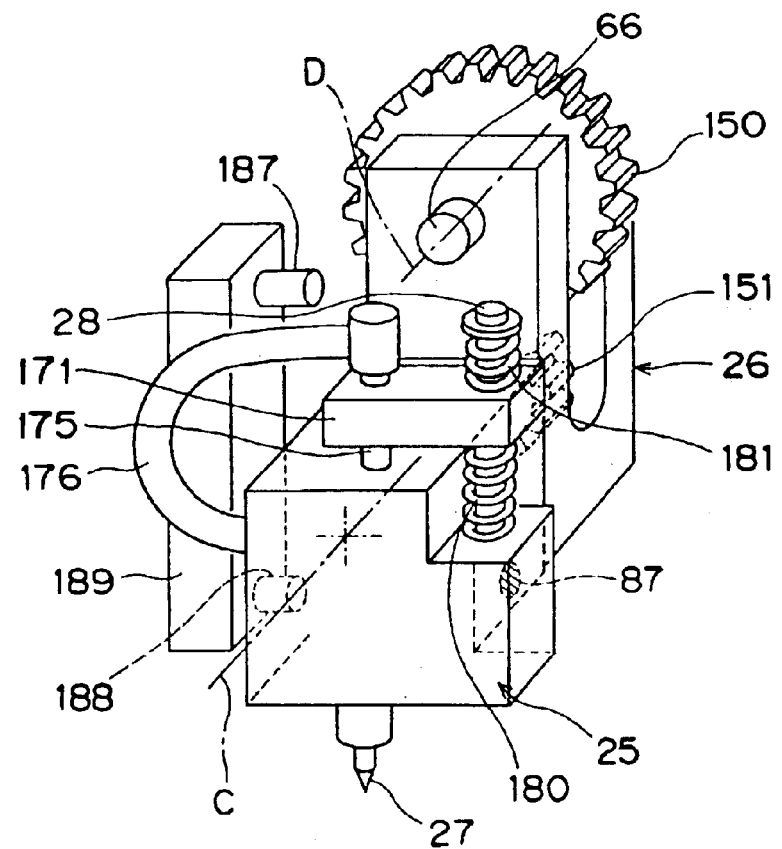
FIG. 18 is a partial perspective view of the reversing mechanism in the electronic component mounting apparatus of the first embodiment.

An original point position before reversing of the reverse-supply head 25, and a reversing position thereof, are respectively regulated by stoppers. That is, as shown in FIGS. 18 and 20, an auxiliary bracket 189, connected and fixed to the bracket 26, is provided with a lower stopper 188 and an upper stopper 187. When the reverse-supply head 25 is positioned at the original point position before reversing (re-reversing position), at sucking position a as shown in FIG. 18, the lower stopper 188 is brought into contact with a surface of a lower portion of the reverse-supply head 25 on the left side of FIG. 18 to regulate a position of the reverse-supply head 25. On the other hand, when the reverse-supply head 25 is positioned at the original point position after reversing (reversing position), at supply-side component delivering and receiving position c, the upper stopper 187 is brought into contact with a surface 87 of a lower portion of the reverse-supply head 25 on the right side of FIG. 18 to regulate a position of the reverse-supply head 25.

According to such a constitution, when the disk 24b of the component supply holder 24 is rotated about axis B in the counter-clockwise direction by a drive of the drive device 100 via the input shaft 101 and the first output shaft 105, the cam follower 29 is moved in the cam groove 30 of the main body 24a of the component supply holder 24. Since the support shaft 66 supported by the bracket 26, fixed to the disk 24b, cannot be moved in a horizontal direction with respect to the bracket 26, the lever 31 is oscillated, that is, is rotated in clockwise and counter-clockwise directions about a shaft core of the support shaft 66 (i.e. lateral axis D) along with movement of the cam follower 29.

Figure 7:
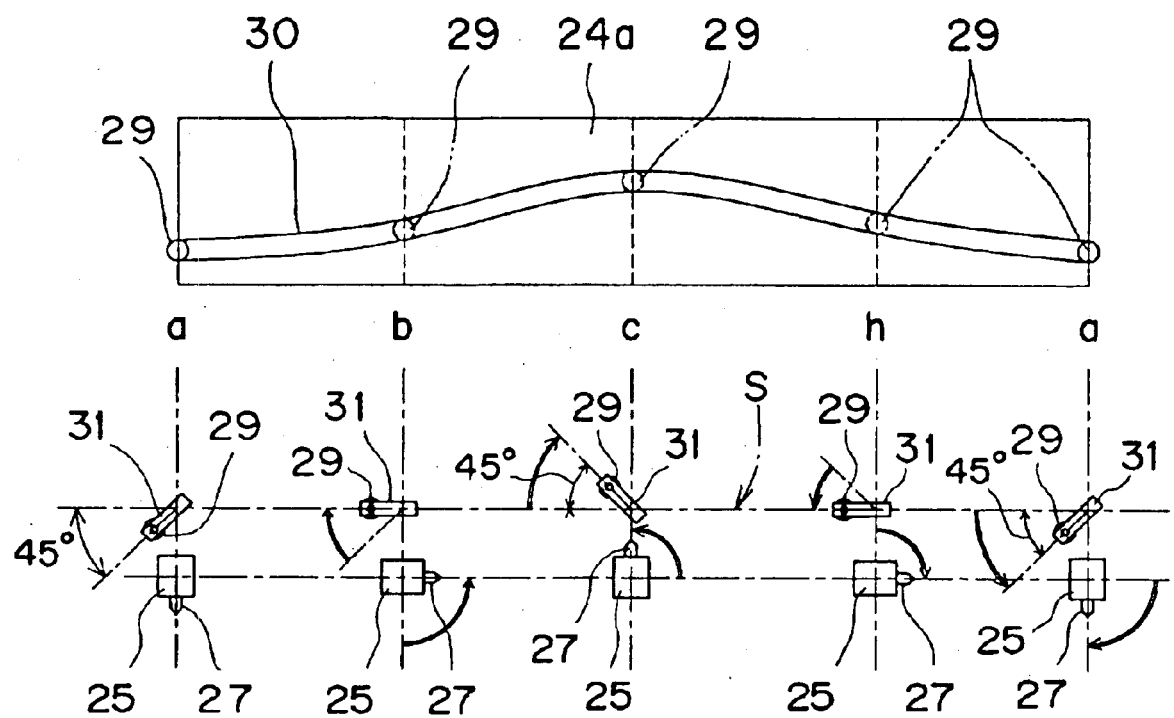
FIG. 7 is an explanatory view showing a relationship between a state in which a cam groove of the component supply holder is developed, and positions of a lever, cam follower, reverse-supply head, and supply-side suction nozzle at each of a sucking position, reversing position, supply-side component delivering and receiving position, re-reversing position, and sucking position in above electronic component mounting apparatus of the first embodiment.

This constitution is explained more specifically with reference to FIG. 7. FIG. 7 is an explanatory view showing a relationship between a state that the cam groove 30 is developed, and positions of the lever 31, cam follower 29, and reverse-supply head 25 at each of positions at which the reverse-supply head 25 is positioned each time the reverse supply head rotationally moves 90 degrees about axis B, that is, sucking position a, reversing position b, supply-side component delivering and receiving position c, re-reversing position h, and sucking position a. In the following example, by moving the cam follower 29 in the cam groove 30, the lever 31 is oscillated or rotated only within a range of 45 degrees, upwardly and downwardly with respect to a surface perpendicular to axis B, that is, a reference plane S including lateral axis D (within a range of position I to position II of the lever 31 in FIG. 19). A center of oscillation or rotation of the lever 31 is the shaft core of the support shaft 66 (lateral axis D) as described above. Thus, when the lever 31 is rotated within a range of 45 degrees, up or down with respect to the reference plane S, the reverse-supply head 25 is rotated 180 degrees by the small gear 151, along with 90-degree rotation of the large gear 150, by the lever 31 since the amount of teeth of the large gear 150 and the small gear 151 are at the ratio of 2:1. Therefore, reversing and re-reversing operations can be performed as described below.

First, at sucking position a, the lever 31 is positioned such that it tilts downwardly 45 degrees with respect to reference plane S. In this state, the supply-side suction nozzle 27 of the reverse-supply head 25 is positioned facing downwardly.

Subsequently, at reversing position b, the lever 31 is rotated from sucking position a in a clockwise direction and positioned such that it is level with reference plane S. As a result of such rotation of the lever 31, the reverse-supply head 25 is rotated 90 degrees in a counter-clockwise direction via the support shaft 66 connected to the lever 31, large gear 150, small gear 151, and rotating shaft 162 for a reversing operation, and then the supply-side suction nozzle 27 is positioned facing laterally (facing right in FIG. 7) during a middle stage of the reversing operation.

Subsequently, at supply-side component delivering and receiving position c, the lever 31 is further rotated from reversing position b in the clockwise direction, and then is positioned such that it tilts 45 degrees upwardly with respect to reference plane S. As a result of such further rotation of the lever 31, via the support shaft 66 connected to the lever 31, large gear 150, small gear 151, and rotating shaft 162, the reverse-supply head 25 is rotated 90 degrees in the counter-clockwise direction for a reversing operation, and then the supply-side suction nozzle 27 is positioned facing upwardly. The reversing operation is completed when the reverse-supply head 25 is positioned at supply-side component delivering and receiving position c. As a result, since the supply-side suction nozzle 27 is positioned facing upwardly at supply-side component delivering and receiving position c, component 19 that is sucked and held by the supply-side suction nozzle 27 can be sucked and held by the mounting-side suction nozzle 40.

Subsequently, at re-reversing position h, the lever 31 is rotated from supply-side component delivering and receiving position c in the counter-clockwise direction, which is reverse to the clockwise direction, and then positioned such that it is level with reference plane S. As a result of such rotation of the lever 31, the reverse-supply head 25 is rotated 90 degrees in the clockwise direction, via the support shaft 66 connected to the lever 31, large gear 150, small gear 151, and rotating shaft 162 so as to return to its original state from the reversed state, and then, the supply-side suction nozzle 27 is positioned facing laterally (facing right in FIG. 7).

Subsequently, at sucking position a, the lever 31 is further rotated in the counter-clockwise direction from the re-reversing position h, and is then positioned such that it tilts 45 degrees downwardly with respect to reference plane S. As a result of such further rotation of the lever 31, the reverse-supply head 25 is rotated 90 degrees in the counter-clockwise direction via the support shaft 66 connected to the lever 31, large gear 150, small gear 151, and rotating shaft 162 so as to perform a reversing operation, and then, the supply-side suction nozzle 27 is positioned facing downwardly. When the reverse-supply head 25 is positioned at sucking position a, the reversing operation is completely returned to an original state. As a result, since the supply-side suction nozzle 27 is positioned facing downwardly at sucking position a, a component 19 can be sucked and held by the supply-side suction nozzle 27.

Thus, during the re-reversing operation of the reverse-supply head 25, the reverse-supply head 25 is rotated, the supply-side suction nozzle 27 faces downwardly, the reverse-supply head 25 is brought into contact with the lower stopper 188 and a position thereof is regulated. Then, when the lever 31 is further rotated, the lower ball plunger 63 of the lever 31 is brought into contact with the lower opposed surface 170a of the bracket 170 and the ball 63b of the lower ball plunger 63 is receded. Thus, an overhang amount can be relieved by a recession amount of the ball 63b. On the other hand, during the reversing operation of the reverse-supply head 25, the reverse-supply head 25 is rotated, the supply-side suction nozzle 27 faces upwardly, the reverse-supply head 25 is brought into contact with the upper stopper 187 and a position thereof is regulated. Then, when the lever 31 is further rotated, the upper ball plunger 63 of the lever 31 is brought into contact with the upper opposed surface 170a of the bracket 170 and the ball 63b of the upper ball plunger 63 is receded. Thus, an overhang amount can be relieved by a recession amount of the ball 63b.

Figure 21:
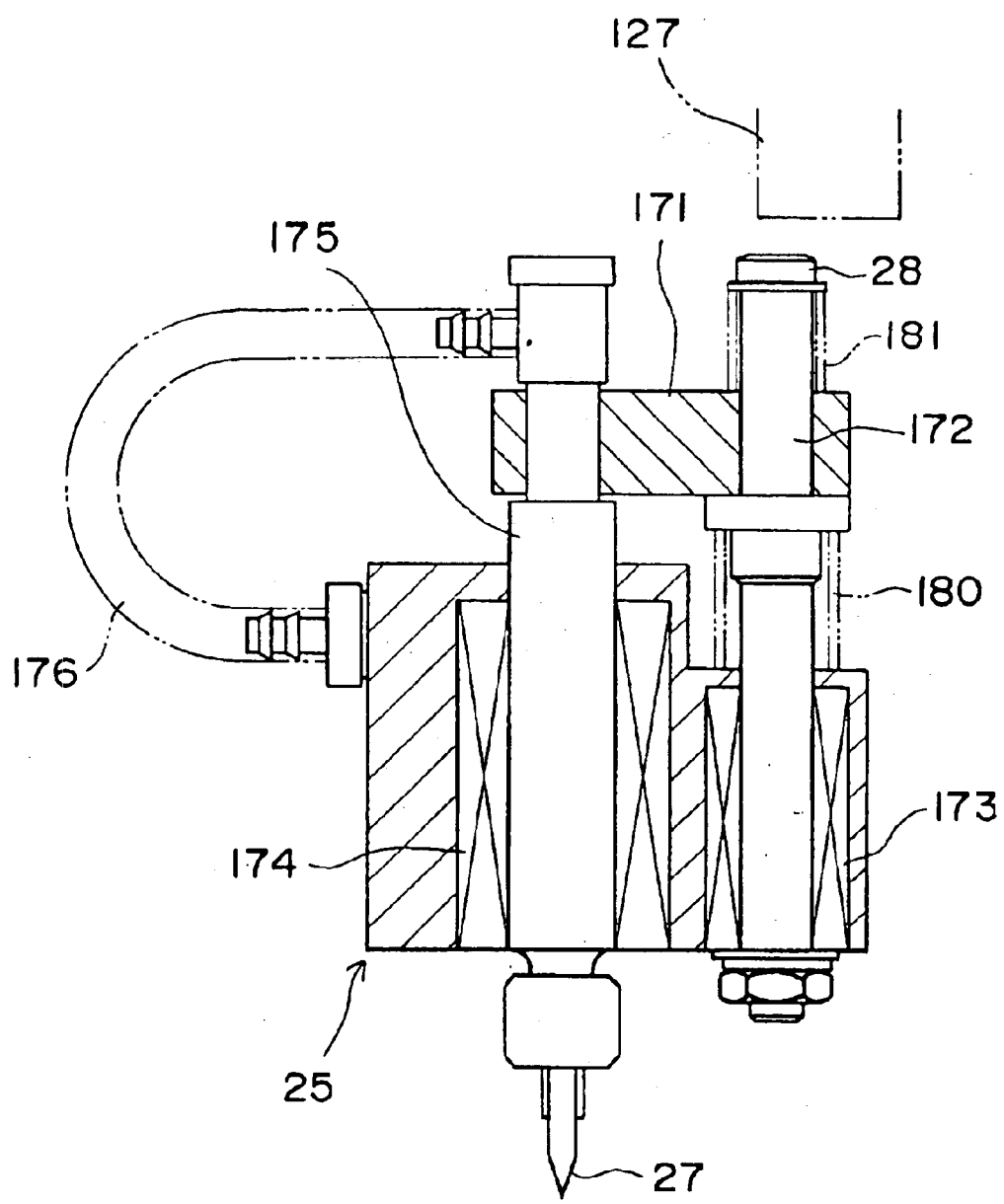
FIG. 21 is an explanatory view showing a guide mechanism for guiding a fall of a supply-side suction nozzle in the electronic component mounting apparatus of the first embodiment.

Also, FIG. 21 shows a guide mechanism for guiding a fall of the supply-side suction nozzle 27 at sucking position a. In FIG. 21, reference numeral 127 denotes a drive shaft of an external pressing device. Reference numeral 181 denotes a spring for an escape upon pressing by the external pressing device. Reference numeral 180 denotes a spring for canceling a self-weight. Reference numeral 175 denotes an activating shaft to which the supply-side suction nozzle 27 is attached at a lower end thereof. Reference numeral 172 denotes a drive shaft having a portion 28 which receives pressure from the drive shaft 127 of the external pressing device at an upper end thereof. Reference numeral 171 denotes a connecting member for connecting the drive shaft 172 and the activating shaft 175. Reference numeral 173 denotes a guide member, which is provided within the reverse-supply head 25 and guides the drive shaft 172 up and down. Reference numeral 174 denotes a guide member which is provided within the reverse-supply head 25 and guides the activating shaft 175 up and down. Reference numeral 176 denotes a vacuum suction pipe for allowing the supply-side suction nozzle 27 to perform a sucking operation. The spring 181 for an escape upon pressing serves so as not to apply an overload to a nozzle side by compressing to absorb a pressing force when the portion 28 is pressed by the drive shaft 127 of the external pressing device, and the nozzle side cannot be moved downwardly. The spring 180 for canceling a self-weight urges the reverse-supply head 25 to directly lift the connecting member 171 with an urging force sufficient to cancel a total weight of the nozzle side; that is, a total weight of the supply-side suction nozzle 27, activating shaft 175, connecting member 171, and so forth. By this spring 180 for canceling a self-weight, the supply-side suction nozzle 27 can be moved up and down smoothly only a prescribed amount without considering the self-weight.

Therefore, according to such a constitution, when an upper end of the drive shaft 172 is pressed downwardly by the drive shaft 127 of the external pressing device, the drive shaft 172 is lowered while guided by the guide member 173, at the same time, the activating shaft 175, connected to the drive shaft 172 via the connecting member 171, is lowered while guided by the guide member 174, and the supply-side suction nozzle 27 is lowered so that a component can be sucked.

Figure 23:
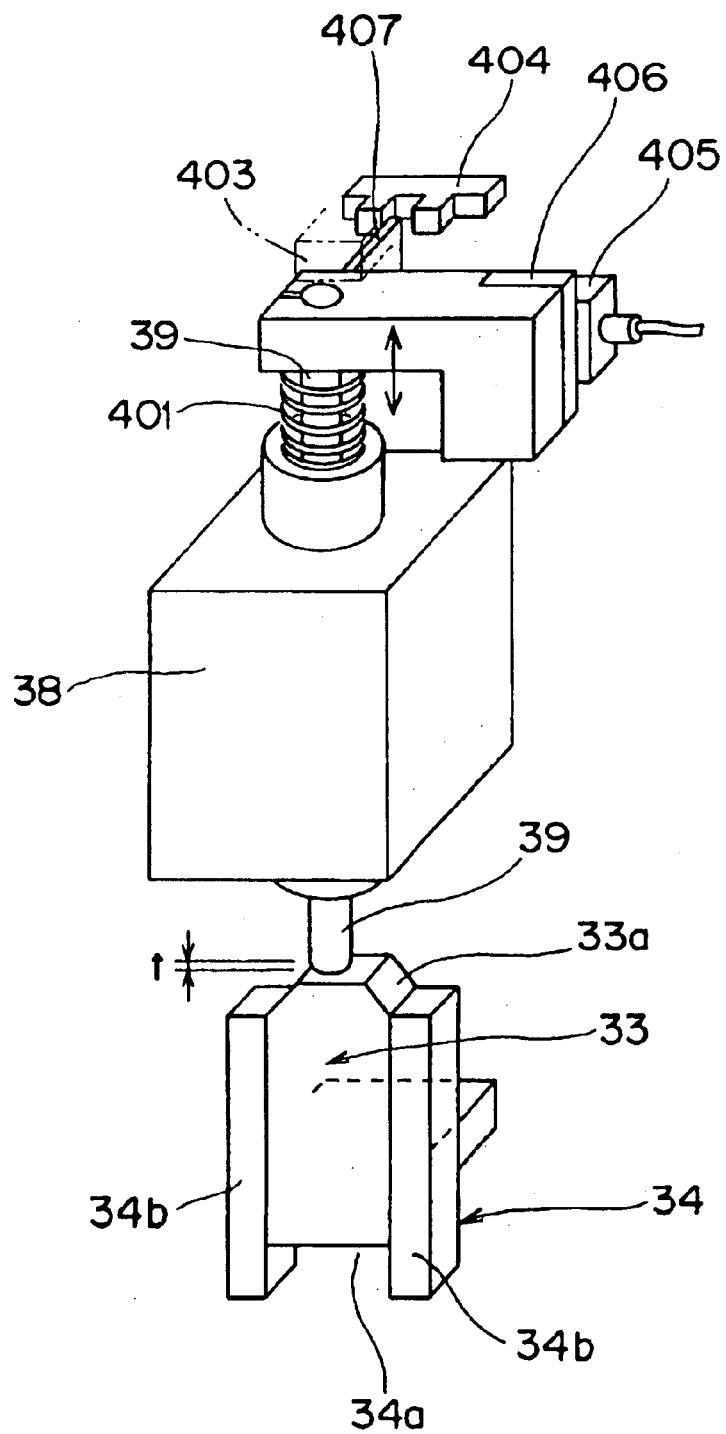
FIG. 23 is an explanatory view showing a drive mechanism for causing the vertical movement of the mounting-side suction nozzle in the electronic component mounting apparatus of the first embodiment.
Figure 24:
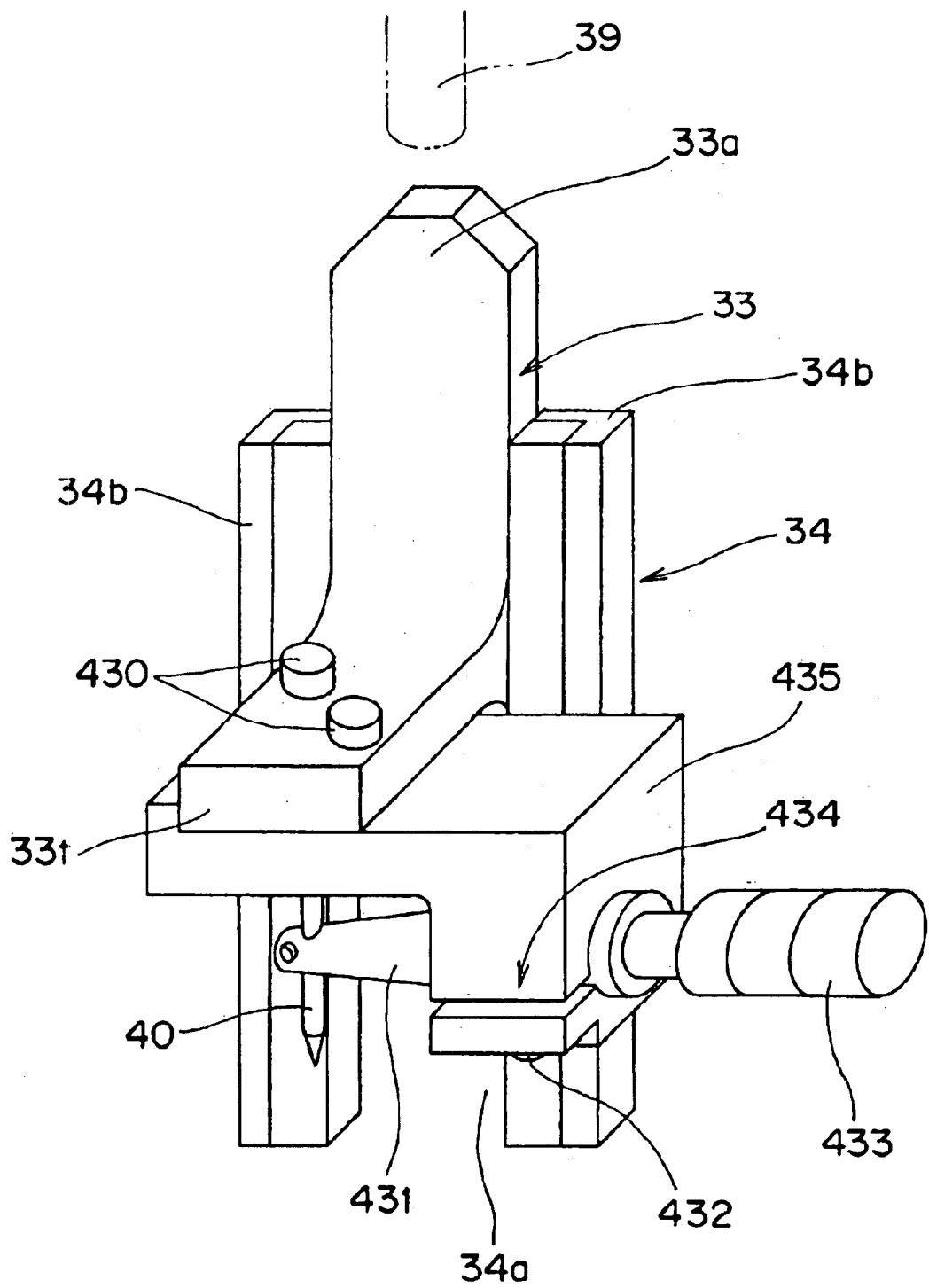
FIG. 24 is an explanatory view for explaining an ultrasonic wave applying device in an electronic component mounting apparatus of another embodiment of the present invention when ultrasonic waves are applied to a mounting-side suction nozzle for ultrasonic bonding.

On the other hand, as shown in FIG. 22, a cam surface 37 is formed on a lower surface of a flange projected from a lower portion of the pillar-like or cylindrical component mounting holder main body 32a of the component mounting holder 32. Main body 33d of each mounting head 33, fixed to the disk 32b of the component mounting holder 32, is supported by a bent plate-like slider 34 having an L-shaped cross section so that the holder 32 can be moved up and down. Specifically, as shown in FIGS. 23 and 24, the main body 33d of each mounting head 33 is inserted so as to penetrate through opening portion 34a at a center of the slider 34 so that the main body 33d can be moved up and down. Both sides of the main body 33d are slidably supported by sliding portions 34b, 34b of the slider 34 in up-and-down directions. A cam follower 35, which is constituted by a rollably supported roller and brought into contact with cam surface 37, is disposed on an upper portion of an inside protrusion 33p projected inwardly of the main body 33d. A spring 36 is disposed between a lower portion of the inside protrusion 33p and the slider 34 so that the cam follower 35 is always in contact with the cam surface 37 via an urging force of the spring 36 via the protrusion 33p. Thus, each mounting head 33 can be moved up and down along the cam surface 37 with respect to the slider 34 fixed to the disk 32b of the component mounting holder 32. An outside protrusion 33t projected outwardly from the main body 33d of each mounting head 33 is provided with a mounting-side suction nozzle 40 facing downwardly.

By pressing an upper end protrusion 33a of the main body 33d of each mounting head 33 by the drive shaft 127 or the drive shaft 226 via the cam mechanism or the AC servo mechanism described above with reference to FIGS. 11 and 14, each mounting head 33, as well as the mounting-side suction nozzle 40, can be lowered to a height at which a component can be received at mounting-side component delivering and receiving position d.

On the other hand, each mounting head 33 is pressed by a drive shaft 39 of a linear motor 38 as shown in FIGS. 23 and 24 at mounting position f. That is, in FIGS. 23 and 24, reference numeral 401 denotes a spring for preventing a drop, which spring always exerts an upwardly directed force to prevent a drop of the drive shaft 39 when power of the linear motor 38 is turned off. Reference numeral 403 denotes a stopper by which a position of the drive shaft 39, urged by the spring 401 for preventing a drop, is regulated at an upper end position thereof. Reference numeral 404 denotes a micro-photosensor for detecting that a projected piece 407 fixed to an upper end of the drive shaft 39 is positioned at an upper end position thereof. When the micro-photosensor 404 detects that the drive shaft 39 is raised to an upper end position, and the projected piece 407 fixed to the upper end of the drive shaft 39 is positioned at the upper end position, it is indicated that the drive shaft 39 is positioned at the upper end position; that is, a lower end of the drive shaft 39 is a dimension t away from the upper end protrusion 33a of the mounting head 33. This shows that the mounting head 33 of a control unit 1000 can be rotated on a basis of detection signals of this micro-photosensor 404. Reference numeral 406 denotes a linear scale. Reference numeral 405 is a sensor for detecting a movement amount of the drive shaft 39 by detecting the linear scale 406. A drive of the linear motor 38 is controlled by the control unit 1000 on a basis of signals from this sensor 405. As an example of a linear motor 38, a voice coil motor or the like, which can easily control mounting loads by drive shaft 39, can be used.

According to such a constitution, when the disk 32b of the mounting holder 32 is rotated about shaft E in a counter-clockwise direction by a drive of the drive device 100 via an input shaft 101 and a second output shaft 110, the cam follower 35 is moved along the cam surface 37 of the main body 32a of the mounting holder 32. Therefore, the mounting head 33 fixed to the disk 32b is moved successively through mounting-side component delivering and receiving position d, recognizing position e, mounting position f, and defective disposing position g.

Figure 8:
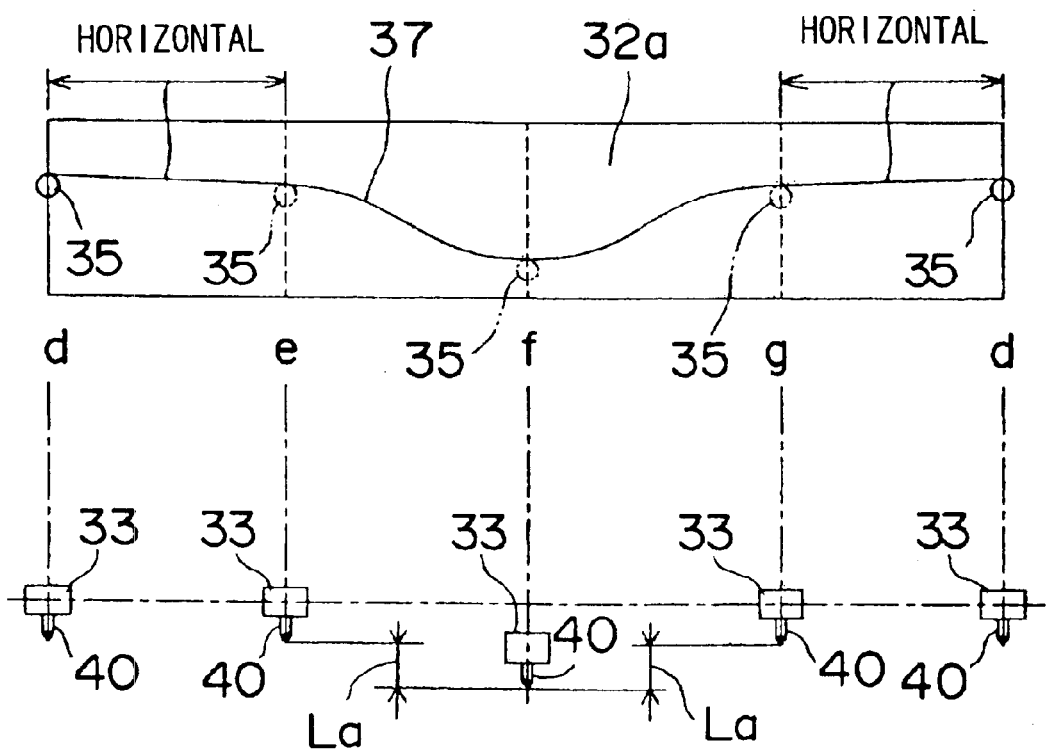
FIG. 8 is an explanatory view showing a relationship between a state in which a cam surface of the component mounting holder is developed, and positions of a mounting head, and a mounting-side suction nozzle at each of a mounting-side component delivering and receiving position, component recognizing position, mounting position, defective disposing position, and mounting-side component delivering and receiving position in the electronic component mounting apparatus of the first embodiment.
Figure 9:
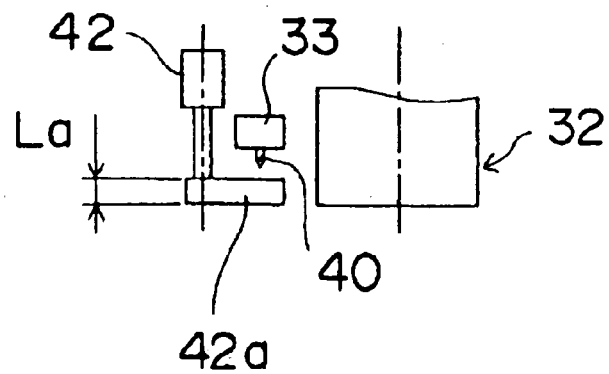
FIG. 9 is an explanatory view showing a positional relationship of a mounting-side suction nozzle of the mounting head and a recognition camera in the electronic component mounting apparatus of the first embodiment.

This constitution is explained more specifically with reference to FIGS. 8 and 9. FIG. 8 is an explanatory view showing a relationship between a state in which the cam surface 37 is developed and positions of the cam surface 37, cam follower 35, and mounting head 33 at respective positions when the mounting head 33 is rotated 90 degrees about axis E; that is, at mounting-side component delivering and receiving position d, recognizing position e, mounting position f, defective disposing position g, and mounting-side component delivering and receiving position d. As shown in these figures, in regions before and after mounting position f, the mounting head 33 is lowered to the board side and positioned at a lowest end position in advance, and a lowering distance at a time of mounting is reduced. Thus, mounting process time can be shortened. On the other hand, in other regions; that is, a region from mounting-side component delivering and receiving position d to recognizing position e, and a region from defective disposing position g to mounting-side component delivering and receiving position d, as shown in FIG. 9, the mounting head 33 is positioned at a highest end position, which is a position raised by thickness La of an end recognition optical system 42a of the recognition camera 42. As a result, since the cam follower 35 is moved while in contact with the cam surface 37, the mounting head 33 connected to the cam follower 35 is positioned at the aforementioned highest end position in a range from defective disposing position g, mounting-side component delivering and receiving position d, then to recognizing position e. The mounting head 33 starts to be gradually lowered from recognizing position e towards mounting position f. The mounting head 33 is positioned at the lowest end position in a certain range before and after mounting position f. Then, the mounting head 33 starts to be gradually raised towards defective disposing position g, and is then positioned at the highest end position at defective disposing position g.

Operations of the electronic component mounting apparatus constituted as above are explained below.

First, the lifter 20 performs an up-and-down operation to draw out a jig plate 17 from the housing magazine 16 so that the jig plate 17 is positioned at a prescribed jig plate draw-out height.

Subsequently, the jig plate 17 set in the housing magazine 16, is clamped and drawn out from the housing magazine by the draw-out unit 21 and is then mounted on the component supply table 22.

Figure 3:
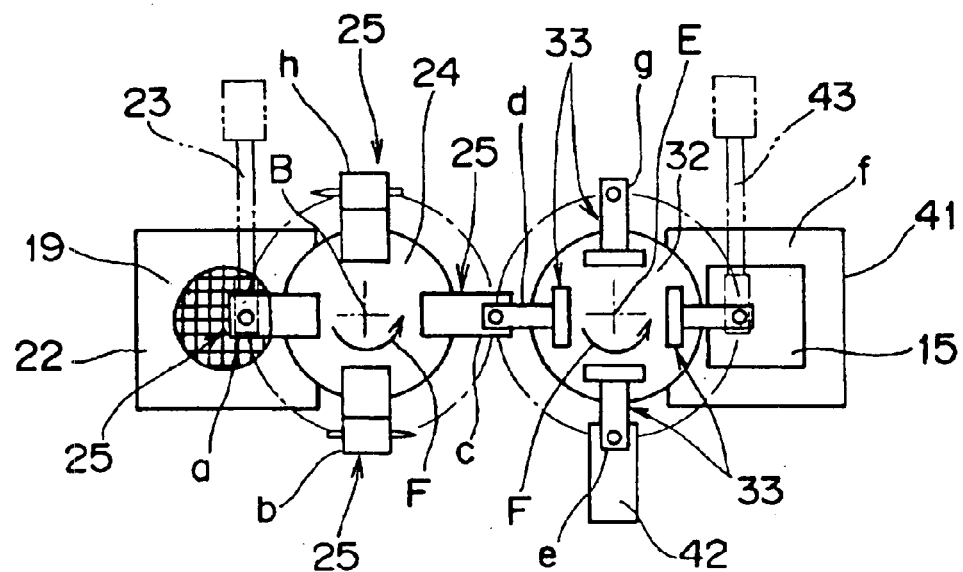
FIG. 3 is a schematic plan view showing a layout in a state that heads of the electronic component mounting apparatus of the first embodiment are positioned at respective stop positions.

Operations are explained below with reference to FIG. 3. FIG. 3 is a plan layout view showing arrangement of heads 25, 33. The component supply holder 24 and the component mounting holder 32 are intermittently rotated at an indexing angle of 90 degrees; that is, perform intermittent indexing rotation in synchronization about axis B and axis E, respectively, in a direction of arrows F in the figure (counter-clockwise) (Step S200 in FIG. 12).

Figure 4:
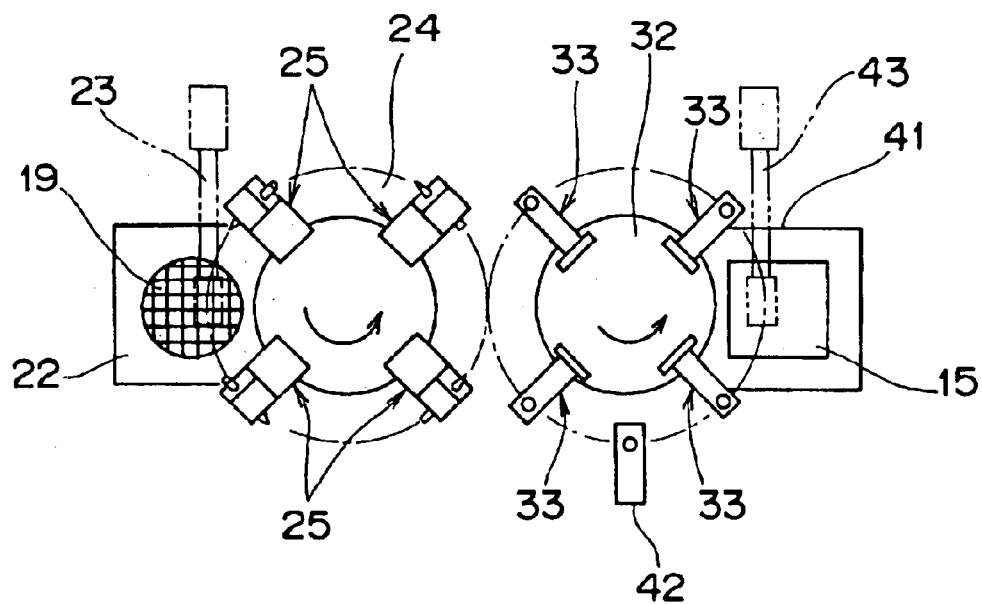
FIG. 4 is a schematic plan view showing a layout in a state that the heads of the electronic component mounting apparatus of the first embodiment are being rotated between the stop positions.

FIG. 4 shows a state during indexing rotation when the component supply holder 24 and the component mounting holder 32 are rotated in synchronization. Since the reverse-supply head 25 is not positioned at sucking position a in the state shown in this figure, a position of an electronic component 19 on the jig plate 17 on the component supply table 22, which is an IC chip in a wafer in this embodiment, can be confirmed by the recognition camera 23 disposed above electronic component-19-sucking position a without being disturbed by the reverse-supply head 25 (Step S201 in FIG. 12). Furthermore, since the mounting head 33 is not positioned at mounting position f during this indexing rotation, a position of a feature point for confirming a mounting position, which is written on a circuit board 15 on the component mounting table 41, can be confirmed; that is, a board recognizing operation is performed by the recognition camera 43 disposed above electronic component-19-mounting position f without being disturbed by the mounting head 33 (Step S202 in FIG. 12).

Subsequently, the component supply table 22 is moved by the reverse-supply head 25 on a basis of a position confirmation result so that the electronic component 19 can be picked up by the mounting head 33.

Figure 12:
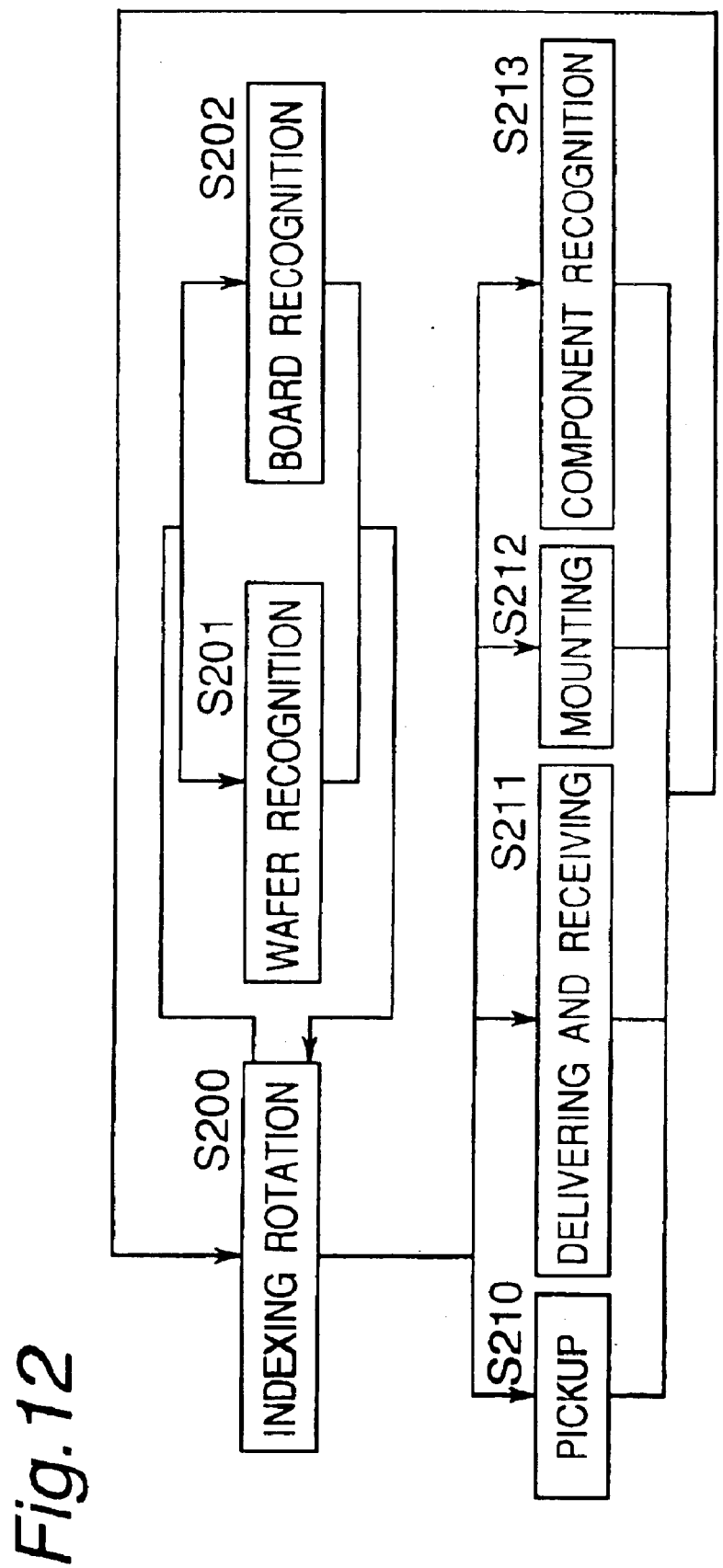
FIG. 12 shows a schematic flow of a series of operations in the electronic component mounting apparatus of the first embodiment.

Then, the reverse-supply head 25 performs a pickup operation of the electronic component 19 during a stop period after the indexing rotation is completed, in which the supply-side suction nozzle 27 of the reverse-supply head 25 positioned at sucking position a in FIG. 3 is lowered by the drive shaft 127 of the external pressing device, exemplified by the cam mechanism in FIG. 11, to suck the electronic component 19 (Step S210 in FIG. 12).

After this pickup operation, the component supply holder 24 and the component mounting holder 32 perform indexing rotation at an indexing angle of 90 degrees in synchronization so that the reverse-supply head 25, which was positioned at sucking position a is positioned at reversing position b, which is a next stop position. By the cam mechanism constituted by the cam groove 30 and the cam follower 29, the reverse-supply head 25 has been rotated 90 degrees about axis C in FIG. 2 with respect to sucking position a.

Furthermore, the component supply holder 24 and component mounting holder 32 perform indexing rotation at an indexing angle of 90 degrees in synchronization so that the reverse-supply head 25 is positioned at supply-side component delivering and receiving position c, which is a next stop position. The reverse-supply head 25 is rotated further 90 degrees by the cam mechanism and then the supply-side suction nozzle 27 thereof faces upwardly. In this state, a surface of the component 19, sucked and held by the supply-side suction nozzle 27, on which an electrically connecting portion is not formed faces upwardly. Furthermore, the mounting head 33 positioned at mounting-side component passing position d is lowered by a drive of the drive shaft 127 of the external drive device, and the surface, facing upwardly, of the electronic component 19 sucked and held by the supply-side suction nozzle 27 of the reverse-supply head 25 is picked up and received by the mounting-side suction nozzle 40 (Step S211 in FIG. 12). At this time, in the supply-side suction nozzle 27, an operation is switched from suction to blow under control of the control unit 1000 so that the sucked and held component 19 is reliably sucked by the mounting-side suction nozzle 40 from an end of the supply-side suction nozzle 27.

After this delivering and receiving operation, the supply-side suction nozzle 27 of the reverse-supply head 25 is positioned at supply-side component delivering and receiving position c, and is then moved to re-reversing position h by indexing rotation at an indexing angle of 90 degrees. At this time, the reverse-supply head 25 is rotated 90 degrees about axis C in FIG. 2 by the cam mechanism constituted by the cam groove 30 and the cam follower 29 with respect to supply-side component delivering and receiving position c in a direction reverse to a previous operation. Then, when moved from re-reversing position h to sucking position a by further performing indexing rotation at an indexing angle of 90 degrees, the supply-side suction nozzle 27 of the reverse-supply head 25 is rotated further 90 degrees by the cam mechanism and faces downwardly.

After the above delivering and receiving operation, when the mounting head 33 positioned at mounting-side component delivering and receiving position d is indexingly rotated to a next stop position, the mounting head is positioned at recognizing position e. At this time, a position of the electronic component 19 sucked and held by the mounting head 33 is recognized by the recognition camera 42 (Step S213 in FIG. 12). Upon this position recognition operation, if the electronic component 19 is recognized as defective, the electronic component 19 continues to be sucked and held by the mounting-side suction nozzle 40 until defective disposing position g while a mounting operation is not performed at mounting position f. Then, operation is switched from suction to blow at defective disposing position g so that the electronic component recognized as defective is dropped from an end of the mounting-side suction nozzle 40 and housed in a defective disposing box (not shown) or the like.

After the positional recognition operation, since the mounting head 33 is not positioned at mounting position f in a state during further indexing rotation at an indexing angle of 90 degrees shown in FIG. 4, a position of a feature point for confirming a mounting position, which is written on the circuit board 15 on the component mounting table 41, is confirmed by the recognition camera 43 positioned above mounting position f of electronic component 19 without being disturbed by the mounting head 33.

Subsequently, the component mounting table 41 is moved by the mounting head 33 of the control unit 1000 on a basis of a position confirmation result of the feature point so that the electronic component 19 can be mounted at a prescribed precise location. Then, after completion of indexing rotation (during a stop period), the mounting head 33 positioned at mounting position f in FIG. 3 is lowered by a push-in operation of a drive shaft 39 of the linear motor 38, and the electronic component 19 is mounted by the mounting head 33 (Step S212 in FIG. 12). Here, the mounting head 33 is lowered by the cam 37 by thickness G of the recognition camera 42 in advance while being moved from recognizing position e to mounting position f.

Then, while the electronic component 19 is pressed onto the circuit board 15 by the mounting-side suction nozzle 40, a mounting load is maintained at a prescribed level by controlling a drive current of the linear motor 38 via the control unit 1000. At this time, operation is switched from suction to blow, under control of the control unit 1000 in the mounting-side suction nozzle 40 so that the sucked and held component 19 can be reliably mounted onto the board 15 from the end of the mounting-side suction nozzle 40.

After being positioned at mounting position f, the mounting head 33 is moved from defective disposing position g to mounting-side component delivering and receiving position d by indexing rotation. Then, the mounting head 33 is raised by the cam 37 by thickness La of the recognition camera 42 while being moved from mounting position f to defective disposing position g.

FIG. 12 shows a schematic flow of the above-described series of operations. The operations are repeated in the order of arrows in FIG. 12. That is, as shown in FIG. 12, an indexing rotation operation of the component supply holder 24 and the component mounting holder 32 (Step S200 in FIG. 12), wafer recognizing operation (Step S201 in FIG. 12), and board recognizing operation (Step S202 in FIG. 12) can be simultaneously performed in parallel. Also, a take-out, i.e. pickup, operation of an electronic component 19 from the component supply table 22 (Step S210 in FIG. 12), delivering and receiving operation (Step S211 in FIG. 12), mounting operation (Step S212 in FIG. 12), and component recognizing operation (Step S213 in FIG. 12) can be simultaneously performed in parallel. Furthermore, a re-reversing operation and defective disposing operation can also be simultaneously performed in parallel with the pickup operation, delivering and receiving operation, and mounting operation.

Figure 27:
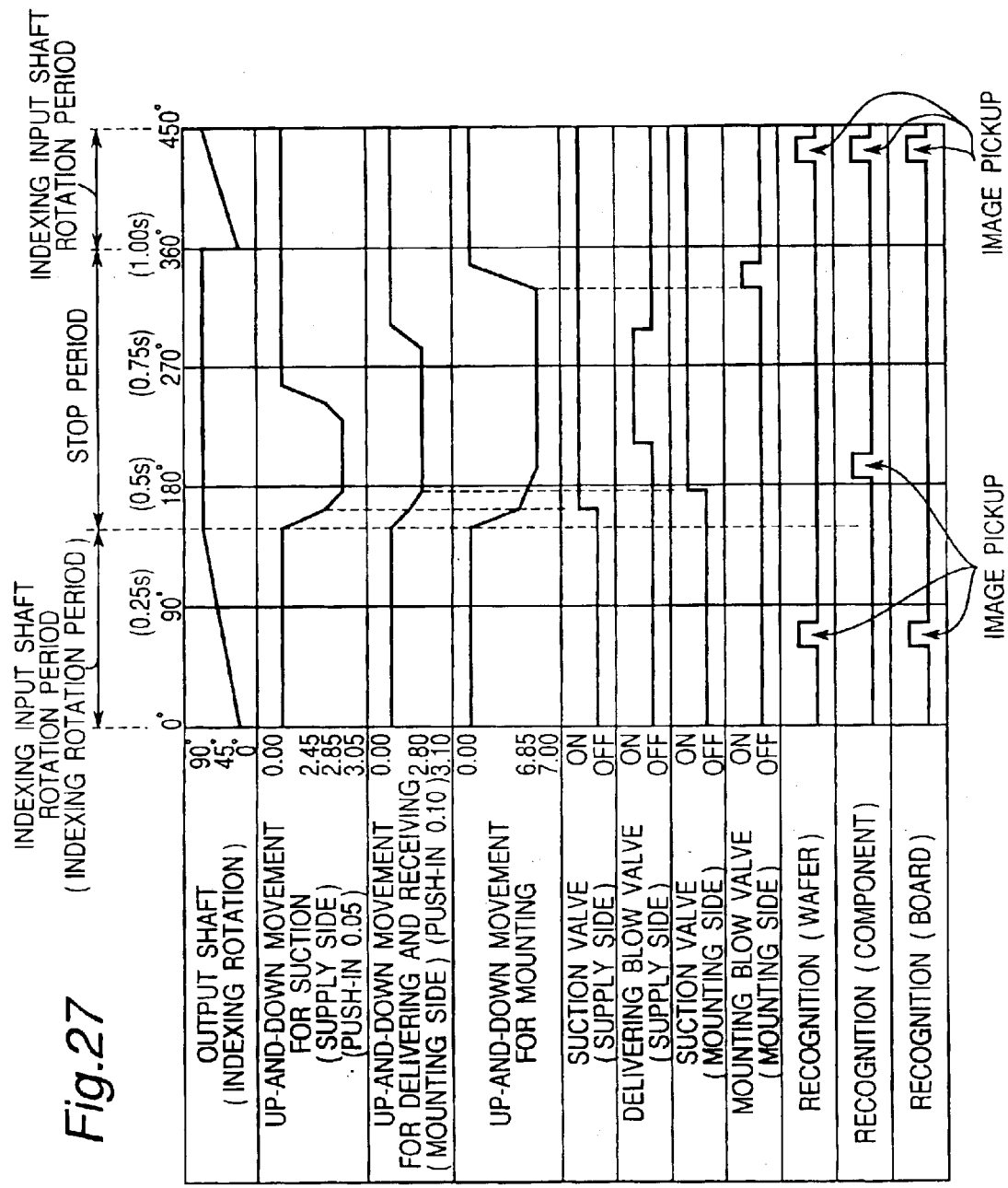
FIG. 27 is a time chart showing a relationship between phases of an input shaft and respective drive members or respective drive devices in the electronic component mounting apparatus of the first embodiment.

FIG. 27 is a time chart showing a relationship between rotational phases of the aforementioned input shaft 101 and respective drive members or respective drive devices. In this example, a rotational phase of the input shaft 101 from 0 degree to before 180 degrees indicates an indexing rotation period, and a phase therefrom to 360 degrees indicates a stop period. Then, a rotational phase from 360 degrees to before 540 degrees (it is noted that only phases up to 450 degrees are shown in this figure and that subsequent rotation phases are omitted) indicates an indexing rotation period. Here, a rotational phase proceeds from 0 degree to 360 degrees by one rotation of the input shaft 101. This indicates that each head and each nozzle of each holder are rotated from a position in a stop period to a next position after 90-degree rotation, and then stopped. This rotational phase proceeds from 360 degrees to 540 degrees by further one rotation of the input shaft 101. This indicates that each head and each nozzle of each holder are rotated from a position during stopping to a subsequent next position after 90-degree rotation, and then stopped. During each stop period, prescribed operations are appropriately performed at each of the aforementioned positions a, b, c, h, d, e, f, and g. That is, in FIG. 27, "up-and-down movement for suction (supply side)" indicates a timing when the supply-side suction nozzle 27 is moved up and down. Only during a stop period, operations of lowering from an upper end position to a lower end position, stopping at the lower end position (a component 19 is sucked during this time period), and rising from the lower end position to the upper end position are performed. During an indexing rotation period, the nozzle is stopped at the upper end position. Also, "up-and-down movement for receiving (mounting-side)" indicates a timing when the mounting-side suction nozzle 40 is moved, at mounting-side delivering and receiving position d, up and down. Only during a stop period, operations of lowering from an upper end position to a lower end position, stopping at the lower end position (a component 19 is delivered and received during this time period), and rising from the lower end position to the upper end position are performed. During an indexing rotation period, the nozzle is stopped at the upper end position. Furthermore, "up-and-down movement for mounting" indicates a timing when the mounting-side suction nozzle 40 is moved, at mounting position f, up and down. Only during a stop period, operations of lowering from an upper end position to a lower end position, stopping at the lower end position (a component 19 is mounted onto a board 15 during this time period), and rising from the lower end position to the upper end position are performed. During an indexing rotation period, the nozzle is stopped at the upper end position. Furthermore, "suction valve (supply side)" indicates a timing when the supply-side suction nozzle 27 performs a sucking operation. When a prescribed time period elapses after this stop, the sucking operation is started and continues to be performed during a next indexing rotation period. "Blow valve for delivering (supply side)" indicates a timing when the supply-side suction nozzle 27, positioned at supply-side delivering and receiving position c, performs a blow operation. When a prescribed time period elapses after this stop, the blow operation is started and stopped after a certain time period. "Suction valve (mounting-side)" indicates a timing when the mounting-side suction nozzle 40 performs a sucking operation. When a prescribed time period elapses after this stop, this sucking operation is started and stopped after a certain time period. "Suction blow valve (supply side)" performs a small amount of blowing for a short time to destroy a vacuum of the supply head when the component is delivered and received (passed) from the reverse-supply head to the mounting head.

Furthermore, "recognition (wafer)" indicates a timing when a position of a component 19 to be sucked next is recognized. This timing indicates when the supply-side suction nozzle 27 is moved away from sucking position a during indexing rotation, and that an image of the component 19 is picked up by the recognition camera 23 without being disturbed by the supply-side suction nozzle 27 when the component 19 is exposed immediately below an optical axis of the recognition camera. "Recognition (component)" indicates a timing when a position (attitude) of a component 19 is recognized when the component 19 sucked by the mounting-side suction nozzle 40 at mounting-side delivering and receiving position d is stopped at component recognizing position e. This timing indicates when an image of the position (attitude) of the sucked component 19 is picked up by the recognition camera 43, not during indexing rotation, but only during a stop period. "Recognition (board)" indicates a timing when a mounting position(s) of a board 15, to have components next mounted thereto, is recognized. This timing indicates when, during indexing rotation, the mounting-side suction nozzle 40 is moved away from mounting position f, and that an image of the mounting position is picked up by the recognition camera 43 without being disturbed by the mounting-side suction nozzle 40 when a mounting position of the board 15 is exposed immediately below an optical axis of the recognition camera.

FIG. 28 is a time chart different from the one in FIG. 27. A difference from the one in FIG. 27 is that in FIG. 28 it is indicated that the head is stopped for a moment so that each image can also be picked up during an indexing rotation from 0 degrees to before 180 degrees.

Figure 13:
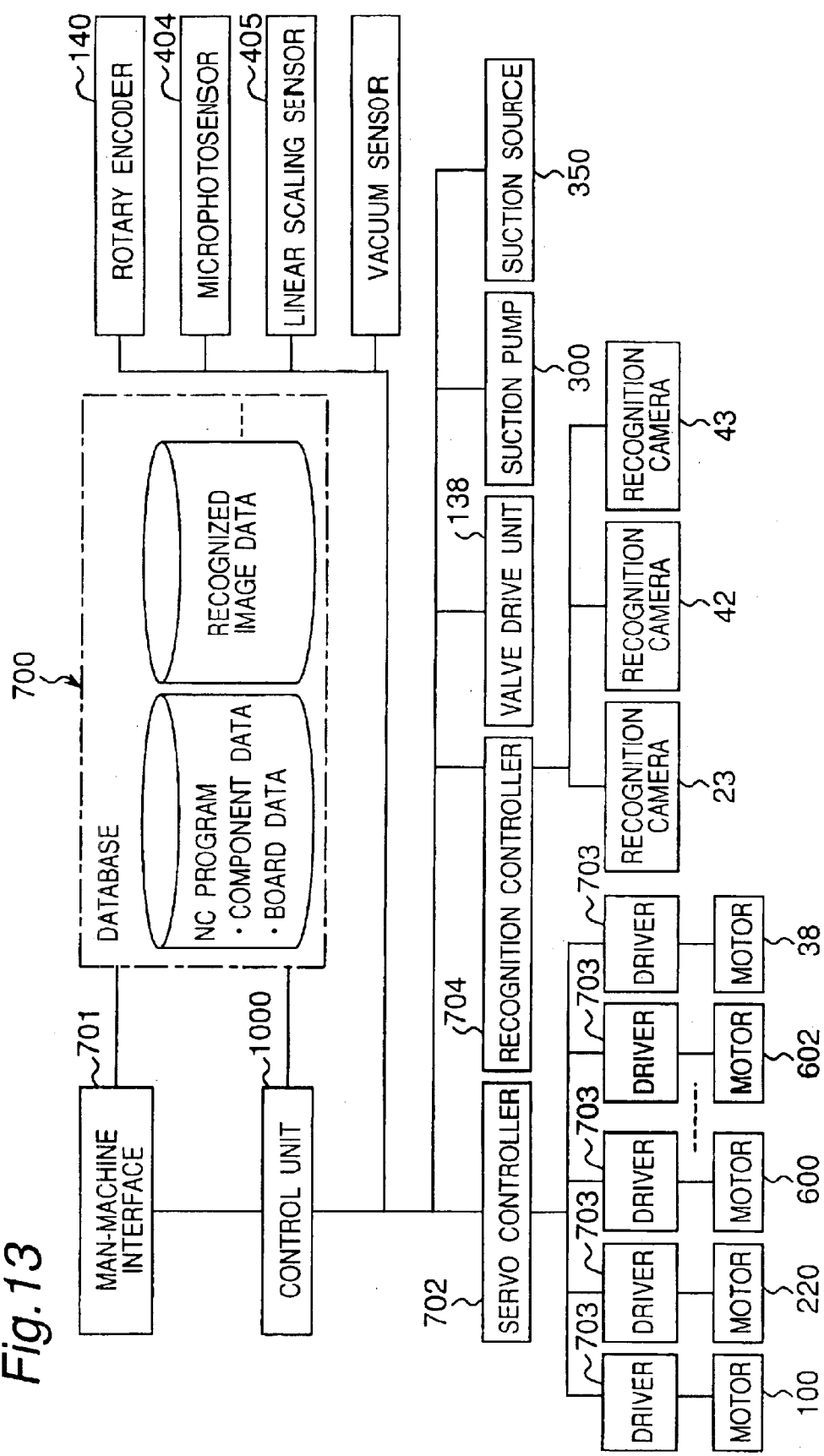
FIG. 13 is a block diagram showing a relationship between a control unit and respective drive devices in the electronic component mounting apparatus of the first embodiment.

FIG. 13 is a block diagram showing a relationship between a control unit and respective drive devices of the electronic component mounting apparatus of the first embodiment. A database 700 in which various data necessary for mounting, such as an NC program for mounting operations containing component data, board data, or the like; and recognition image data; and so forth are stored in advance, and various data written and stored as required is connected to the control unit 1000, which is a main controller, via a man-machine interface 701. These data are utilized for various controls. Operations of a driver 703 for respectively controlling motors such as the drive device 100, AC servomotor 220, drive devices 600, 602 for the component supply table, linear motor 38, and so forth are controlled by a servo controller 702. The servo controller 702 is connected to the control unit 1000 so that operations thereof are controlled. A recognition controller 704, controlling operations of the recognition cameras 23, 42, 43, is also connected to the control unit 1000 so that operations thereof are controlled. Besides these, a valve drive unit 138 for controlling drives of various valves such as suction valves, blow valves, and the like, a suction source 350 for allowing the suction nozzles to perform sucking operations, a suction pump 300 for sucking dust, and so forth are also connected to the control unit 1000 so that operations thereof are controlled. However, loads on the linear motor 38 are controlled by mounting loads on each component written in the NC program for mounting operations stored in the database 700.

As described above, according to this embodiment, the supply-side suction nozzle 27 is provided as an example of the supply-side component holding member which performs intermittent indexing rotational movement between component take-out position a (sucking position as an example in this embodiment) and supply-side component delivering and receiving position c so as to draw a circular track as an example of a closed track, removes the component from the component supply table 22 and holds the component when positioned at the component take-out position, reverses the held component 19 while being moved from the component take-out position to supply-side component delivering and receiving position c, and delivers this held and reversed component 19 when positioned at supply-side component delivering and receiving position c. There is also provided the mounting-side suction nozzle 40, which moves by intermittent indexing rotational movement in synchronization with the intermittent indexing rotational movement of the supply-side suction nozzle 27 so as to draw a circular track, different from the circular track of the supply-side suction nozzle 27, between mounting-side component delivering and receiving position d, which overlaps or is located in close proximity of supply-side component delivering and receiving position c, and component mounting position f, receives and holds the component 19 held by the supply-side suction nozzle 27 positioned at supply-side component delivering and receiving position c when positioned at mounting-side component delivering and receiving position d, and mounts the held component 19 onto board 15, which is an example of an object, when positioned at component mounting position f. There are provided a plurality of supply-side suction nozzles 27 or a plurality of mounting-side suction nozzles 40. Therefore, when component 19 is delivered and received between a supply-side suction nozzle 27 and a mounting-side suction nozzle 40, another suction nozzle 27 which is not performing this operation can remove another component from the component supply unit at component take-out position a and hold the component thereat. Meanwhile, a suction nozzle 40, which is not receiving a component from a suction nozzle 27, can mount a component 19 held by this mounting-side suction nozzle 40 onto the board 15 at component mounting position f. As a result, delivering and receiving of a component 19 can be simultaneously performed in parallel with removing or mounting of another component, and thus process time and production efficiency can be improved.

Furthermore, there are provided the component supply holder 24 performing indexing rotation, the reverse-supply head 25 which is attached to the periphery of the component supply holder 24 so as to perform an up-and-down reversing operation, which supply head has the supply-side suction nozzle 27, the component mounting holder 32 for performing indexing rotation, and the mounting head 33 which is attached to the periphery of the component mounting holder 32 so as to move up and down, which mounting head has the mounting-side suction nozzle 40. When a constitution is such that both the heads 25, 33 can simultaneously perform operations in parallel at respective stop positions, electronic components 19 can be picked up or mounted onto circuit board 15 in parallel at the same time while components are being delivered and received between a reverse-supply head 25 and a mounting head 33. Thus, mounting process time and production efficiency can be improved.

Furthermore, when a plurality of aforementioned supply-side suction nozzles 27 as well as a plurality of aforementioned mounting-side suction nozzles 40 are provided, three operations of delivering and receiving, removing, and mounting of the components 19 can be simultaneously performed in parallel. Thus, process time and production efficiency can be further improved. For example, a mounting process time per one electronic component was conventionally 2–3 seconds, but a mounting process time per one electronic component in accordance with this invention can be one second or shorter.

Furthermore, when there are provided equal numbers of the reverse-supply heads 25 and the mounting heads 33, and combinations of the reverse-supply heads 25 and the mounting heads 33 between which electronic components 19 are delivered and received are structurally determined, operations for adjusting central positions of the reverse-supply heads 25 and the mounting heads 33 to stably deliver and receive the electronic components 19 can be performed on a one to one basis. Thus, adjusting operations become easy.

Furthermore, since the component supply holder 24 and the component mounting holder 32 perform indexing rotation structurally in synchronization with each other by the same drive source, for example the drive device 100, there is no possibility that indexing rotation operations of these two holders are shifted in time from each other, and thus reliability of a delivering and receiving operation is improved.

Furthermore, when the component supply holder 24 and component mounting holder 32 are disposed in left and right directions with respect to an operator of the component mounting apparatus as viewed from a front of the apparatus, and the component supply holder and the component mounting holder are rotated in the same direction, components can be moved only on the operator side by both the component supply holder and the component mounting holder. Therefore, electronic components 19 are removed from the component supply table 22, passed on a front side of the component supply holder 24 and component mounting holder 32, and mounted onto circuit board 15. Therefore, the operator of the component mounting apparatus can visually confirm a flow of a series of operations of the components 19, and various adjusting and maintenance operations become easy.

Furthermore, when a load, for pressing component 19 onto circuit board 15 upon mounting the electronic component, is applied by the linear motor 38, the load for pressing can be easily made variable by controlling currents of the linear motor 38, and mounting is performed by an appropriate load depending on characteristics of the electronic component 19. Thus, quality of the electronic component 19 can be ensured.

Furthermore, since an up-and-down reversing operation of the reverse-supply head 25 is performed by the cam mechanism constituted by the cam groove 30 and the cam follower 29 as interlocked with the indexing rotation of the component supply holder 24, operations can become highly reliable.

Furthermore, since angle correction, about the central axis of the supply-side suction nozzle, between an electronic component 19 and the supply-side suction nozzle 27 upon picking up the electronic component, is performed by horizontal rotation of the electronic component supply table, the reverse-supply head 25 does not require a mechanism for horizontal rotation. Thus, the reverse-supply head 25 can be made smaller and lighter, thereby resulting in indexing rotation at a higher speed.

Furthermore, since the central axis for horizontal rotation of the component supply table 22 is always co-axial with the central axis of the supply-side suction nozzle 27, precision in horizontal rotation of the component supply table 22 does not affect precision in correction in the horizontal direction when an electronic component is picked up from the table 22 by the nozzle 27. Thus, component 19 can be picked up with high precision.

Furthermore, since angle correction about the central axis of the mounting-side suction nozzle, between an electronic component 19 and the mounting-side suction nozzle 40 upon mounting the electronic component, is performed by horizontal rotation of the electronic component mounting table, the mounting head 33 does not require a mechanism for horizontal rotation. Therefore, the mounting head 33 can be made smaller and lighter, thereby resulting in indexing rotation at a higher speed. For example, when the input shaft 101 is rotated 360 degrees in one second, the mounting process time per one electronic component can be made, for example, one second.

Furthermore, since a central axis of horizontal rotation of the component mounting table 41 is always co-axial with the central axis of the mounting-side suction nozzle 40, precision in horizontal rotation of the component mounting table 41 does not affect precision in correction in a horizontal direction when an electronic component is mounted by the nozzle 40 onto a board on the table 41. Thus, component 19 can be mounted with high precision. Unlike the conventional apparatus in FIG. 6, the mounting head 33, and therefore the component mounting holder 32, does not need to have a drive member for moving a suction nozzle up and down, and a drive member (linear motor 38) can be provided independently outside the component mounting holder 32 above mounting position f. Therefore, a total weight of the component mounting holder is reduced, thereby resulting in intermittent rotation at a higher speed.

It is noted that the present invention is not limited to the above embodiment, but can be applied in other various aspects.

For example, an ultrasonic horn may be provided to a mounting head as another embodiment of the present invention.

Figure 25:
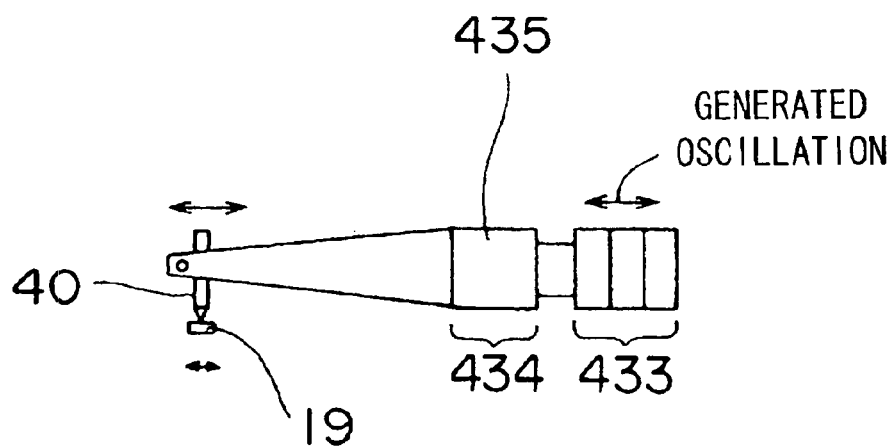
FIG. 25 is an explanatory view for explaining actions of the ultrasonic waves in the electronic component mounting apparatus shown in FIG. 24.
Figure 26:
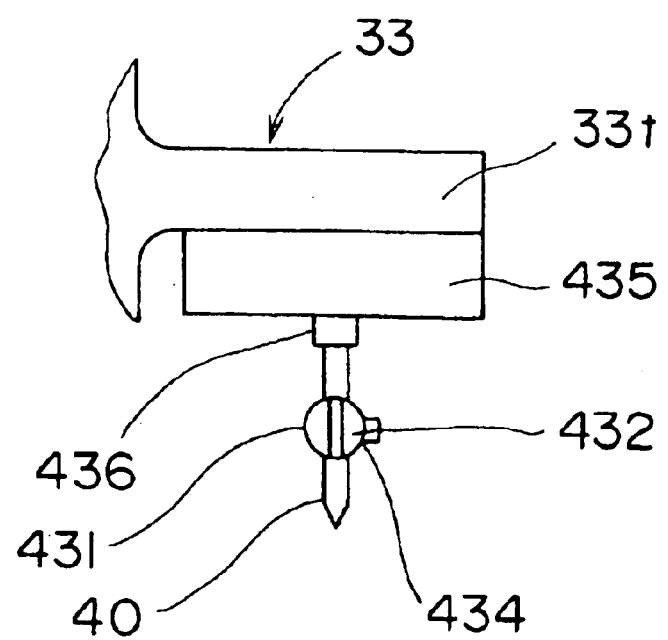
FIG. 26 is an explanatory view of a state in which an ultrasonic horn is attached to the mounting-side suction nozzle in the electronic component mounting apparatus of FIG. 24.

That is, FIGS. 24–26 show an embodiment in which ultrasonic waves can be applied to a mounting-side suction nozzle 40 for ultrasonic bonding when an electronic component 19 is mounted onto a board 15. In FIG. 24, reference numeral 433 denotes an oscillator for oscillating ultrasonic waves. Reference numeral 431 denotes an ultrasonic horn of the oscillator 433. Reference numeral 435 denotes a bracket fixed to a lower surface of an outside protrusion 33t of a mounting head 33 by using bolts 430, 430. Reference numeral 434 denotes a split-clamping portion of the bracket 435 for split-clamping a hold portion of the oscillator 433 by using a bolt 432. Therefore, when an electronic component 19 sucked and held by the mounting-side suction nozzle 40 is mounted onto a board 15, ultrasonic bonding can be performed by applying ultrasonic waves to the mounting-side suction nozzle 40 via the ultrasonic horn 431 of the oscillator 433.

A component mounting holder may have both a mounting head provided with the ultrasonic horn and a mounting head not provided with the ultrasonic horn.

Figures 29A, 29B:
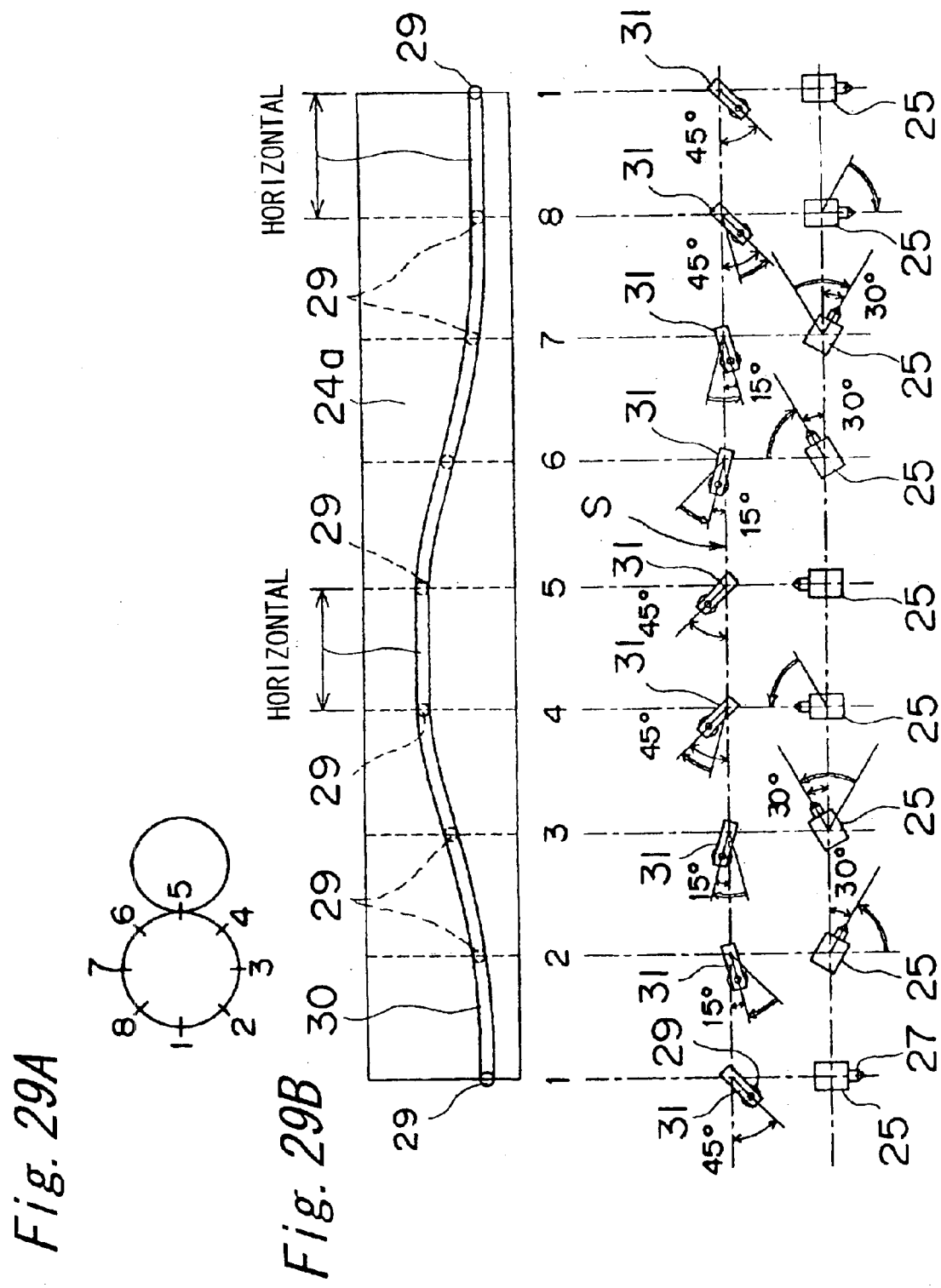
FIGS. 29A and 29B are, respectively: an explanatory view showing positions at which a reverse-supply head is positioned each time it is rotated 45 degrees about axis B; that is, at a sucking position, an intermediate position between the sucking position and a reversing position, the reversing position, an intermediate position between the reversing position and a delivering-and-receiving position, the delivering-and-receiving position, an intermediate position between the delivering-and-receiving position and a re-reversing position, the re-reversing position, an intermediate position between the re-reversing position and the sucking position, and the sucking position; and an explanatory view showing a state in which a cam groove is developed and a positional relationship of a lever, cam follower, and reverse-supply head at positions at which the reverse-supply head is positioned each time it is rotated 45 degrees about axis B; that is, a sucking position, an intermediate position between the sucking position and a reversing position, the reversing position, an intermediate position between the reversing position and a delivering-and-receiving position, the delivering-and-receiving position, an intermediate position between the delivering-and-receiving position and a re-reversing position, the re-reversing position, an intermediate position between the re-reversing position and the sucking position, and the sucking position in an electronic component mounting apparatus of another embodiment of the present invention.

Furthermore, when the reverse-supply head 25 is reversed in a range from sucking position to supply-side component delivering and receiving position c in the component supply holder 24, the present invention is not limited to the constitution in which this reversing operation is completed immediately before supply-side component delivering and receiving position. As yet another embodiment of the present invention, a reversing operation may be completed at a stage some distance before supply-side component delivering and receiving position c, and the reverse-supply head 25 may be positioned at supply-side component delivering and receiving position c in a state in which minute residual oscillation generated in the reverse-supply head 25 along with the reversing operation is sufficiently attenuated so that a delivering and receiving operation can be performed precisely and reliably. For example, FIGS. 29A and 29B are explanatory views showing a relationship between a state in which a cam groove 30 is developed, and positions of lever 31, cam follower 29, and reverse-supply head 25 at respective positions at which the reverse-supply head 25 is positioned each time rotationally moved 45 degrees about axis B, that is, sucking position a (see position 1 in FIGS. 29A and 29B), intermediate position 2 between sucking position a and reversing position b, reversing position b (see position 3 in FIGS. 29A and 29B), intermediate position 4 between reversing position b and supply-side component delivering and receiving position c, supply-side component delivering and receiving position c (see position 5 in FIGS. 29A and 29B), intermediate position 6 between supply-side component delivering and receiving position c and re-reversing position h, the re-reversing position h (see position 7 in FIGS. 29A and 29B), re-reversing intermediate position 8; and sucking position a (see position 1 in FIGS. 29A and 29B). In this yet another embodiment, by moving the cam follower 29 in the cam groove 30, the lever 31 can be rotatably oscillated only in a range of up to 45 degrees in an up-and-down direction with respect to a surface perpendicular to axis B; that is, a reference plane S including lateral axis D. A center of oscillating rotation of the lever 31 is the shaft core of the support shaft 66 (lateral axis D) as described above. In this yet another embodiment, reversing of the reverse-supply head 25 is completed at intermediate position 4. By forming the cam groove 30 horizontally between intermediate position 4 and supply-side component delivering and receiving position c (see position 5 in FIGS. 29A and 29B), a reversed state of the reverse-supply head 25 is maintained between intermediate position 4 and supply-side component delivering and receiving position c (see position 5 in FIGS. 29A and 29B). Reversing of the reverse-supply head 25 is also completed at re-reversing intermediate position 8 as well. By forming the cam groove 30 horizontally between re-reversing intermediate position 8 and sucking position a (see position 1 in FIGS. 29A and 29B), a reversed state of the reverse-supply head 25 is maintained between re-reversing intermediate position 8 and sucking position a (see position I in FIGS. 29A and 29B). Therefore, during these respective periods when the reversed state is maintained, minute residual oscillation generated in the reverse-supply head 25 along with a reversing or re-reversing operation can be sufficiently attenuated. When the reverse-supply head 25 is positioned at supply-side component delivering and receiving position c or sucking position a, a delivering operation or sucking operation can be performed precisely and reliably without being affected by minute residual oscillation.

Figure 30A:
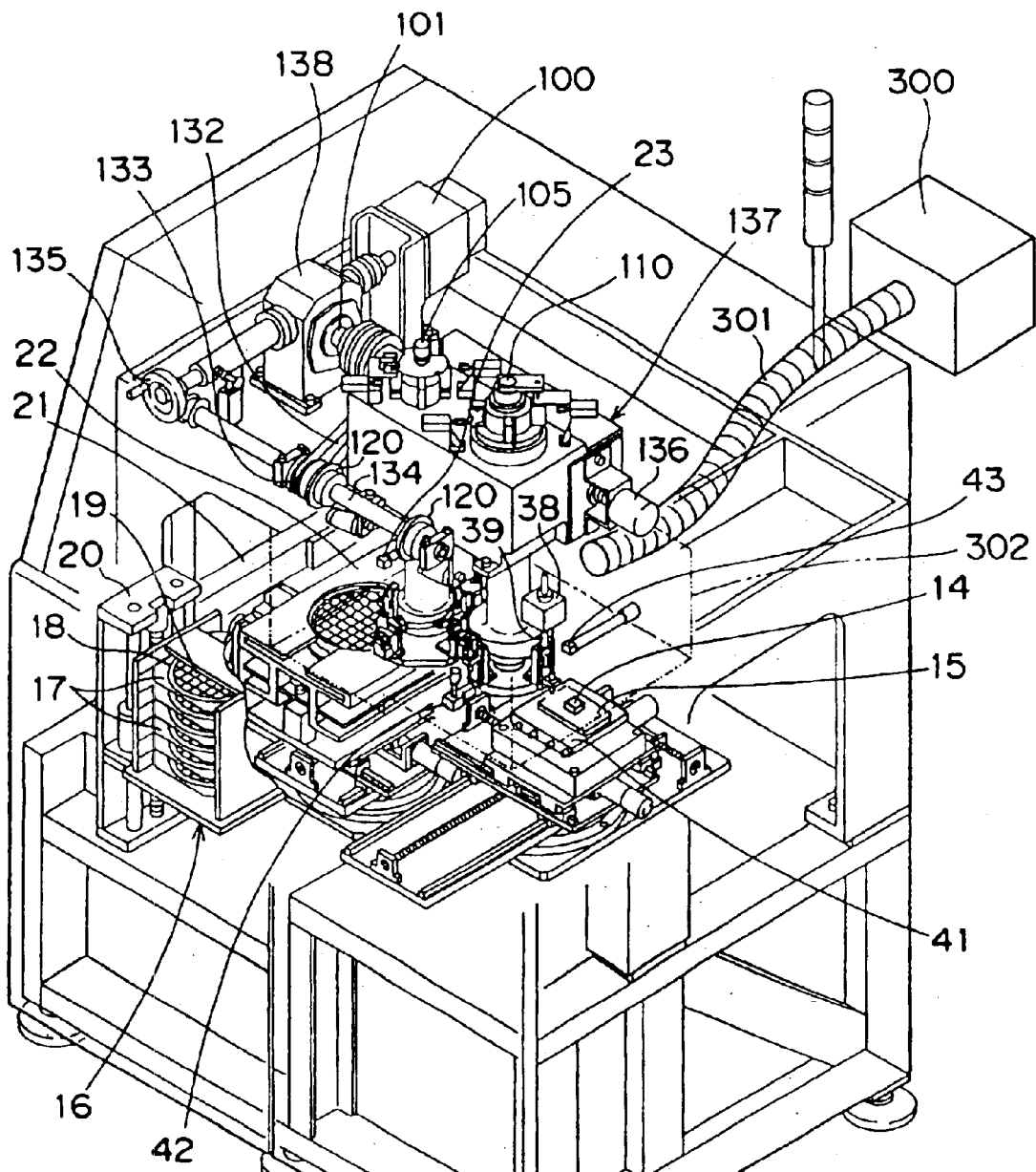
FIGS. 30A and 30B are respective perspective views showing an overall constitution of an electronic component mounting apparatus of yet another embodiment of the present invention.
Figure 30B:
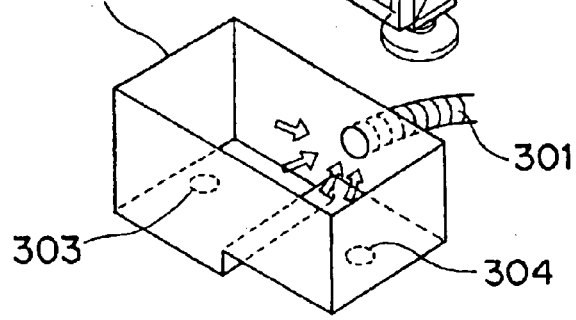

Furthermore, as yet another embodiment of the present invention, as shown in FIGS. 30A and 30B, in order to prevent dust, generated by rotation of component supply holder 24 and component mounting holder 32, from falling on a wafer or board 15, the component supply holder 24 and the component mounting holder 32, which are a twin rotary head, is covered with a box-like cover 302 and dust is sucked from a duct 301 by a suction pump 300 connected to a space in the cover 302. According to such a constitution, dust generated by rotation of the component supply holder 24 is sucked from an opening 303 of the cover 302, and dust generated by rotation of the component mounting holder 32 is sucked from an opening 304 of the cover 302.

Furthermore, since intermittent indexing rotations of the component supply holder and the component mounting holder are performed structurally in synchronization with each other by the cam and the cam follower, precision of intermittent operations can be improved. However, this intermittent rotation is not limited to such a mechanism, and, for example, a drive device, for example, an AC servomotor may be provided for each of the component supply holder and the component mounting holder, and both of the AC servomotors may be rotated in synchronization so that desired intermittent indexing rotation can be performed.

Furthermore, for example, when a gear is provided between the input shaft 101, for rotationally driving the component supply holder 24 and the component mounting holder 32, and the first output shaft 105 for rotationally driving the component supply holder 24, or a gear is provided between the input shaft 101 and the second output shaft 110 for rotationally driving the component mounting holder 32 so that the component supply holder 24 and the component mounting holder 32 have different rotational directions, forces acting on the input shaft 101 can be offset against each other. Thus, loads imposed on the input shaft 101 can be reduced.

Furthermore, when the optical axis of the recognition camera 23 is made coincident with the central axis of the supply-side suction nozzle 27 when the reverse-supply head 25 is positioned at sucking position a, an operation of recognizing a wafer, that is, an operation of recognizing an IC chip which is a component 19 to be sucked next, can be performed by the optical axis of the recognition camera 23 coincident with the central axis of the supply-side suction nozzle while the supply-side suction nozzle 27 is being rotated via rotation of the component supply holder 24. Thus, precision and process time can be improved.

Furthermore, without making the optical axis of the recognition camera 23 coincident with the central axis of the supply-side suction nozzle 27 at sucking position a, or without making the optical axis of the recognition camera 43 coincident with the central axis of the mounting-side suction nozzle 40 at mounting position f, the central axis of the nozzle is made coincident with the central axis of the drive shaft, for pressing of the pressing device for moving the nozzle up and down, or coincident with the central axis of the activating shaft so that the nozzle can be moved up and down directly by the drive shaft or the activating shaft. Thus, a nozzle pressing mechanism may be simplified.

Components may be supplied by a tape-like support member as a component supply unit for supplying components to the component supply holder.

Furthermore, a to-be-mounted object, onto which components are mounted by the component mounting holder, is not limited to one independent object, but components may be mounted on to-be-mounted objects supported by a tape-like support member, for example, boards sequentially connected in film form.

Furthermore, components may be supplied from a plurality of component supply units by providing a plurality of component supply holders.

Furthermore, there may be provided different numbers of reverse-supply heads and mounting heads. For example, eight reverse-supply heads and four mounting heads may be provided.

Furthermore, a plurality of component mounting positions may be provided in the component mounting holder so that components can be simultaneously mounted onto a plurality of boards.

Furthermore, mounting-side component delivering and receiving position d is disposed so as to overlap supply-side component delivering and receiving position c, but is not limited to this position. Mounting-side component delivering and receiving position d and supply-side component delivering and receiving position c may be located in close proximity of each other so that a component 19 sucked and held by supply-side suction nozzle 27 positioned at supply-side component delivering and receiving position c is sucked and held by mounting-side suction nozzle 40 positioned at mounting-side component delivering and receiving position d, and the component 19 is reliably passed from the nozzle 27 to the nozzle 40.

According to a first or second aspect of the present invention, there is provided a supply-side component holding member which performs intermittent rotational movement so as to draw a closed track between a component take-out position and a supply-side component delivering and receiving position, and removes a component from the component supply unit and holds the component when positioned at the component take-out position, reverses this held component while moved from the component take-out position to the supply-side component delivering and receiving position, and delivers this held and reversed component when positioned at the supply-side component delivering and receiving position. There is also provided a mounting-side component holding member which moves by intermittent indexing rotational movement in synchronization with the intermittent indexing rotational movement of the supply-side component holding member so as to draw a closed track, different from the closed track of the supply-side component holding member, between a mounting-side component delivering and receiving position, which overlaps or is located in close proximity of the supply-side component delivering and receiving position, and a component mounting position, receives a component held by the supply-side component holding member positioned at the supply-side component delivering and receiving position and holds this component when positioned at the mounting-side component delivering and receiving position, and mounts this held component onto an object when positioned at the component mounting position. There are provided a plurality of supply-side component holding members or a plurality of mounting-side component holding members. Therefore, when a component is delivered and received between one of the supply-side component holding members and one of the mounting-side component holding members, a component holding member which is not performing this operation can remove another component from a component supply unit at the component take-out position and hold this another component. Meanwhile, a component holding member which is not performing the aforementioned operation can mount a component held by this mounting-side component holding member onto a board at the component mounting position. As a result, delivering and receiving of a component can be simultaneously performed in parallel with removing or mounting of another component, and thus process time and production efficiency can be improved.

According to a third or fourth aspect of the present invention, there are provided a component supply holder for performing indexing rotation, a reverse-supply head which is attached to a periphery of the component supply holder so as to perform an up-and-down reversing operation and has a supply-side component holding member, a component mounting holder for performing indexing rotation, and a mounting head which is attached to a periphery of the component mounting holder so as to move up and down and has a mounting-side component holding member. When this constitution is such that both heads can simultaneously perform operations in parallel at respective stop positions, electronic components can be removed or mounted onto a circuit board in parallel at the same time while components are being delivered and received between the reverse-supply head and the mounting head. Thus, mounting process time and production efficiency can be improved.

Furthermore, when a plurality of aforementioned supply-side component holding members as well as a plurality of aforementioned mounting-side component holding members are provided, three operations of delivering and receiving, removing, and mounting of the components can be simultaneously performed in parallel. Thus, process time and production efficiency can be further improved. For example, a mounting process time per one electronic component was conventionally 2–3 seconds, but a mounting process time per one electronic component of this invention can be one second or shorter.

Furthermore, when there are provided equal numbers of reverse component holding members and mounting heads, and combinations of reverse-supply heads and the mounting heads between which electronic components are delivered and received are structurally determined, operations for adjusting central positions of the reverse-supply heads and the mounting heads to stably deliver and receive electronic components can be performed on a one to one basis. Thus, adjusting operations become easy.

Furthermore, when the component supply holder and the component mounting holder perform indexing rotation structurally in synchronization with each other by the same drive source, there is no possibility that indexing rotation operations of these two holders are shifted in time from each other. Thus, reliability of a delivering and receiving operation is improved.

Furthermore, when the component supply holder and the component mounting holder are disposed in left and right directions with respect to an operator of the component mounting apparatus as viewed from a front of the apparatus, and the component supply holder and the component mounting holder are rotated in the same direction, components can be moved only on an operator side by both the component supply holder and the component mounting holder, and the components are removed from the component supply unit, passed on a front side of the component supply holder and the component mounting holder, and mounted onto an object. Therefore, the operator of the component mounting apparatus can visually confirm a flow of a series of operations of the components, and various adjusting and maintenance operations become easy.

Furthermore, when a load for pressing a component onto an object, when the component is to be mounted on the object, is applied by a linear motor, loads for pressing can be easily made variable by controlling currents of the linear motor, and mounting is performed by an appropriate load depending on characteristics of the component. Thus, quality of the component can be ensured.

Furthermore, when the up-and-down reversing operation of the reverse-supply head is performed by a cam mechanism, constituted by a cam groove and a cam follower, interlocked with indexing rotation of the component supply holder, operation can become highly reliable.

Furthermore, when angle correction, about a central axis of a supply-side component holding member, between a component and the supply-side component holding member, upon removing the component, is performed by horizontal rotation of a component supply unit, a reverse-supply head does not require a mechanism for horizontal rotation. Thus, the reverse-supply head can be made smaller and lighter, thereby resulting in indexing rotation at a higher speed.

Furthermore, when a central axis for horizontal rotation of the component supply unit is always co-axial with a central axis of the supply-side component holding member for pickup, precision in horizontal rotation of the component supply unit does not affect precision in the correction in a horizontal direction when a component is removed. Thus, the component can be removed with high precision.

Furthermore, when angle correction, about a central axis of a mounting-side component holding member, between a component and the mounting-side component holding member, upon mounting the component, is performed by horizontal rotation of an electronic component mounting table, a mounting head does not require a mechanism for horizontal rotation. Therefore, the mounting head can be made smaller and lighter, thereby resulting in indexing rotation at a higher speed.

Furthermore, when a central axis of horizontal rotation of a component mounting table is always co-axial with a central axis of a mounting-side component holding member, precision in horizontal rotation of the component mounting table does not affect precision in correction in a horizontal direction when a component is mounted. Thus, the component can be mounted with high precision.

Unlike the conventional apparatus in FIG. 6, the mounting head, and therefore the component mounting holder, does not need to have a drive member for moving a component holding member up and down when the drive member (linear motor) is provided independently outside the component mounting holder above a mounting position. Therefore, a total weight of the component mounting holder is reduced, thereby resulting in intermittent rotation at a higher speed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus for successively removing components from a component supply unit and mounting the components onto an object at prescribed positions, comprising:

supply-side component holding members, each of said supply-side component holding members for
  (i) performing intermittent rotational movement between a component take-out position and a supply-side component delivering and receiving position so as to define a closed path,
  (ii) removing a component from a component supply unit at the component take-out position, and holding the component,
  (iii) reversing the component, held by said each of said supply-side component holding members, during the intermittent rotational movement, and
  (iv) at the supply-side component delivering and receiving position, delivering the component from said each of said supply-side component holding members; and a mounting-side component holding member for
  (v) moving, by intermittent rotational movement in synchronization with the intermittent rotational movement of said each of said supply-side component holding members, between a mounting-side component delivering and receiving position and a component mounting position so as to define a closed path that is different from the closed path defined by the intermittent rotational movement of said each of said supply-side component holding members, wherein the mounting-side component delivering and receiving position overlaps, or is in close proximity to, the supply-side component delivering and receiving position,
  (vi) at the mounting-side component delivering and receiving position, receiving the component delivered from one of said each of said supply-side component holding members, and holding the component, and
  (vii) at the component mounting position, mounting the component held by said mounting-side component holding member onto the object, wherein said supply-side component holding members and said mounting-side component holding member are constructed and arranged such that while a component is delivered by one of said supply-side component holding members and received by said mounting-side component holding member another of said supply-side component holding members is positioned at the component take-out position to remove another component from the component supply unit.

2. The component mounting apparatus according to claim 1, further comprising:

a supply-side recognition camera operable to recognize a position of a subsequent component to be next removed from the component supply unit by a subsequent one of said each of said supply-side component holding members during the intermittent rotation of said each of said supply-side component holding members; and a mounting-side recognition camera operable to recognize on the object a mounting position at which a next component, after having being removed from the component supply unit, is to be next mounted by said mounting-side component holding member during the intermittent rotation of said each of said supply-side component holding members, such that, based on the position recognized by said supply-side recognition camera, said subsequent one of said of said each of said supply-side component holding members is to remove the subsequent component from the component supply unit when said subsequent one of said each of said supply-side component holding members is at the component take-out position, and such that, based on the position recognized by said mounting-side recognition camera, said mounting-side component holding member is to mount the next component onto the object when said mounting-side component holding member is at the mounting position.

3. The apparatus according to claim 1, further comprising:

a component supply holder for performing intermittent rotational movement about a first axis;

reverse-supply heads attached to a periphery of said component supply holder, each of said reverse-supply heads being rotatable about a second axis that is orthogonal to the first axis;

a component mounting holder for performing intermittent rotational movement in synchronization with intermittent rotational movement of said component supply holder; and a mounting head attached to a periphery of said component mounting holder, said mounting head capable of being moved up and down, wherein (i) said supply-side component holding members are on said reverse-supply heads, respectively, such that (a) said each of said supply-side component holding members is for performing intermittent rotational movement between the component take-out position and the supply-side component delivering and receiving position in unison with said component supply holder performing intermittent rotational movement, and (b) said each of said supply-side component holding members is for reversing the component, held by said each of said supply-side component holding members, in unison with a respective said each of said reverse-supply heads rotating about the second axis, and (ii) said mounting-side component holding member is on said mounting head such that (c) said mounting-side component holding member is for moving, by intermittent rotational movement in synchronization with the intermittent rotational movement of said each of said supply-side component holding members between the mounting-side component delivering and receiving position and the component mounting position, in unison with said component mounting holder performing intermittent rotational movement in synchronization with the intermittent rotational movement of said component supply holder, and (d) said mounting-side component holding member is for mounting the component held by said mounting-side component holding member onto an object, at the component mounting position, by moving said mounting head downwardly.

4. The component mounting apparatus according to claim 3, further comprising:

an additional mounting head having thereon an additional mounting-side component holding member, said additional mounting head being attached to the periphery of said component mounting holder, wherein said additional mounting head and said additional mounting-side component holding member are constructed and arranged such that when said mounting-side component holding member is positioned to mount the component held thereby onto the object, said additional mounting-side component holding member is positioned to receive a component from one of said each of said supply-side component holding members that is positioned at the supply-side component delivering and receiving position, while another of said each of said supply-side component holding members is positioned at the component take-out position to remove a component from the component supply unit.

5. The component mounting apparatus according to claim 4, wherein said mounting head and said additional mounting head define at least a portion of a total number of mounting heads, with a total number of said reverse-supply heads being equal to the total number of mounting heads.

6. The component mounting apparatus according to claim 3, wherein said component supply holder, said each of said reverse-supply heads, said each of said supply-side component holding members, said component mounting holder, said mounting head and said mounting-side component holding member are constructed and arranged such that when said mounting-side component holding member is positioned at the mounting-side component delivering and receiving position to receive a component delivered by said one of said each of said supply-side component holding members, at the supply-side component delivering and receiving position, said one of said each of said supply-side component holding members is directly beneath said mounting-side component holding member.

7. The component mounting apparatus according to claim 3, wherein said each of said supply-side component holding members is for reversing the component during the intermittent rotational movement by itself being reversed between the component take-out position and the supply-side component delivering and receiving position in unison with a corresponding one of said each of said reverse-supply heads rotating about the second axis, such that when said each of said supply-side component holding members is positioned at the supply-side component delivering and receiving position it is in a state in which oscillation generated in said corresponding one of said each of said reverse-supply heads during rotation about the second axis is attenuated.

8. The component mounting apparatus according to claim 3, further comprising:

a common drive source for intermittently rotating said component supply holder and said component mounting holder.

9. The component mounting apparatus according to claim 3, wherein said component supply holder and said component mounting holder are disposed opposite to one another along a front side of the apparatus, at which an operator can be positioned, such that a component that is transferred from the component take-out position to the supply-side component delivering and receiving position by one of said each of said supply-side component holding members, and then to the mounting position by said mounting-side component holding member, is transferred along the front side of the apparatus.

10. The component mounting apparatus according to claim 3, further comprising:

a linear motor disposed outside of said component mounting holder, such that said mounting-side component holding member is for mounting the component held by said mounting-side component holding member onto an object, at the component mounting position, by driving said linear motor so as to move said mounting head downwardly such that a mounting load on the object is controlled by said linear motor.

11. The component mounting apparatus according to claim 3, further comprising:
a cam mechanism for causing said each of said reverse-supply heads to rotate about the second axis such that a respective said each of said supply-side component holding members performs an up and down reversing operation such that the component held by said respective said each of said supply-side component holding members is reversed during the intermittent rotational movement thereof, said cam mechanism including
(i) a cam follower that is to interlockingly move with intermittent rotation of said component supply holder and is connected to said each of said reverse-supply heads, and
(ii) a cam groove or cam surface constructed and arranged to allow the cam follower to move therein or therealong in an up-and-down direction.

12. The component mounting apparatus according to claim 3, further comprising:
a guide device and a drive device for enabling horizontal rotation of a component supply table that is to function as the component supply unit,
wherein angle correction, about an axis of said each of said supply-side component holding members, between a component and said each of said supply-side component holding members that is to remove the component from the component supply table is to be performed by using said guide device and said drive device to horizontally rotate the component supply table.

13. The component mounting apparatus according to claim 12, further comprising:
another guide device and another drive device for enabling horizontal movement of the component supply table,
wherein said guide device and said drive device are mounted to the component supply table and positioned beneath said another guide device and said another drive device, and a central axis for horizontal rotation of the component supply table is coaxial with a central axis of said each of supply-side component holding members when positioned at the component take-out position.

14. The component mounting apparatus according to claim 3, further comprising:
a guide device and a drive device for enabling horizontal rotation of a component mounting table that is to support the object onto which the component is to be mounted,
wherein angle correction, about an axis of said mounting-side component holding member, between the component and the object prior to mounting the component onto the object by said mounting-side component holding member is to be performed by using said guide device and said drive device to horizontally rotate the component mounting table.

15. The component mounting apparatus according to claim 14, further comprising:
another guide device and another drive device for enabling horizontal movement of the component mounting table,
wherein said guide device and said drive device are mounted to the component mounting table and positioned beneath said another guide device and said another drive device, and a central axis for horizontal rotation of the component mounting table is coaxial with a central axis of said mounting-side component holding member when positioned at the component mounting position.

16. The component mounting apparatus according to claim 3, further comprising:
a supply-side recognition camera operable to recognize a position of a subsequent component to be next removed from the component supply unit by a subsequent one of said each of said supply-side component holding members during the intermittent rotation of said each of said supply-side component holding members; and
a mounting-side recognition camera operable to recognize on the object a mounting position at which a next component, after having being removed from the component supply unit, is to be next mounted by said mounting-side component holding member during the intermittent rotation of said each of said supply-side component holding members,
such that, based on the position recognized by said supply-side recognition camera, said subsequent one of said of said each of said supply-side component holding members is to remove the subsequent component from the component supply unit when said subsequent one of said each of said supply-side component holding members is at the component take-out position, and
such that, based on the position recognized by said mounting-side recognition camera, said mounting-side component holding member is to mount the next component onto the object when said mounting-side component holding member is at the mounting position.

17. The component mounting apparatus according to claim 1, further comprising:
an additional mounting-side component holding member,
wherein said additional mounting-side component holding member is constructed and arranged such that when said mounting-side component holding member is positioned to mount the component held thereby onto the object, said additional mounting-side component holding member is positioned to receive a component from one of said each of said supply-side component holding members that is positioned at the supply-side component delivering and receiving position, while another of said each of said supply-side component holding members is positioned at the component take-out position to remove a component from the component supply unit.

18. The component mounting apparatus according to claim 17, wherein said mounting-side component holding member and said additional mounting-side component holding member define at least a portion of a total number of mounting-side component holding members, with a total number of said supply-side component holding members being equal to the total number of mounting-side component holding members.

19. The component mounting apparatus according to claim 1, wherein said each of said supply-side component holding members and said mounting-side component holding member are constructed and arranged such that when said mounting-side component holding member is positioned at the mounting-side component delivering and receiving position to receive a component delivered by said one of said each of said supply-side component holding members, at the supply-side component delivering and receiving position, said one of said each of said supply-side component holding members is directly beneath said mounting-side component holding member.

20. The component mounting apparatus according to claim 1, wherein said each of said supply-side component holding members is for reversing the component during the intermittent rotational movement by itself being reversed between the component take-out position and the supply-side component delivering and receiving position, such that when said each of said supply-side component holding members is positioned at the supply-side component delivering and receiving position it is in a state in which oscillation generated during this reversing is attenuated.

21. The component mounting apparatus according to claim 1, further comprising:
a common drive source for intermittently rotating said each of said supply-side component holding members and said mounting-side component holding member.

22. The component mounting apparatus according to claim 1, wherein
one of said each of said supply-side component supply holding members and said mounting-side component holding member are disposed opposite to one another along a front side of the apparatus, at which an operator can be positioned, such that a component that is transferred from the component take-out position to the supply-side component delivering and receiving position by said one of said each of said supply-side component holding members, and then to the mounting position by said mounting-side component holding member, is transferred along the front side of the apparatus.

23. The component mounting apparatus according to claim 1, further comprising:
a linear motor, such that said mounting-side component holding member is for mounting the component held by said mounting-side component holding member onto an object, at the component mounting position, by driving said linear motor so as to move said mounting-side component holding member downwardly such that a mounting load on the object is controlled by said linear motor.

24. The component mounting apparatus according to claim 1, further comprising:
a cam mechanism for causing said each of said supply-side component holding members to perform an up and down reversing operation such that the component held by said each of said supply-side component holding members is reversed during the intermittent rotational movement thereof, said cam mechanism including
(i) a cam follower that is to interlockingly move with intermittent rotation of said each of said supply-side component holding members and is connected to said each of said supply-side component holding members, and
(ii) a cam groove or cam surface constructed and arranged to allow the cam follower to move therein or therealong in an up-and-down direction.

25. The component mounting apparatus according to claim 1, further comprising:
a guide device and a drive device for enabling horizontal rotation of a component supply table that is to function as the component supply unit,
wherein angle correction, about an axis of said each of said supply-side component holding members, between a component and said each of said supply-side component holding members that is to remove the component from the component supply table is to be performed by using said guide device and said drive device to horizontally rotate the component supply table.

26. The component mounting apparatus according to claim 25, further comprising:
another guide device and another drive device for enabling horizontal movement of the component supply table,
wherein said guide device and said drive device are mounted to the component supply table and positioned beneath said another guide device and said another drive device, and a central axis for horizontal rotation of the component supply table is coaxial with a central axis of said each of supply-side component holding members when positioned at the component take-out position.

27. The component mounting apparatus according to claim 1, further comprising:
a guide device and a drive device for enabling horizontal rotation of a component mounting table that is to support the object onto which the component is to be mounted,
wherein angle correction, about an axis of said mounting-side component holding member, between the component and the object prior to mounting the component onto the object by said mounting-side component holding member is to be performed by using said guide device and said drive device to horizontally rotate the component mounting table.

28. The component mounting apparatus according to claim 27, further comprising:
another guide device and another drive device for enabling horizontal movement of the component mounting table,
wherein said guide device and said drive device are mounted to the component mounting table and positioned beneath said another guide device and said another drive device, and a central axis for horizontal rotation of the component mounting table is coaxial with a central axis of said mounting-side component holding member when positioned at the component mounting position.

29. A component mounting apparatus for successively removing components from a component supply unit and mounting the components onto an object at prescribed positions, comprising:
a supply-side component holding member for
(i) performing intermittent rotational movement between a component take-out position and a supply-side component delivering and receiving position so as to define a closed path,
(ii) removing a component from a component supply unit at the component take-out position, and holding the component,
(iii) reversing the component, held by said supply-side component holding member, during the intermittent rotational movement, and
(iv) at the supply-side component delivering and receiving position, delivering the component from said supply-side component holding member; and
mounting-side component holding members, each of said mounting-side component holding members for
(v) moving, by intermittent rotational movement in synchronization with the intermittent rotational movement of said supply-side component holding member, between a mounting-side component delivering and receiving position and a component mounting position so as to define a closed path that is different from the closed path defined by the intermittent rotational movement of said supply-side component holding member, wherein the mounting-side component delivering and receiving position overlaps, or is in close proximity to, the supply-side component delivering and receiving position, (vi) at the mounting-side component delivering and receiving position, receiving a component delivered from said supply-side component holding member, and holding the component, and (vii) at the component mounting position, mounting onto an object the component held by said each of said mounting-side component holding members, wherein said supply-side component holding member and said mounting-side component holding members are constructed and arranged such that while a component is delivered by said supply-side component holding member and received by one of said mounting-side component holding members another of said mounting-side component holding members is positioned at the component mounting position to mount a component onto the object.

30. The apparatus according to claim 29, further comprising:

a supply-side recognition camera operable to recognize a position of a subsequent component to be next removed from the component supply unit by said supply-side component holding member during the intermittent rotation of said supply-side component holding member; and a mounting-side recognition camera operable to recognize on the object a mounting position at which a next component, after having being removed from the component supply unit, is to be next mounted by a subsequent one of said each of said mounting-side component holding members during the intermittent rotation of said supply-side component holding member, such that, based on the position recognized by said supply-side recognition camera, said supply-side component holding member is to remove the subsequent component from the component supply unit when said supply-side component holding member is at the component take-out position, and such that, based on the position recognized by said mounting-side recognition camera, said subsequent one of said each of said mounting-side component holding members is to mount the next component onto the object when said subsequent one of said each of said mounting-side component holding members is at the mounting position.

31. The apparatus according to claim 29, further comprising:

a component supply holder for performing intermittent rotational movement about a first axis;

a reverse-supply head attached to a periphery of said component supply holder, said reverse-supply head being rotatable about a second axis that is orthogonal to the first axis;

a component mounting holder for performing intermittent rotational movement in synchronization with intermittent rotational movement of said component supply holder; and mounting heads attached to a periphery of said component mounting holder, each of said mounting heads being capable of being moved up and down, wherein (i) said supply-side component holding member is on said reverse-supply head, such that (a) said supply-side component holding member is for performing intermittent rotational movement between the component take-out position and the supply-side component delivering and receiving position in unison with said component supply holder performing intermittent rotational movement, and (b) said supply-side component holding member is for reversing the component, held by said supply-side component holding member, in unison with said reverse-supply head rotating about the second axis, and (ii) said mounting-side component holding members are on said mounting heads, respectively, such that (c) said each of said mounting-side component holding members is for moving, by intermittent rotational movement in synchronization with the intermittent rotational movement of said supply-side component holding member between the mounting-side component delivering and receiving position and the component mounting position, in unison with said component mounting holder performing intermittent rotational movement in synchronization with the intermittent rotational movement of said component supply holder, and (d) said each of said mounting-side component holding members is for mounting the component held by said each of said mounting-side component holding members onto an object, at the component mounting position, by moving said each of said mounting heads downwardly.

32. The component mounting apparatus according to claim 31, wherein said component supply holder, said reverse-supply head, said supply-side component holding member, said component mounting holder, said each of said mounting heads and said each of said mounting-side component holding members are constructed and arranged such that when one of said each of said mounting-side component holding members is positioned at the mounting-side component delivering and receiving position to receive a component delivered by said supply-side component holding member, at the supply-side component delivering and receiving position, said supply-side component holding member is directly beneath said one of said each of said mounting-side component holding members.

33. The component mounting apparatus according to claim 31, wherein said supply-side component holding member is for reversing the component during the intermittent rotational movement by itself being reversed between the component take-out position and the supply-side component delivering and receiving position in unison with said reverse-supply head rotating about the second axis, such that when said supply-side component holding member is positioned at the supply-side component delivering and receiving position it is in a state in which oscillation generated in said reverse-supply head during rotation about the second axis is attenuated.

34. The component mounting apparatus according to claim 31, further comprising:

a common drive source for intermittently rotating said component supply holder and said component mounting holder.

35. The component mounting apparatus according to claim 31, wherein said component supply holder and said component mounting holder are disposed opposite to one another along a front side of the apparatus, at which an operator can be positioned, such that a component that is transferred from the component take-out position to the supply-side component delivering and receiving position by said supply-side component holding member, and then to the mounting position by one of said each of said mounting-side component holding members, is transferred along the front side of the apparatus.

36. The component mounting apparatus according to claim 31, further comprising:

a linear motor disposed outside of said component mounting holder, such that said each of said mounting-side component holding members is for mounting the component held by said each of said mounting-side component holding members onto an object, at the component mounting position, by driving said linear motor so as to move said each of said mounting heads downwardly such that a mounting load on the object is controlled by said linear motor.

37. The component mounting apparatus according to claim 31, further comprising:

a cam mechanism for causing said reverse-supply head to rotate about the second axis such that said supply-side component holding member performs an up and down reversing operation such that the component held by said supply-side component holding member is reversed during the intermittent rotational movement thereof, said cam mechanism including
  (i) a cam follower that is to interlockingly move with intermittent rotation of said component supply holder and is connected to said reverse-supply head, and
  (ii) a cam groove or cam surface constructed and arranged to allow the cam follower to move therein or therealong in an up-and-down direction.

38. The component mounting apparatus according to claim 31, further comprising:

a guide device and a drive device for enabling horizontal rotation of a component supply table that is to function as the component supply unit, wherein angle correction, about an axis of said supply-side component holding member, between a component and said supply-side component holding member prior to removing the component from the component supply table by said supply-side component holding member is to be performed by using said guide device and said drive device to horizontally rotate the component supply table.

39. The component mounting apparatus according to claim 38, further comprising:

another guide device and another drive device for enabling horizontal movement of the component supply table, wherein said guide device and said drive device are mounted to the component supply table and positioned beneath said another guide device and said another drive device, and a central axis for horizontal rotation of the component supply table is coaxial with a central axis of said supply-side component holding member when positioned at the component take-out position.

40. The component mounting apparatus according to claim 31, further comprising:

a guide device and a drive device for enabling horizontal rotation of a component mounting table that is to support the object onto which the component is to be mounted, wherein angle correction, about an axis of said each of said mounting-side component holding members, between the component and the object prior to mounting the component onto the object by said each of said mounting-side component holding members is to be performed by using said guide device and said drive device to horizontally rotate the component mounting table.

41. The component mounting apparatus according to claim 40, further comprising:

another guide device and another drive device for enabling horizontal movement of the component mounting table, wherein said guide device and said drive device are mounted to the component mounting table and positioned beneath said another guide device and said another drive device, and a central axis for horizontal rotation of the component mounting table is coaxial with a central axis of said each of said mounting-side component holding members when positioned at the component mounting position.

42. The component mounting apparatus according to claim 31, further comprising:

a supply-side recognition camera operable to recognize a position oaf subsequent component to be next removed from the component supply unit by said supply-side component holding member during the intermittent rotation of said supply-side component holding member; and a mounting-side recognition camera operable to recognize on the object a mounting position at which a next component, after having being removed from the component supply unit, is to be next mounted by a subsequent one of said each of said mounting-side component holding members during the intermittent rotation of said supply-side component holding member, such that, based on the position recognized by said supply-side recognition camera, said supply-side component holding member is to remove the subsequent component from the component supply unit when said supply-side component holding member is at the component take-out position, and such that, based on the position recognized by said mounting-side recognition camera, said subsequent one of said each of said mounting-side component holding members is to mount the next component onto the object when said subsequent one of said each of said mounting-side component holding members is at the mounting position.

43. The component mounting apparatus according to claim 29, wherein said supply-side component holding member and said each of said mounting-side component holding members are constructed and arranged such that when one of said each of said mounting-side component holding members is positioned at the mounting-side component delivering and receiving position to receive a component delivered by said supply-side component holding member, at the supply-side component delivering and receiving position, said supply-side component holding member is directly beneath said one of said each of said mounting-side component holding members.

44. The component mounting apparatus according to claim 29, wherein said supply-side component holding member is for reversing the component during the intermittent rotational movement by itself being reversed between the component take-out position and the supply-side component delivering and receiving position, such that when said supply-side component holding member is positioned at the supply-side component delivering and receiving position it is in a state in which oscillation generated during this reversing is attenuated.

45. The component mounting apparatus according to claim 29, further comprising:
   a common drive source for intermittently rotating said supply-side component holding member and said each of said mounting-side component holding members.

46. The component mounting apparatus according to claim 29, wherein
   said supply-side component holding member and said each of said mounting-side component holding members are disposed opposite to one another along a front side of the apparatus, at which an operator can be positioned, such that a component that is transferred from the component take-out position to the supply-side component delivering and receiving position by said supply-side component holding member, and then to the mounting position by one of said each of said mounting-side component holding members, is transferred along the front side of the apparatus.

47. The component mounting apparatus according to claim 29, further comprising:
   a linear motor, such that said each of said mounting-side component holding members is for mounting the component held by said each of said mounting-side component holding members onto an object, at the component mounting position, by driving said linear motor so as to move said each of said mounting-side component holding members downwardly such that a mounting load on the object is controlled by said linear motor.

48. The component mounting apparatus according to claim 29, further comprising:
   a cam mechanism for causing said supply-side component holding member to perform an up and down reversing operation such that the component held by said supply-side component holding member is reversed during the intermittent rotational movement thereof, said cam mechanism including
   (i) a cam follower that is to interlockingly move with intermittent rotation of said supply-side component holding member and is connected to said supply-side component holding member, and
   (ii) a cam groove or cam surface constructed and arranged to allow the cam follower to move therein or therealong in an up-and-down direction.

49. The component mounting apparatus according to claim 29, further comprising:
   a guide device and a drive device for enabling horizontal rotation of a component supply table that is to function as the component supply unit,
   wherein angle correction, about an axis of said supply-side component holding member, between a component and said supply-side component holding member prior to removing the component from the component supply table by said supply-side component holding member is to be performed by using said guide device and said drive device to horizontally rotate the component supply table.

50. The component mounting apparatus according to claim 49, further comprising:
   another guide device and another drive device for enabling horizontal movement of the component supply table,
   wherein said guide device and said drive device are mounted to the component supply table and positioned beneath said another guide device and said another drive device, and a central axis for horizontal rotation of the component supply table is coaxial with a central axis of said supply-side component holding member when positioned at the component take-out position.

51. The component mounting apparatus according to claim 29, further comprising:
   a guide device and a drive device for enabling horizontal rotation of a component mounting table that is to support the object onto which the component is to be mounted,
   wherein angle correction, about an axis of said each of said mounting-side component holding members, between the component and the object prior to mounting the component onto the object by said each of said mounting-side component holding members is to be performed by using said guide device and said drive device to horizontally rotate the component mounting table.

52. The component mounting apparatus according to claim 51, further comprising:
   another guide device and another drive device for enabling horizontal movement of the component mounting table,
   wherein said guide device and said drive device are mounted to the component mounting table and positioned beneath said another guide device and said another drive device, and a central axis for horizontal rotation of the component mounting table is coaxial with a central axis of said each of said mounting-side component holding members when positioned at the component mounting position.

* * * * *

UNITED STATES PATENT AND TRADEMARK OFFICE
CERTIFICATE OF CORRECTION

PATENT NO. : 6,839,959 B1
DATED : January 11, 2005
INVENTOR(S) : Naoto Hosotani et al.

It is certified that error appears in the above-identified patent and that said Letters Patent is hereby corrected as shown below:

Column 52,
Line 4, please replace "oaf" with -- of a --.

Signed and Sealed this

Nineteenth Day of July, 2005

JON W. DUDAS
*Director of the United States Patent and Trademark Office*